United States Patent [19]
Miyazaki et al.

[11] Patent Number: 5,950,643
[45] Date of Patent: Sep. 14, 1999

[54] WAFER PROCESSING SYSTEM

[76] Inventors: Takeshiro Miyazaki; Yoshikazu Tsubata; Akio Kawakita; Noboru Katsumata; Akihiro Nakayama; Toyokazu Harada; Mitsuo Takaku; Syunso Yoshida, all of c/o Nippei Toyama Corporation Gijutsu-Center 1, Shinmei-cho, Yokosuka-shi, kanagawa-ken 239, Japan

[21] Appl. No.: 08/711,671

[22] Filed: Sep. 4, 1996

[30] Foreign Application Priority Data

| Sep. 6, 1995 | [JP] | Japan | 7-229476 |
| Sep. 13, 1995 | [JP] | Japan | 7-235581 |
| Nov. 28, 1995 | [JP] | Japan | 7-309520 |
| Dec. 25, 1995 | [JP] | Japan | 7-337346 |
| Feb. 29, 1996 | [JP] | Japan | 8-42251 |

[51] Int. Cl.$^6$ .................................................. B08B 3/04
[52] U.S. Cl. .................... 134/25.4; 134/76; 134/902; 134/201; 134/61; 134/63; 134/59
[58] Field of Search ............... 134/76, 902, 61, 134/201, 59, 63, 25.4; 156/584; 438/906

[56] References Cited

U.S. PATENT DOCUMENTS

| 4,127,969 | 12/1978 | Hoshi et al. | 51/283 R |
| 4,466,852 | 8/1984 | Beltz et al. | 134/59 |
| 5,213,451 | 5/1993 | Frank et al. | 406/72 |
| 5,246,528 | 9/1993 | Hasegawa et al. | |
| 5,427,644 | 6/1995 | Nagatsuka et al. | |
| 5,494,862 | 2/1996 | Kato et al. | |
| 5,506,176 | 4/1996 | Takizawa | |
| 5,533,540 | 7/1996 | Stanasolovich et al. | 134/186 |
| 5,626,159 | 5/1997 | Erk et al. | 134/147 |
| 5,756,399 | 5/1998 | Hajime et al. | |
| 5,759,344 | 6/1998 | Yasunaga et al. | |
| 5,800,665 | 9/1998 | Okaniwa et al. | 134/59 |

FOREIGN PATENT DOCUMENTS

| A-44 00 221 | 7/1994 | Denmark . |
| P-41-00-526-0 | of 0000 | Germany . |
| 5-63058 | 1/1991 | Japan . |
| 4-3744 | 1/1992 | Japan . |
| 4-164324 | 6/1992 | Japan ......... 134/902 |
| 6-208979 | 7/1994 | Japan . |
| 6-208982 | 7/1994 | Japan . |

*Primary Examiner*—Frankie L. Stinson
*Attorney, Agent, or Firm*—Stetina Brunda Garred & Brucker

[57] ABSTRACT

A processing system for processing of wafers that are formed by slicing a cylindrical workpiece which is adhered to a support plate by an adhesive agent. The processing system includes a washing apparatus, a removing apparatus, a separating apparatus, and a transferring apparatus. The washing apparatus washes the wafers that are remained adhered to the support plate. The removing apparatus removes a group of the wafers from the support plate. The removed wafers are gathered in a cylindrical shape. The separating apparatus separates the wafers one by one. The separating apparatus includes a vessel for accommodating the wafers separated one from another. The transferring apparatus transfers the wafers from the washing apparatus to the removing apparatus and then to the separating apparatus.

57 Claims, 41 Drawing Sheets

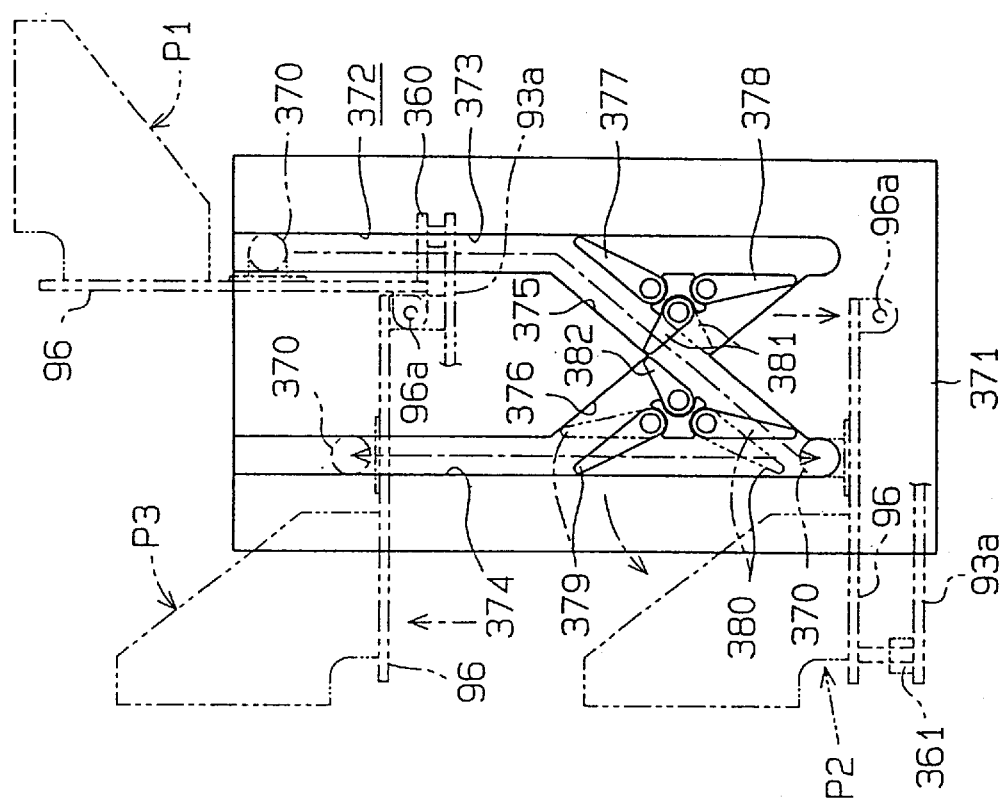
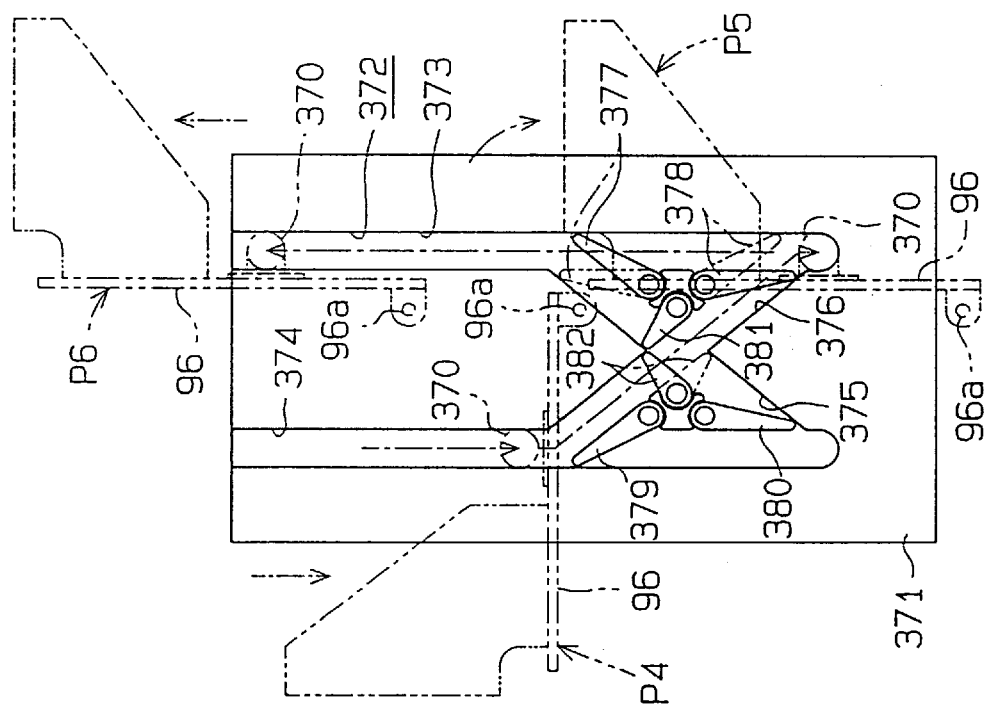

WAFER PROCESSING SYSTEM

BACKGROUND OF THE INVENTION

1. Field of the Invention

The present invention relates to a wafer processing system that processes wafers which have been formed by cutting silicon ingots or through other methods. More particularly, the present invention pertains to a wafer processing system that enables various processes such as the washing of semiconductor wafers to be performed efficiently.

2. Description of the Related Art

Semiconductor wafers are generally formed by cutting apart silicon ingots at predetermined intervals using a wire saw or the like. An example of the cutting method will now be described.

As shown in FIG. 18(a), a silicon ingot, or cylindrical workpiece 22 has an adhering plate 23 adhered to its upper surface. The adhering plate 23 includes a carbon layer 23a and an insulating layer 23b. An adhesive agent 23c is applied between the adhering plate 23 and the workpiece 22. As shown in FIG. 19, the adhering plate 23 is employed to couple the workpiece 22 to a holding mechanism 17 of a wire saw 16. The wire saw 16 includes a plurality of rollers 18, a wire 19 wound spirally around the rollers 18 with a predetermined pitch between each winding, and supply pipes 15 through which slurry that contains abrasive grains is supplied to the wire 19. As shown in FIGS. 18(b) and 19, the wire 19 is drawn in either a single direction or two directions while the slurry, which includes abrasive grains, is supplied to the wire 19. In this state, the workpiece 22 is pressed against the wire 19. The wire saw 16 thus cuts apart the workpiece 22 and produces a plurality of wafers 22a simultaneously.

The adhering plate 23 remains adhered to the wafers 22a after the cutting. Then, the cut wafers 22a are dipped into a dissolving liquid or heated water that contains an organic solvent. The liquid softens the adhering agent between the adhering plate 23 and the wafers 22a and thus removes the wafers 22a from the plate 23.

The wafers 22a removed from the adhering plate 23 produce a stack of wafers 22a. Considering the subsequent processing steps, it is required that each wafer 22a be separated from the other wafers 22a. Thus, a separating apparatus is used to separate each wafer 22a. Each separated wafer 22a is retained in a retaining container such as a cassette.

Cutting chips and slurry that include abrasive grains are adhered to the wafers 22a when they are cut apart. Hence, the wafers 22a retained in the container are washed by a washing apparatus.

However, washing the wafers 22a retained in the container is inefficient and it is difficult to ensure removal of the cutting chips and other foreign material from the surface of the wafers 22a. In addition, during the step in which the cut wafers 22a are retained in the container, there is a possibility that the wafers 22a may be damaged by the cutting chips or abrasive grains.

Furthermore, a long period of time is required to allow the dissolving liquid or heated water permeate into the narrow space between adjacent wafers 22a. As a result, it takes a long time to sufficiently soften the adhesive agent 23c applied between the adhering plate 23 and the wafers 22a. This lengthens the time required to remove the wafers 22a from the adhering plate 23.

It is difficult to separate the wafers 22a one at a time since they are extremely thin and break easily. Japanese Unexamined Patent Publication Nos. 4-3744 and 5-63058 describe separating apparatuses that utilize water streams.

Japanese Unexamined Patent Publication No. 4-3744 describes an apparatus that arranges a plurality of stacked wafers within a liquid. Each wafer is separated from the stack through suction and injection of the liquid. However, the suction and injection of the liquid results in the structure of the apparatus becoming complicated. Furthermore, it is difficult to accurately control the movement of the wafers in the liquid. When suction and injection of the liquid is not carried out accurately, an unexpected stream of the liquid may be produced. As a result, it becomes difficult to separate each wafer 22a without inflicting any damage. Accordingly, it is extremely burdensome to control the suction and injection of the liquid.

Japanese Unexamined Patent Publication No. 5-63058 describes an apparatus that separates a wafer arranged at the uppermost position of the wafer stack by injecting a liquid toward the wafer. This separates the uppermost wafer in a predetermined direction. However, it is difficult to ensure separation of each wafer merely be injecting liquid.

SUMMARY OF THE INVENTION

Accordingly, it is primary objective of the present invention to provide a wafer processing system that enables the cut wafers to undergo washing and processing related to the washing in a continuous and efficient manner.

Another objective of the present invention is to provide a wafer processing system that prevents the cut wafers from being damaged.

A further objective of the present invention is to provide a wafer processing system that includes a removing apparatus that enables the cut wafers to be removed from an adhering plate within a short period of time.

It is also an objective of the present invention to provide a wafer processing system that includes a separating apparatus that enables each wafer to be securely separated one by one.

To achieve the above objectives, a processing system for processing of wafers is provided. The wafers are formed by slicing a cylindrical workpiece which is adhered to a support plate by an adhesive agent. The processing system includes a washing apparatus, a removing apparatus, and a transferring apparatus. The washing apparatus washes the wafers that are remained adhered to the support plate. The removing apparatus removes a group of the wafers from the support plate. The removed wafers are gathered in a cylindrical shape. The transferring apparatus transfers the wafers from the washing apparatus to the removing apparatus.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIGS. 48(a), 48(b) are front views showing the operation of a guide plate; and

DETAILED DESCRIPTION OF THE PREFERRED EMBODIMENTS

A first embodiment according to the present invention will hereafter be described with reference to FIGS. 1 through 19.

Figure 19:
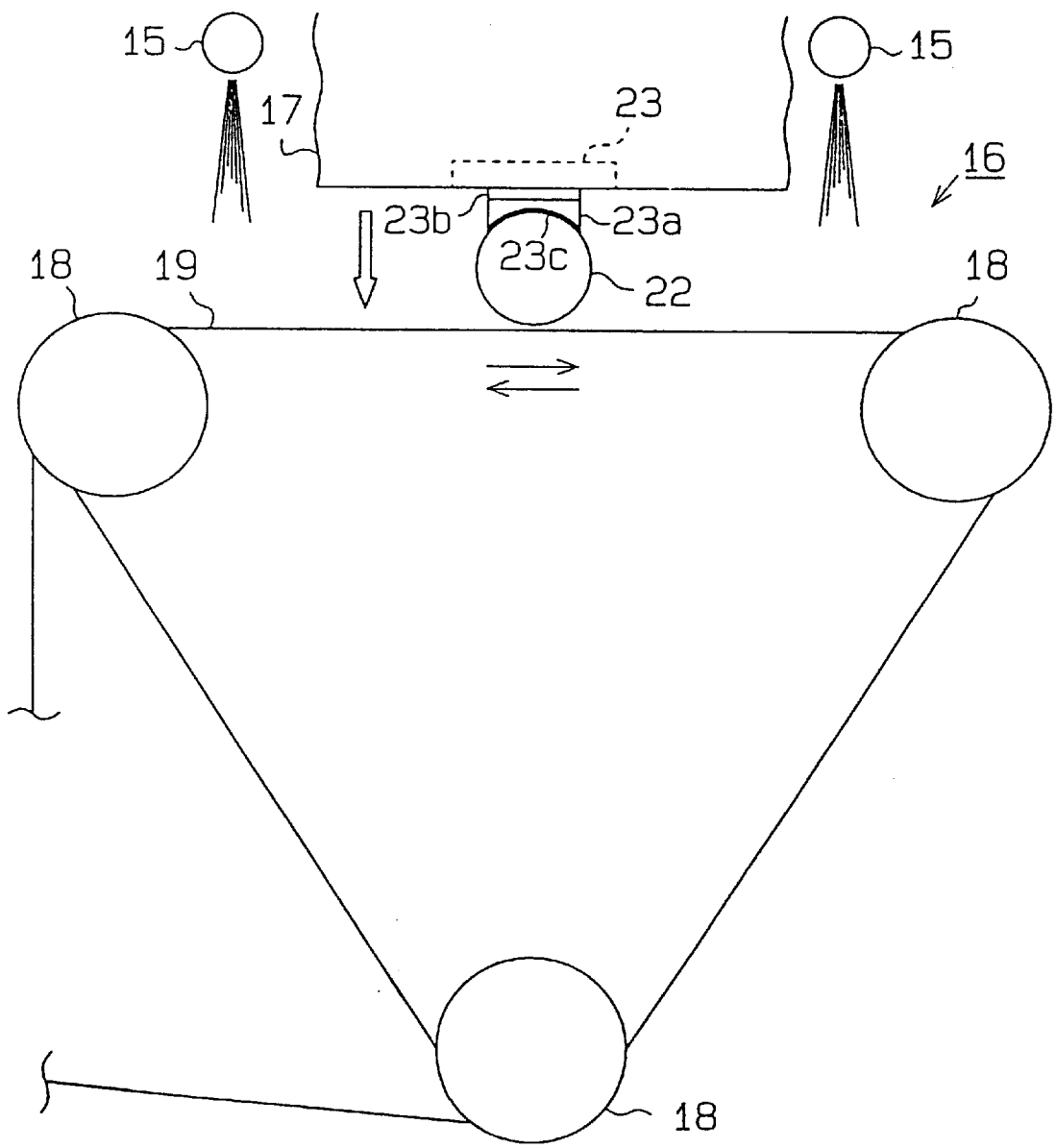
FIG. 19 is a schematic side view showing a wire saw.

As described above, the workpiece 22 shown in FIG. 18(a) is cut apart by the wire 19 of a wire saw 16 as shown in FIGS. 18(b) and 19. This enables a plurality of wafers 22a to be simultaneously produced. The processing system of this embodiment washes and separates the wafers 22a, which are produced in this manner, from one another. The processing system will now be described in detail.

Overall Process

As shown in FIGS. 1 through 4, various apparatuses are aligned on a frame 20 in a manner such that they form a line. The apparatuses are used to perform first through eighth steps (ST1–ST8).

The first step ST1 is performed by a prewashing apparatus 21. After the workpiece 22 is cut apart into wafers 22a by the wire saw 16, the workpiece 22 (wafers 22a) is prewashed by the prewashing apparatus 21 in a state which the workpiece 22 is still adhered to the adhering plate 23. The second step ST2 and the third step ST3 are performed by a washing apparatus 24. A first cassette 26, which serves as a retaining container, is placed on a table 25 to receive the prewashed workpiece 22. The workpiece 22 is then washed by the washing apparatus 24 inside a tank located adjacent to the table 25 with the workpiece 22 still retained in the first cassette 26. The third step ST3 is performed by a removing apparatus 27 together with the washing apparatus 24. The removing apparatus 27 removes the workpiece 22 from the adhering plate 23.

The fourth step ST4 is performed by a separating/retaining apparatus 28. The separating/retaining apparatus 28 separates each wafer 22a from the other wafers 22a, which have been removed from the adhering plate 23, and retains the wafers 22a in a second cassette 29. The fifth, sixth, and seventh steps ST5, ST6, ST7 are performed by a fine washing apparatus 30. The fine washing apparatus 30 finely washes the wafers 22a by dipping them into heated water. The wafers 22a are still retained in the second cassette 29 when dipped into the heated water. The eighth step ST8 is performed by a drying apparatus 31. The drying apparatus 31 dries the finely washed workpiece 22 after lifting it out of the heated water.

A holding apparatus 32 is arranged above the prewashing apparatus 21, which performs the first step ST1. The workpiece 22, which is attached to the adhering plate 23, is cut apart into wafers 22a by the wire saw 16. The workpiece 22 is then transferred to a position above the prewashing apparatus 21 by a loading apparatus 33 shown in FIG. 2. The holding apparatus 32 then holds the workpiece 22 temporarily. In this state, the axis of the workpiece 22 is parallel to the direction along which the apparatuses on the frame 20 are arranged.

A first transporting apparatus 34 is provided in a manner such that it may be moved above the prewashing apparatus 21, the table 25, the washing apparatus 24, the removing apparatus 27, and the separating/retaining apparatus 28, which perform first through fourth steps (ST1–ST4). The first transporting apparatus 34 receives the workpiece 22, which is attached to the adhering plate 23, from the holding apparatus 32 and transports the workpiece 22 to the prewashing apparatus 21. The first transporting apparatus 34 further moves the workpiece 22 intermittently in sequential order from the prewashing apparatus 21 to the table 25, the washing apparatus 24, the removing apparatus 27, and the separating/retaining apparatus 28.

After receiving the workpiece 22 from the holding apparatus 32, the first transporting apparatus 34 rotates the workpiece 22 horizontally by 90 degrees as it transports the workpiece 22 to the prewashing apparatus 21. When rotated 90 degrees, the axis of the workpiece 22 becomes perpendicular to the direction along which the apparatuses on the frame 20 are arranged. The first transporting apparatus 34 also transfers the workpiece 22, still adhered to the adhering plate 23, into the first cassette 26, which is placed on a table 25. When transporting the workpiece 22 from the removing apparatus 27 to the separating/retaining apparatus 28, the first transporting apparatus 34 rotates the workpiece 22 horizontally by 90 degrees. This results in the axis of the workpiece 22 becoming parallel to the direction along which the apparatuses on the frame 20 are arranged.

A second transporting apparatus 35 is provided above the separating/retaining apparatus 28, which performs the fourth step ST4. The second transporting apparatus 35 rotates the workpiece 22 vertically by 90 degrees as it transports the workpiece 22 along the row of the apparatuses aligned on the frame 22. That is, the second transporting apparatus 35 rotates the workpiece 22 from a state at which its axis is substantially horizontal and parallel to the direction of the apparatuses arranged on the frame 20 to a state at which its axis is substantially vertical.

A cassette conveying apparatus 36 is provided at the rear side of the separating/retaining apparatus 28, which performs the fourth step ST4. The cassette conveying apparatus 36 conveys empty second cassettes 29, which are transferred from a cassette loading apparatus 37 (FIG. 2), to a position above the separating/retaining apparatus 28.

A third transporting apparatus 38 is provided in a manner such that it may be moved above the separating/retaining apparatus 28, the fine washing apparatus 30, and the drying apparatus 31, which perform fourth through eighth steps ST4–ST8. The third transporting apparatus 38 receives the empty second cassettes 29 from the cassette conveying apparatus 36 and transports the cassettes 29 to the separating/retaining apparatus 28. The third transporting apparatus 38 also intermittently moves the workpiece 22, which is retained in the second cassette 29, in sequential order from the separating/retaining apparatus 28 to the fine washing apparatus 30 and then to the drying apparatus 31. In the separating/retaining apparatus 28, each workpiece 22 is vertically rotated 90 degrees so that the axis of the workpiece 22 extends in a vertical manner from the state in which it was horizontal and parallel to the direction along which the apparatuses on the frame 20 are arranged.

Figure 2:
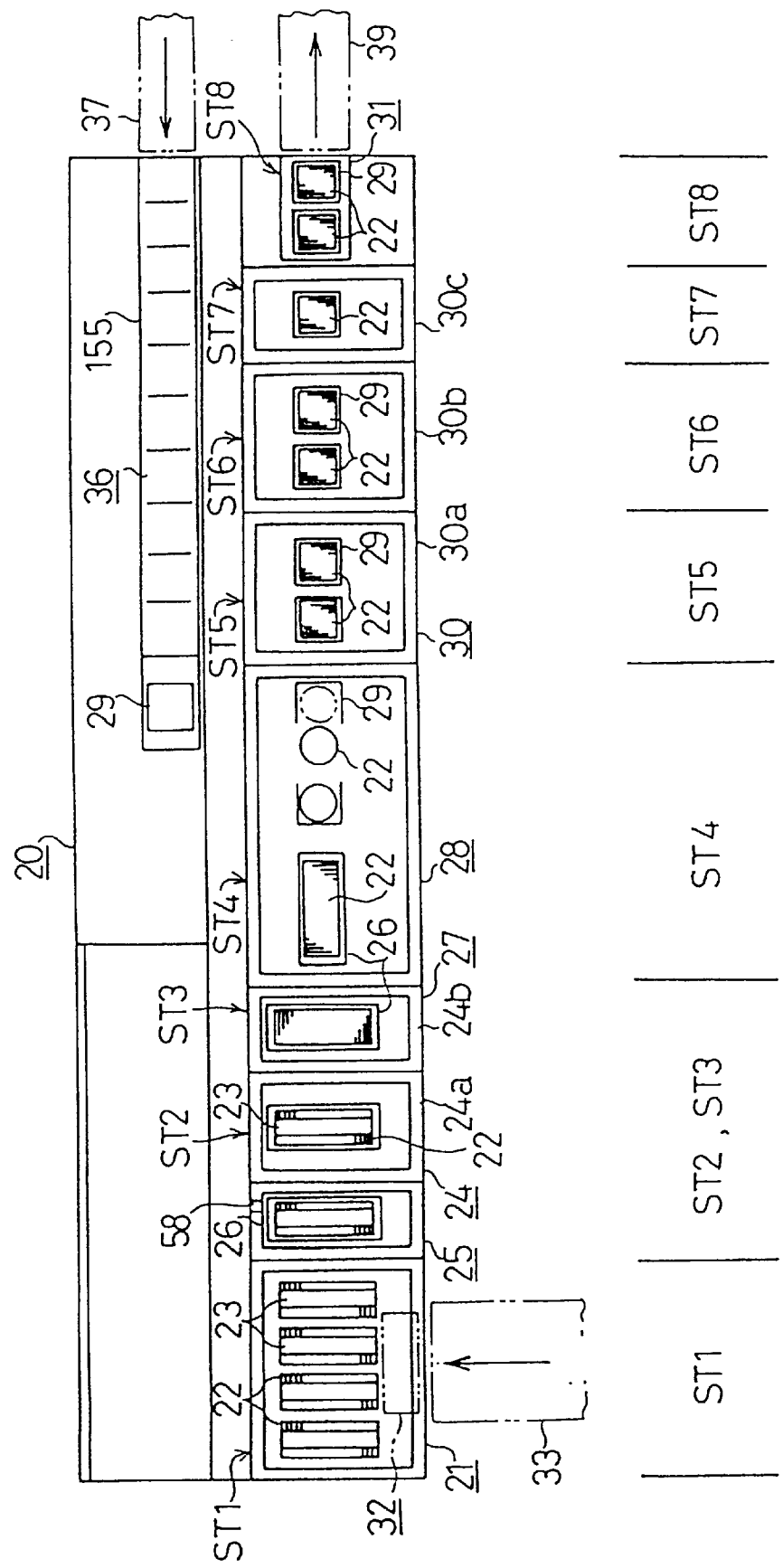
FIG. 2 is a schematic plan view showing the processing system.

As shown in FIG. 2, an unloading apparatus 39 is provided beside the drying apparatus 31, which performs the eight step ST8. After each workpiece 22 is dried by the drying apparatus 31, the unloading apparatus 39 unloads the workpiece 22 from the processing system of the present invention so that the workpiece 22 may undergo the subsequent processing steps.

Figure 3:
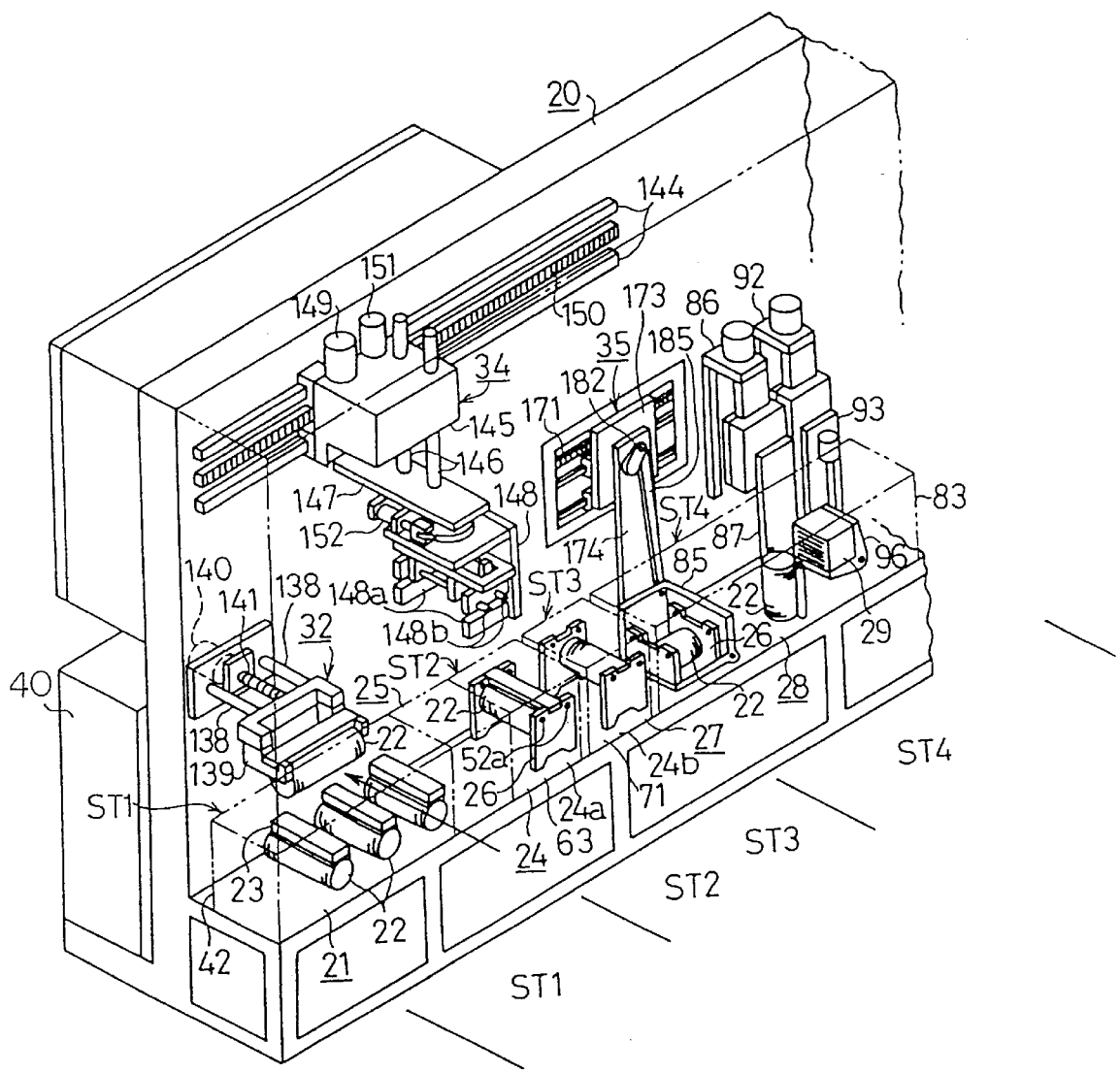
FIG. 3 is a perspective view showing first through fourth steps of the processing system.

As shown in FIG. 3, a controller 40 is arranged, for example, behind the frame 20. The controller 40 controls the movement of the various apparatuses, which perform first through eighth steps ST1–ST8, in accordance with prestored control programs.

The structure and operation of the apparatuses described above will now be described.

First Step

Figure 5:
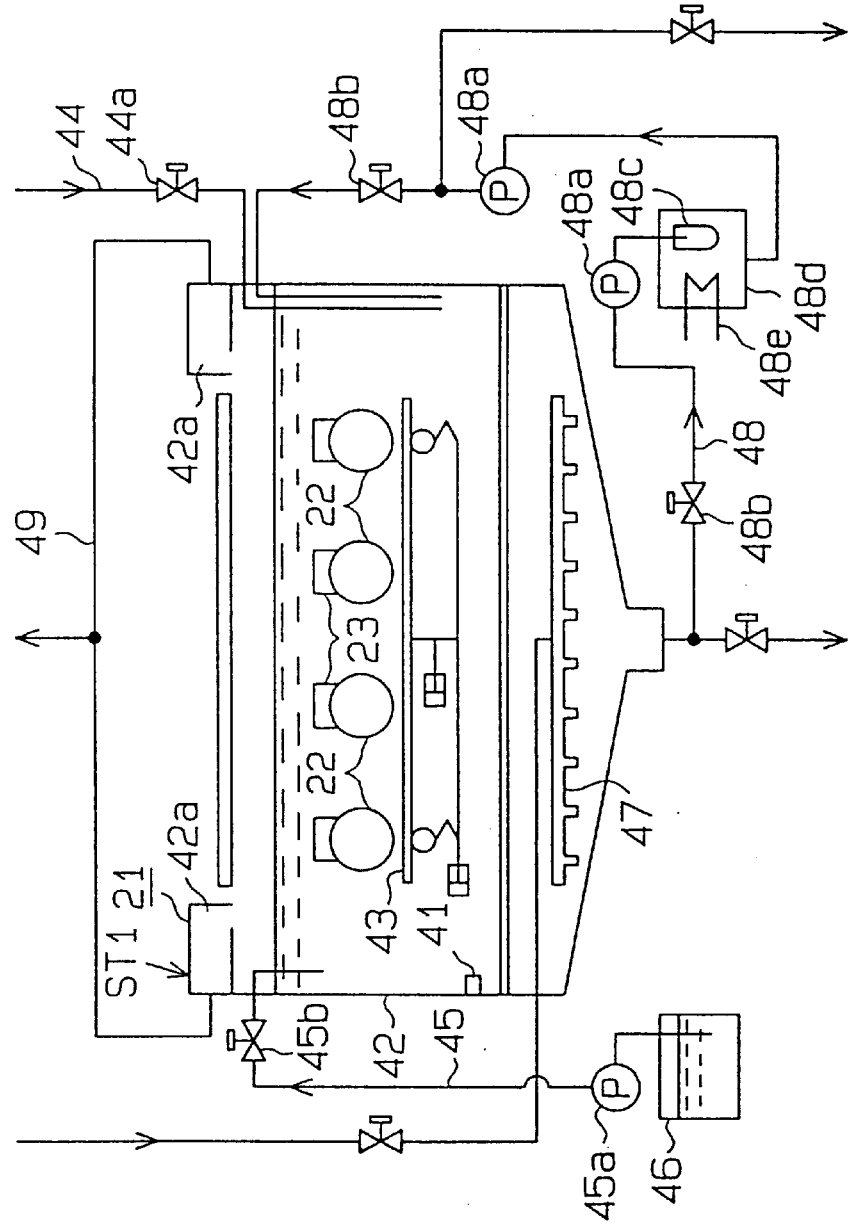
FIG. 5 is a structural diagram showing the first step of the processing system.

As shown in FIGS. 3 and 5, the prewashing apparatus 21, which performs the first step ST1, is provided with a prewashing tank 42. A support table 43 supports the workpieces 22, which are adhered to the adhering plate 23, inside the tank 42. Water is supplied to the tank 42 through a water passage 44 that includes a valve 44a. A washing agent is supplied to the tank 42 through a washing agent passage 45 from a reserve tank 46. The agent passage 45 includes a pump 45a and a valve 45b. A neutral washing agent may be used as the washing agent. A washing liquid having a predetermined concentration is obtained by mixing the washing agent with the water in the tank 42. A concentration sensor 41 is provided in the tank 42 to detect the concentration of the washing liquid. The controller 40 controls the valves 44a, 45b and the pump 45a in accordance with the concentration detected by the sensor 41 to maintain the predetermined washing liquid concentration in the tank 42.

Air nozzles 47 are provided at the bottom section in the tank 42 to produce air bubbles in the washing liquid by injecting air. The workpieces 22 dipped into the washing liquid are prewashed by the air bubbles. Before the washing apparatus 24 washes the workpieces 22a, most of the slurry and cutting chips that are adhered to the surface of each wafer 22a are removed from the surface through the prewashing.

When prewashing is being carried out, the washing liquid in the prewashing tank 42 circulates through a circulating passage 48 that includes pumps 48a, valves 48b, a heated water tank 48d, a heater 48e, and a filter 48c. The circulation enables oil adhered to the wafers 22a to be removed by water heated at approximately 40 degrees Celsius. Particulate matter suspended in the washing liquid is also separated from the liquid by the filter 48c. Furthermore, the air in the tank 42 contaminated by abrasive grains, which are included in the slurry, is forcibly emitted through an exhaust passage 49 via inlet holes 42a.

Second Step

Figure 1:
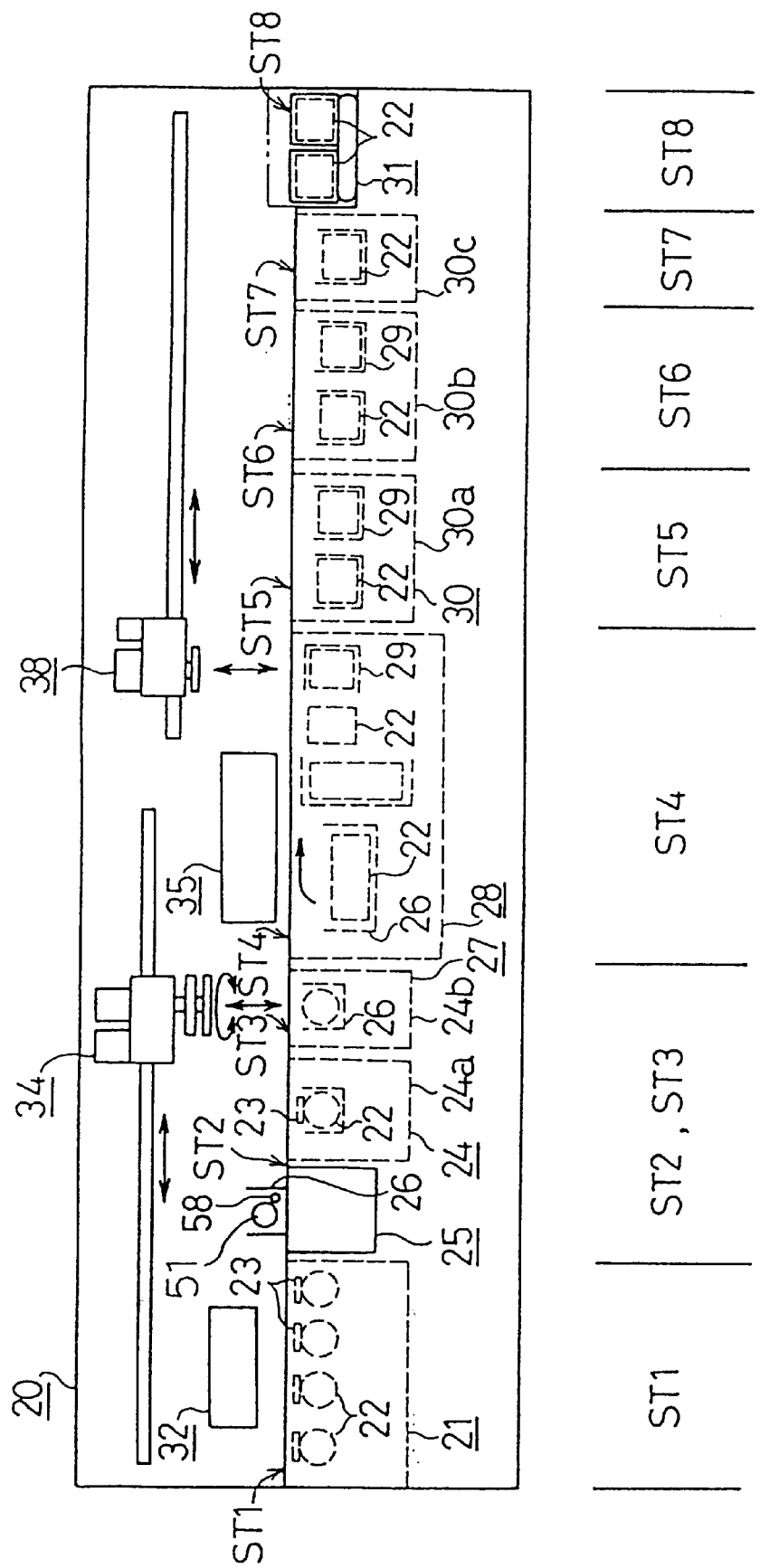
FIG. 1 is a schematic front view showing a processing system according to a first embodiment of the present invention.
Figure 12:
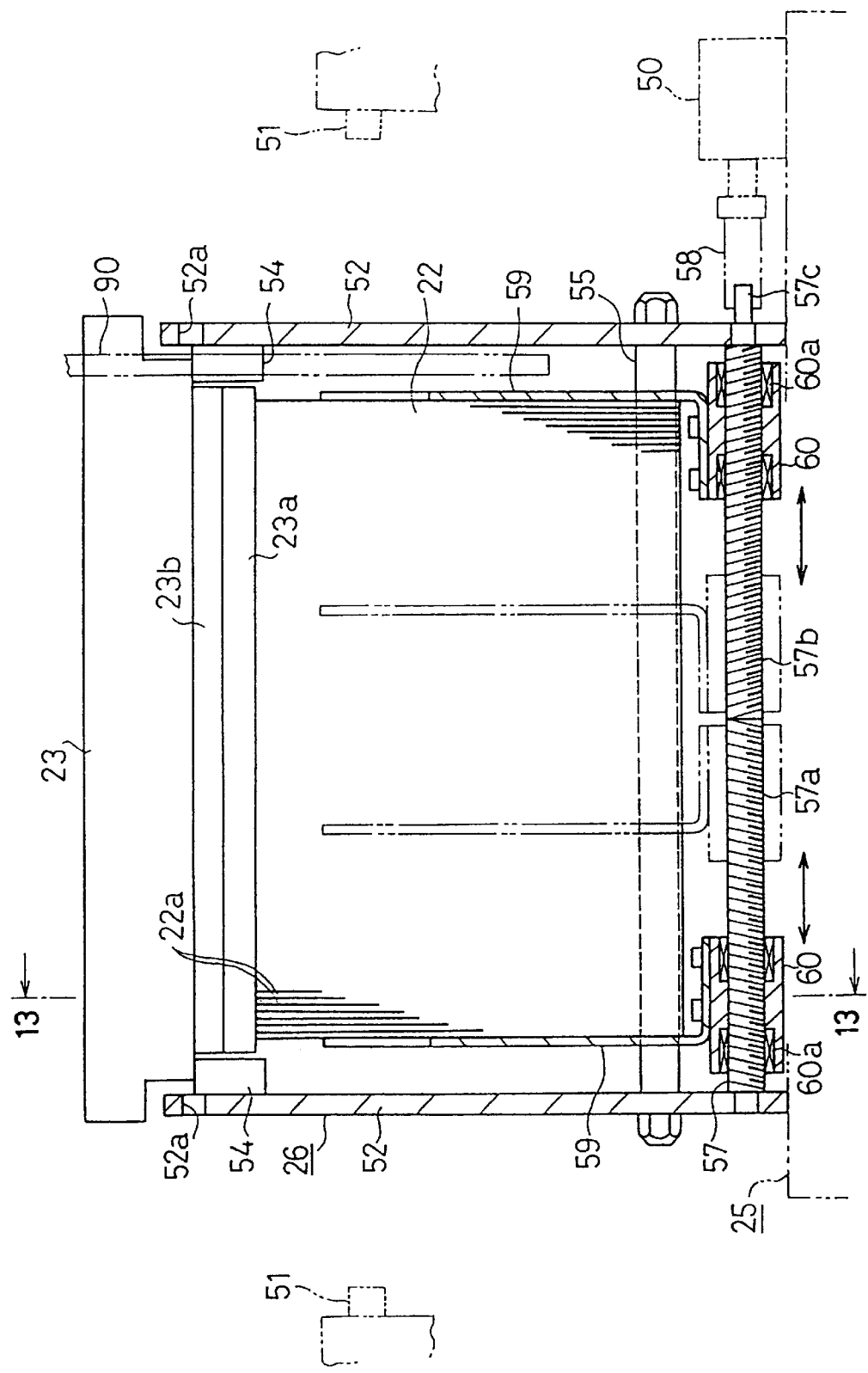
FIG. 12 is a cross-sectional view showing a first cassette employed in the processing system.
Figure 13:
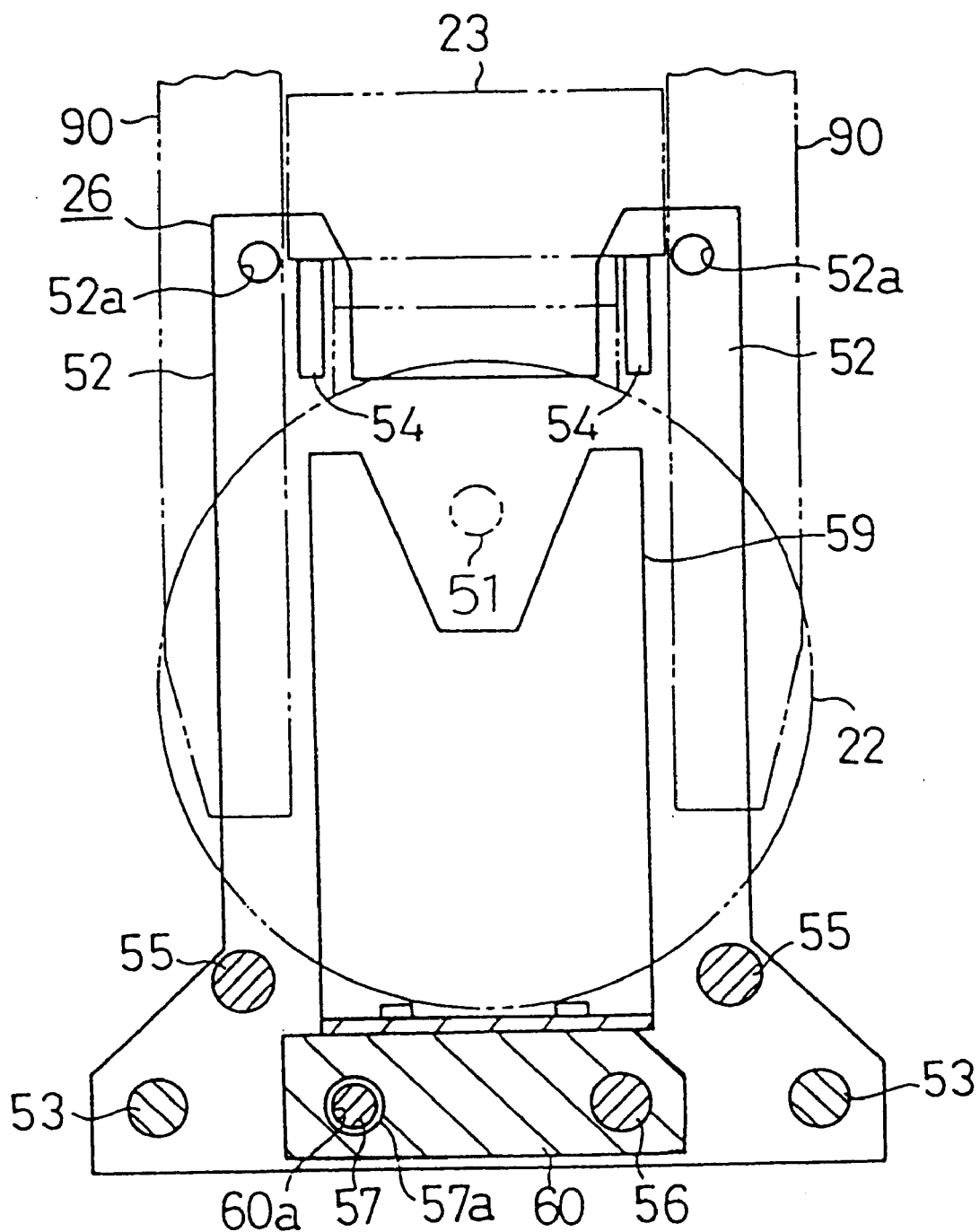
FIG. 13 is a cross-sectional view taken along line 13—13 in FIG. 12.

As shown in FIGS. 1 to 3, the table 25 is located adjacent to the prewashing tank 42 of the prewashing apparatus 21. The prewashed workpiece 22 is retained in the first cassette 26 on the table 25. As shown in FIGS. 12 and 13, the first cassette 26 includes a pair of parallel side plates 52, which have a predetermined distance between each other, and a connecting rods 53, which connect the pair of side plates 52 to each other. A pair of engaging holes 52a are formed in the top end of each side plate 52. The engaging holes 52a are used by the first transporting apparatus 34 to lift the first cassette 26.

A pair of holding bodies 54 project from the inner surface at the upper section of each side plate 52. Each workpiece 22 is held between the side plates 52 by placing the adhering plate 23 on the holding bodies 54. A pair of holding rods 55 having a predetermined distance between each other connect the lower section of the two side plates 52. Each workpiece 22 is held on the pair of holding rods 55 when the removing apparatus 27, which performs the third step ST3, removes the workpiece 22 from its adhering plate 23.

A guide rod 56, which extends parallel with respect to the pair of connecting rods 53, connects the two side plates 52. A threaded rod 57, which extends parallel with respect to the pair of connecting rods 53, is rotatably supported by the two side plates 52. The threaded rod 57 serves as a restricting means. A pair of threaded sections 57a, 57b are defined on the peripheral surface of the threaded rod 57. The direction of the spirally formed thread on the section 57a is reversed with respect to the direction of the spirally formed thread on the section 57b. A driving section 57c projects from one end of the threaded rod 57. The driving section 57c engages a rotating body 58. The rotating body 58 is arranged in the vicinity of the table 25 and rotated by a driving means 50 such as a motor (FIGS. 1 and 2).

A pair of restricting plates 59 serve as a means to prevent the wafers 59a that have been removed from the adhering plate 23 from falling down. Each restricting plate 59 is movably coupled to the guide rod 56 by a supporting member 60. This enables the restricting plates 59 to move along the axis of the guide rod 56. Each supporting member 60 has a threaded hole 60a that engages the threaded sections 57a, 57b of the threaded rod 57. As the rotating body 58 rotates the threaded rod 57, the restricting plates 59 move either toward or away from each other and thus the distance between the plates 59 is varied.

A pair of ultrasonic sensors 51 are provided in a manner such that each sensor 51 faces one of the side walls 52 of the first cassette 26, which is placed on the table 25. Each sensor 51 detects the distance to the corresponding end of the workpiece 22 retained in the first cassette 26. The controller 40 judges the axial length of the workpiece 22 based on the distance detected by the sensors 51. The controller 40 then controls the drive means 50 of the rotating body 58 in accordance with the length of the workpiece 22 to adjust the distance between the restricting plates 59. This prevents the wafers 22a of each workpiece 22 from falling.

The ultrasonic sensors 51 may be substituted by a laser measuring device that detects distance by using a laser beam.

Figure 6:
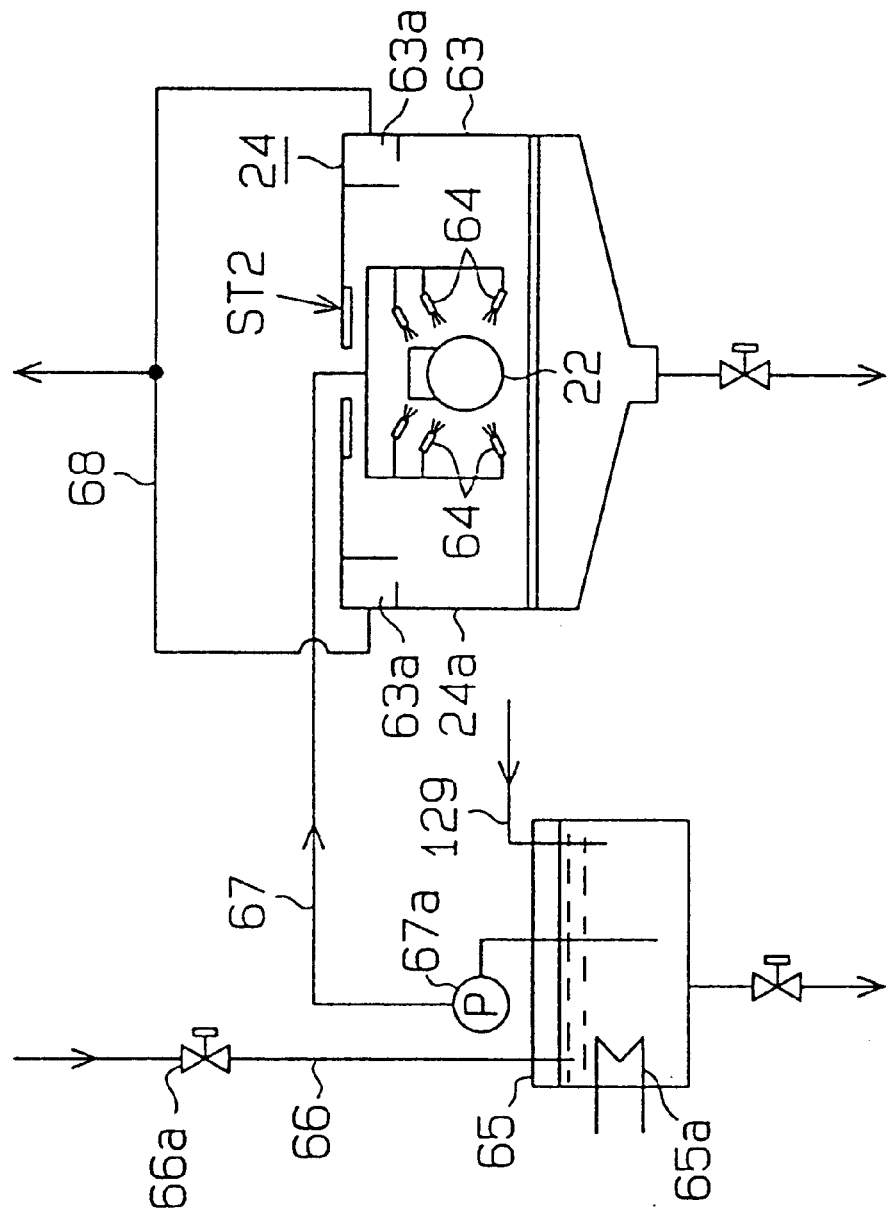
FIG. 6 is a structural diagram showing the second step of the processing system.

As shown in FIGS. 3 and 6, the washing apparatus 24 includes a rough washing device 24a that performs the second step ST2. The rough washing device 24a has a first washing tank 63. A plurality of injection nozzles 64 are provided on the inner side walls of the first washing tank 63 with a predetermined distance between one another. The nozzles 64 are arranged in a manner such that when each workpiece 22 is accommodated in the first washing tank 63, the nozzles 64 are faced toward the peripheral surface of the workpiece 22. A water tank 65 provided with a heater 65a is located adjacent to the first washing tank 63. Water is supplied to the water tank 65 through a water passage 66 that includes a valve 66a.

The water in the water tank 65 is heated by the heater 65a to a temperature of approximately 50 degrees Celsius and maintained at this temperature. The heated water in the water tank 65 is supplied to the injection nozzles 64 through a water passage 67 that includes a pump 67a. The injection nozzle 64 injects heated water toward the workpiece 22 at a high pressure in the range of 5 to 20 kg/cm$^2$. The injected heated water schematically removes the adhered foreign matter, such as slurry or cutting chips, from the surface of the workpiece 22. That is, the heated water injected from the injection nozzles 64 performs rough washing of each workpiece 22. During the rough washing, the air in the first washing tank 63 contaminated by the abrasive grains is forcibly emitted through an exhaust passage 68 via inlet holes 63a.

Third Step

Figure 7:
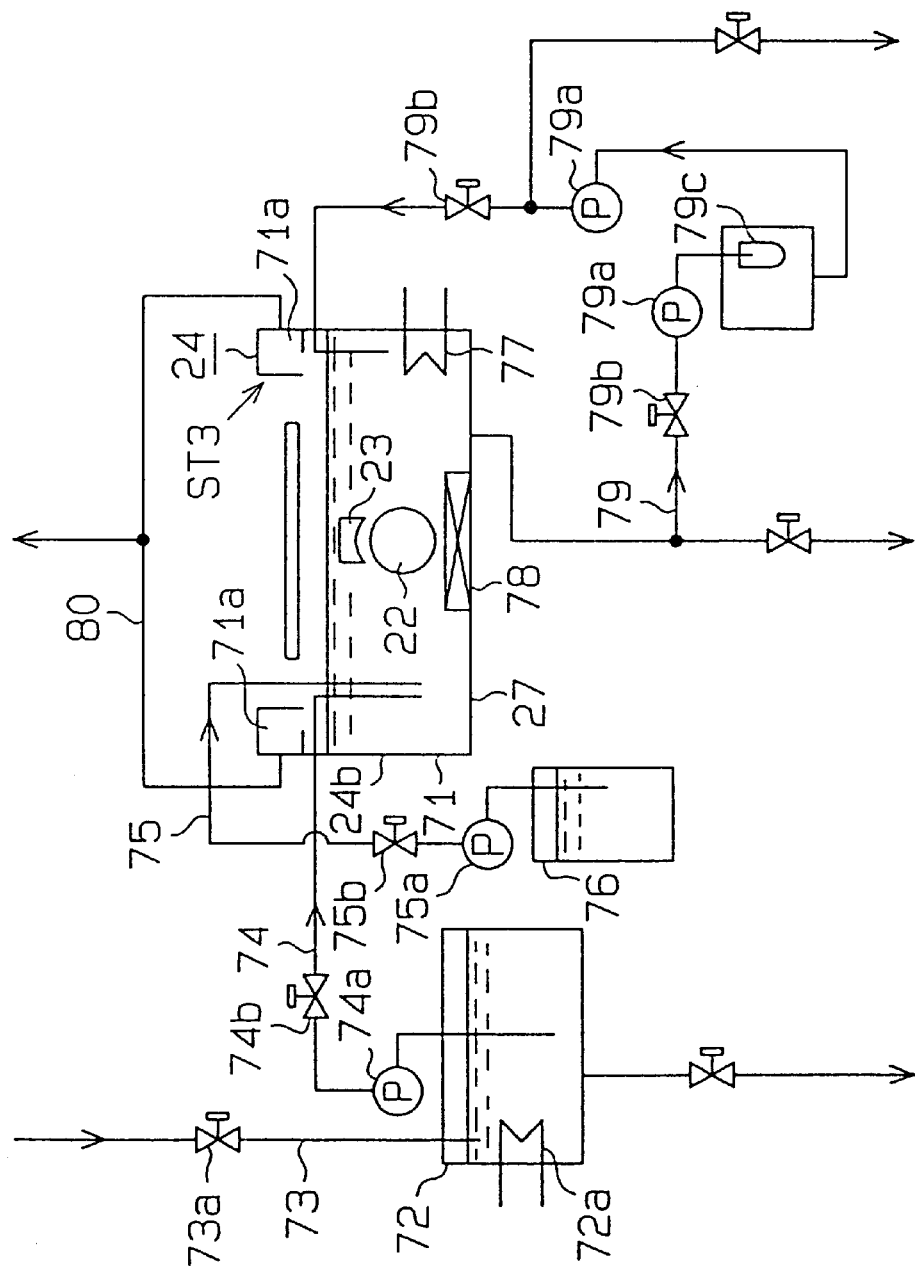
FIG. 7 is a structural diagram showing the third step of the processing system.

As shown in FIGS. 3 and 7, the washing apparatus 24 includes an additional washing device 24b, which performs the third step ST3. The additional washing device 24b also functions as the removing apparatus 27 and is provided with a second washing tank 71. A water tank 72, which is provided with a heater 72a, is located adjacent to the second washing tank 71. Water is supplied to the water tank 72 through a water passage 73 that includes a valve 73a. The water in the water tank 72 is heated to approximately 90 degrees Celsius by the heater 72a and supplied to the second washing tank 71 through a water passage 74, which includes a pump 74a and a valve 74b. A washing agent is contained in a tank 76. The washing agent is supplied to the second washing tank 71 through a washing agent passage 75, which includes a pump 75a and a valve 75b. A washing liquid having a predetermined concentration is obtained by mixing the washing agent with the heated water in the tank 71.

A heater 77 is provided in the second washing tank 71 to maintain the temperature of the washing liquid in the tank 71 at a constant value. An ultrasonic oscillator 78 is arranged in the washing tank 71. Each first cassette 26 retaining the workpiece 22 therein is dipped into the washing liquid in the washing tank 71. In this state, the ultrasonic oscillator 78 produces ultrasonic waves to wash the workpiece 22. The ultrasonic waves completely remove the foreign matter adhered to the workpiece 22. The ultrasonic waves also swell or dissolve the adhesive agent 23c applied between the adhering plate 23 and adhering plate 23. This enables the workpiece 22 to be separated from the adhering plate 23. As shown in FIGS. 12 and 13, after the separation, the workpiece 22 is supported on the holding rods 55 and held between the pair of restricting plates 59 to prevent each wafer 22a from falling. The adhering plate 23 taken off the workpiece 22 is removed from the first cassette 26 by a conventional manipulator or robot (neither shown). As another option, the adhering plate 23 may be transferred to a predetermined position by a pair of support arms 148a provided on the first transporting apparatus 34.

As shown in FIG. 7, when washing is being carried out by the ultrasonic waves, the washing liquid in the second washing tank 71 circulates through a circulating passage 79 that includes pumps 79a, valves 79b, and a filter 79c. Particulate matter that is suspended in the washing liquid is separated from the liquid by the filter 79c. Furthermore, during the ultrasonic washing, the contaminated air in the washing tank 71 is forcibly emitted through an exhaust passage 80 via inlet holes 71a.

Fourth Step

Figure 8:
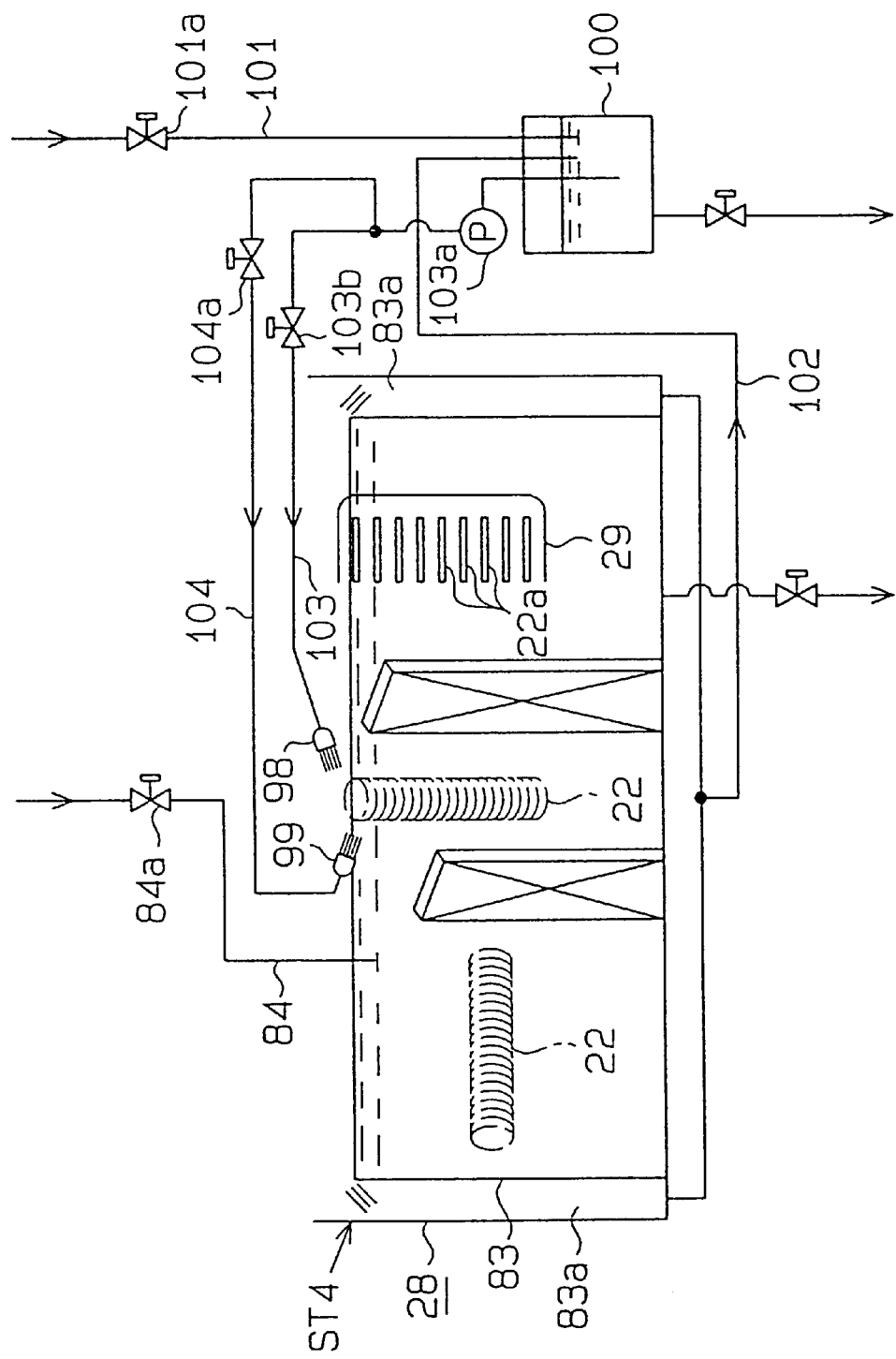
FIG. 8 is a structural diagram showing the fourth step of the processing system.
Figure 14:
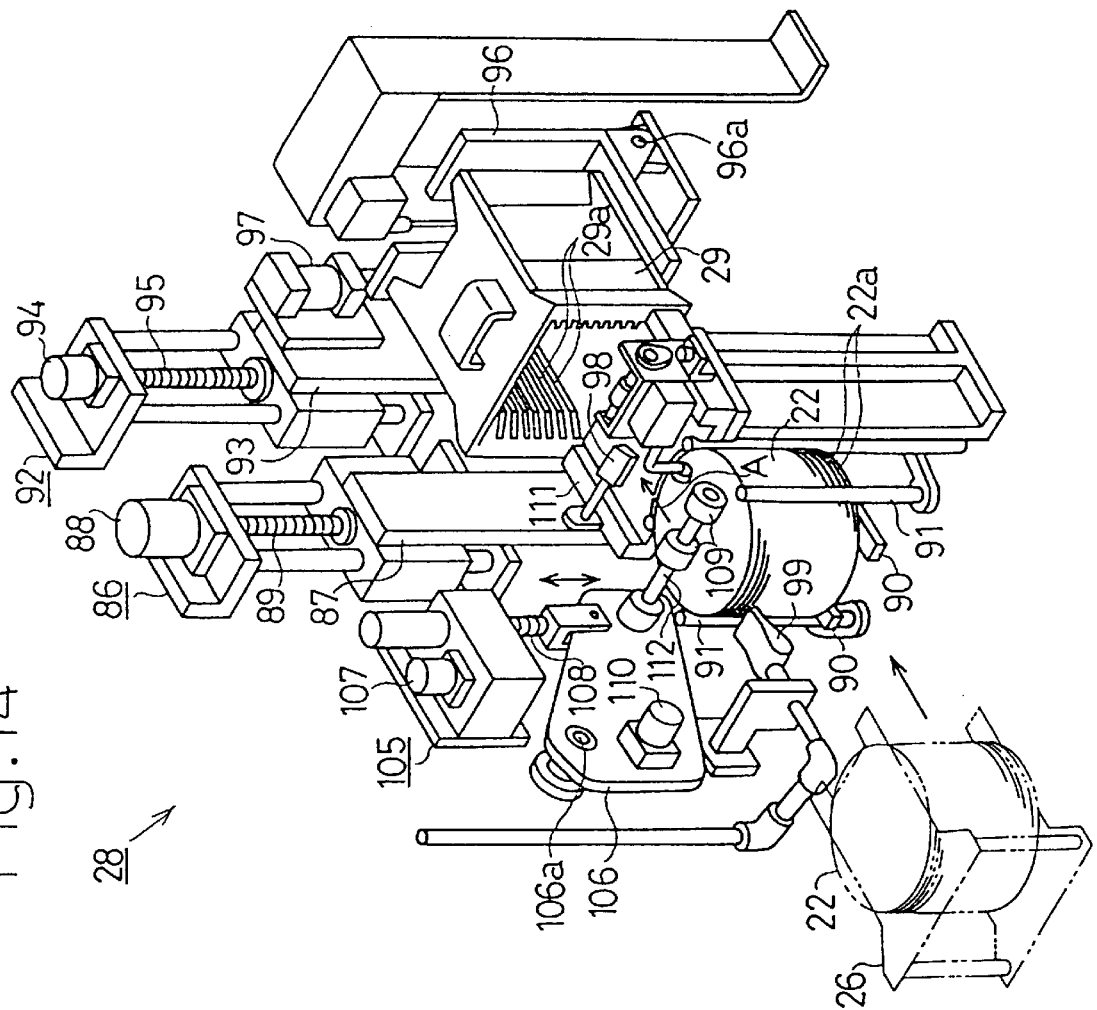
FIG. 14 is a perspective view showing the structure of the fourth step of the processing system.

As shown in FIGS. 3, 8, and 14, the separating/retaining apparatus 28, which performs the fourth step ST4, includes a separating tank 83. An overflow section 83a is defined encompassing the walls of the separating tank 83. Water is supplied to the separating tank 83 through a water passage 84 which includes a valve 84a.

As shown in FIG. 3, a support platform 85 is provided in the separating tank 83. The first cassette 26, containing the workpiece 22 with the adhering plate 23 removed, is supported on the support platform 85. In this state, the axis of the workpiece 22 extends horizontally and parallel to the aligned row of the various apparatuses on the frame 20. The support platform 85 is moved and rotated by the second transporting apparatus 35. The movement and rotation of the support platform 85 enables the workpiece 22 to be positioned in a manner such that its axis becomes vertical and perpendicular to the aligned row of the various apparatuses on the frame 20.

As shown in FIGS. 3 and 14, a workpiece supporting mechanism 86 is also provided in the separating tank 83. The workpiece supporting mechanism 86 includes an elevating platform 87 and a motor 88. The motor 88 cooperates with a ball screw 89 to raise and lower the elevating platform 87. A pair of support arms 90 are provided at the bottom of the elevating platform 87 to support the workpiece 22, or the stacked wafers 22a. As shown in FIGS. 12, 13, 14, and 17, the movement of the support platform 85 enables the support arms 90 to enter the space between the lower side plate 52 and the lower restricting plate 59. This enables the workpiece 22 to be transferred from the first cassette 26 onto the support arms 90. In other words, the support platform 85 is rotated 90 degrees in a clockwise direction and moved rightward from the state shown in FIG. 3. This results in the support arms 90 entering the first cassette 26 and being positioned beneath the lower surface of the workpiece 22 as shown in FIGS. 12 and 13. After the support arms 90 are lifted and moved leftward as viewed in FIG. 3 from this state, the wafers 22a of the workpiece 22 are supported on the support arms 90 in a stacked state.

As shown in FIG. 14, the workpiece supporting mechanism 86 includes a pair of guide rods 91. The guide rods 91 come into contact with the peripheral surface of the workpiece 22 and serves as a guide. When the workpiece 22 in the first cassette 26 is transferred onto the support arms 90, the guide rods 91 retreat to a position where they do not interfere with the first cassette 26 and the support platform 85. After the transference is completed, the guide rods 91 return to a base position where they come into contact with the peripheral surface of the workpiece 22. The workpiece 22 is lifted when the guide rods 91 are at the base position.

As shown in FIGS. 2, 3, 8, and 14, a cassette supporting mechanism 92 is provided in the separating tank 83. The cassette supporting mechanism 92 includes an elevating platform 93 and a motor 94. The motor 94 cooperates with a ball screw 95 to raise and lower the elevating platform 93. The cassette supporting mechanism 92 also includes a cassette support platform 96 and a cylinder 97. The cassette support platform 96 is pivotally supported by a pivot shaft 96a. The cylinder 97 is used to pivot the cassette support platform 96. Each second cassette 29 is conveyed by the cassette conveying apparatus 36 to the cassette support platform 96 and supported thereon. The second cassette 29 on the cassette support platform 96 is dipped into the water in the separating tank 83. In this state, the second cassette 29 is faced toward the workpiece 22 on the support arms 90.

First and second nozzles 98, 99 are arranged in the separating tank 83 at positions where they face the upper surface of the workpiece 22. A water tank 100 is arranged in the vicinity of the separating tank 83. Water is supplied to the water tank 100 through a water passage 101 that includes a valve 101a. Water that overflows into the overflow section 83a of the separating tank 83 is also sent to the water tank 100 through a recovering passage 102.

The water in the water tank 100 is supplied to the first nozzle 98 through a first passage 103 that includes a pump 103a and a valve 103b. The first nozzle 98 injects water toward the upper surface of the uppermost wafer 22a from a diagonally upward position. The water is injected in a direction which is opposite to the moving direction of the wafer 22a (indicated by arrow A in FIG. 14). The water injected from the first nozzle 98 prevents the uppermost wafer 22a from floating on the water.

A second passage 104, which includes a valve 104a, is connected to a pump 103a parallel to the first passage 103. When the uppermost wafer 22a is separated from the other wafers 22a and moved in the direction indicated by arrow A in FIG. 14, the water in the water tank 100 is supplied to the second nozzle 99 through the second passage 104. The second nozzle 99 injects water toward the upper surface of the uppermost wafer 22a from a diagonally upward position. The water is injected in the direction indicated by arrow A. The injected water separates the uppermost wafer 22a from the other wafers 22a one at a time. A chute 111 is arranged in the vicinity of the water surface in the separating tank 83. The water injected from the second nozzle 99 produces a water stream in the direction indicated by arrow A on the upper surface of the chute 111. Accordingly, the water stream on the upper surface of the chute 111 conveys the separated wafer 22a into the second cassette 29.

As shown in FIG. 14, each second cassette 29 has a plurality of storage racks 29a. The racks 29a are arranged vertically in the cassette 29 with a predetermined interval between one another. Each wafer 22a is stored in the second cassette 29 on one of the storage racks 29a.

A separation aiding mechanism 105 is arranged facing toward the workpiece 22 on the support arms 90. The aiding mechanism 105 has a pivoting plate 106, which rotates vertically about a pivot shaft 106a, and a motor 107 that pivots the pivoting plate 106 in cooperation with a ball screw 108. The aiding mechanism 105 also has a rotary shaft 112, separating rollers 109 made of a foam rubber or a foam resin, and a motor 110. The rotary shaft 112 is rotatably supported by the pivoting plate 106. The separating rollers 109 are fixed to the rotary shaft 112. The motor 110 rotates the rollers 109 through a drive transmission mechanism (not shown).

When the uppermost wafer 22a is separated from the other wafers 22a, the motor 107 and the ball screw 108 pivot the pivoting plate 106 about the pivot shaft 106a in a clockwise direction as viewed in FIG. 14. This results in the separating rollers 109 contacting the upper surface of the uppermost wafer 22a. In this state, the motor 110 rotates the separating rollers 109 in a counterclockwise direction as viewed in FIG. 14. Rotation of the rollers 109 applies a driving force to the uppermost wafer 22a in the direction indicated by arrow A. This enhances the separating action of the uppermost wafer 22a.

The elevating platform 87, which supports each workpiece 22, is first lowered and then raised by a pitch corresponding to the thickness of a single wafer 22a by the cooperation between the motor 88 and the ball screw 89 when each uppermost wafer 22a is separated from the other wafers 22a. This enables the uppermost wafer 22a to be positioned in the vicinity of the water surface (the position corresponding to the upper surface of the chute 111). As the elevating platform 87 is raised, the elevating platform 93, which supports each second cassette 29, is lowered by a pitch corresponding to the interval between each storage rack 29a by the cooperation between the motor 94 and the ball screw 95. This enables an empty rack 29a of the second cassette 29 to be positioned at the vicinity of the water surface (the position corresponding to the upper surface of the chute 111). As a result, each wafer 22a is securely separated from the other stacked wafers 22a on the elevating platform 87 and then securely stored on one of the storage racks 29a in the second cassette 29.

When the wafers 29a are stored in each storage rack 29a of the second cassette 29, the elevating platform 93 is raised to a predetermined top position by the motor 94 and the ball screw 95. From this state, the cassette support platform 96 is pivoted 90 degrees about the pivot shaft 96a by the cylinder 97 in a clockwise direction from the position shown in FIG. 14. The pivoting causes the axes of the wafers 22a in the second cassette 29 to be arranged to extend along the aligned apparatuses on the frame 20.

Fifth Step and Sixth Step

Figure 4:
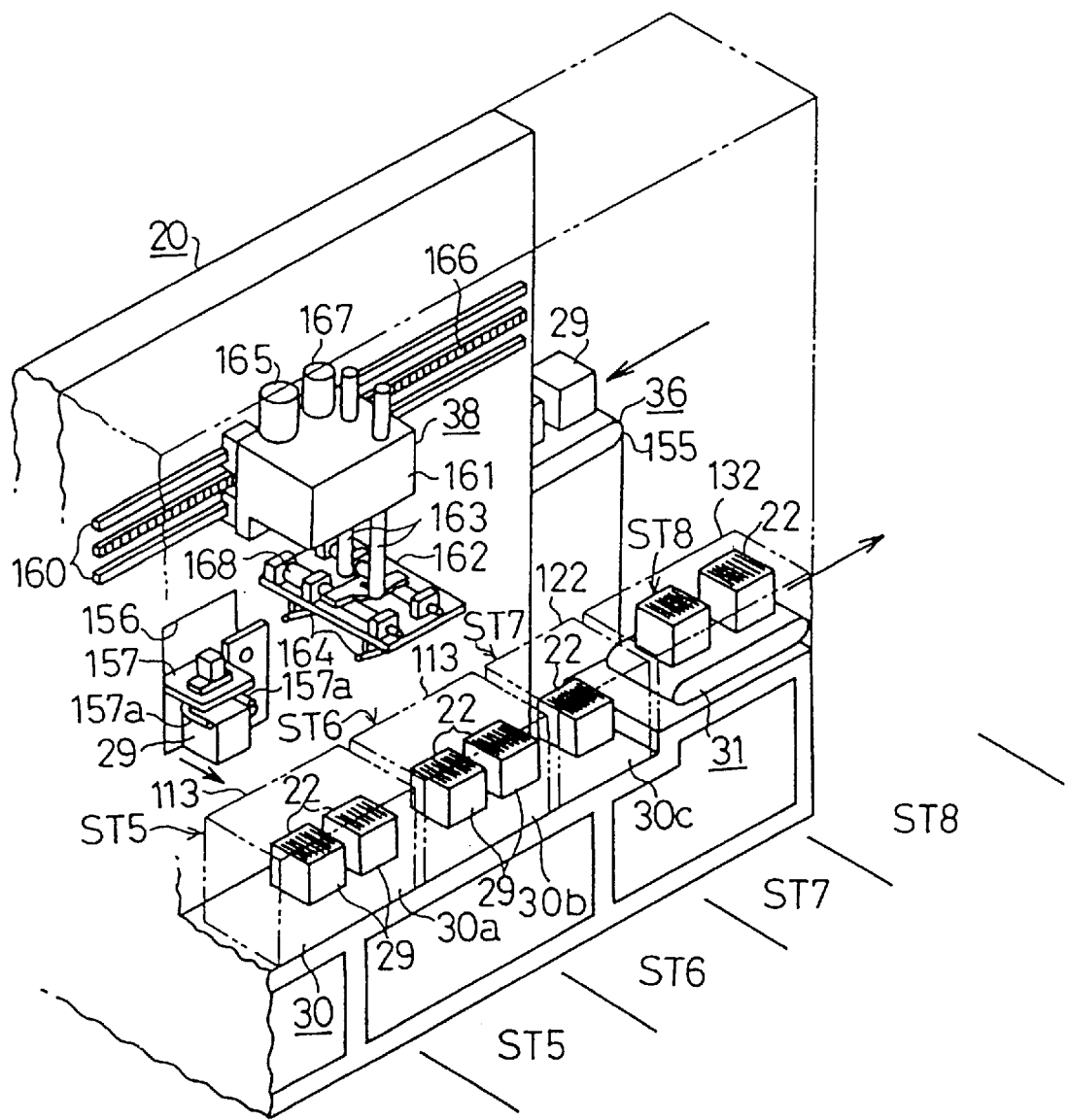
FIG. 4 is a perspective view showing fifth through eighth steps of the processing system.
Figure 9:
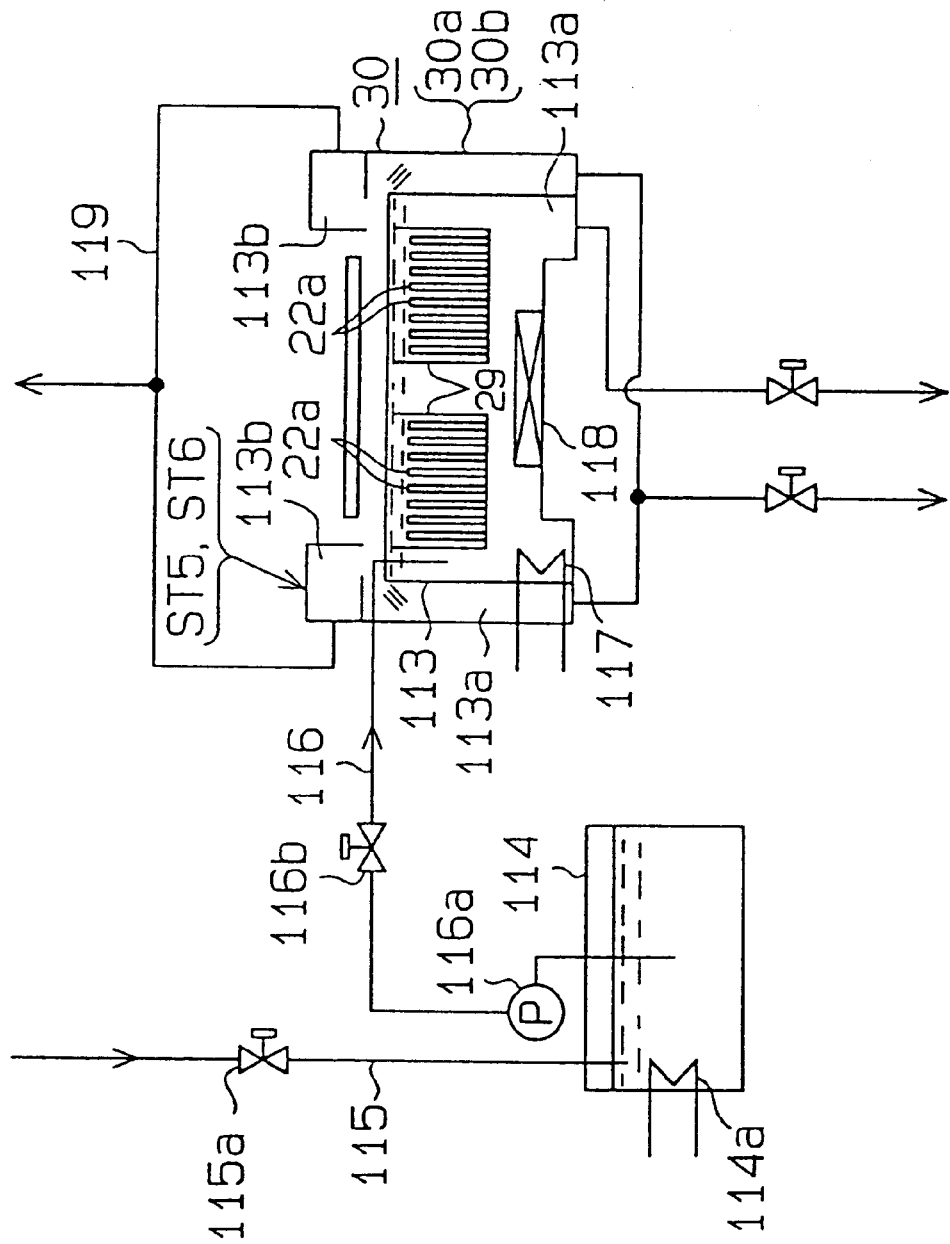
FIG. 9 is a structural diagram showing the fifth and sixth steps of the processing system.

As shown in FIGS. 4 and 9, the fine washing apparatus 30 includes a first washing device 30a, which performs the fifth step ST5, and a second washing device 30b, which performs the sixth step ST6. The structure of the first and second washing devices 30a, 30b are identical. Each device 30a, 30b is provided with a fine washing tank 113, which is encompassed by an overflow section 113a. A water tank 114 provided with a heater 114a is located adjacent to the fine washing tank 113. Water is supplied to the tank 114 through a water passage 115 that includes a valve 115a. The water in the tank 114 is heated to approximately 70 degrees by the heater 114a. The heated water in the tank 114 is supplied to the fine washing tank 113 through a water passage 116 that includes a pump 116a and a valve 116b.

A heater 117 is provided in the fine washing tank 113 to maintain the temperature of the heated water in the tank 113 at a constant value. An ultrasonic oscillator 118 is arranged in the fine washing tank 113. Each second cassette 29 with the wafers 22a retained therein is dipped into the heated water in the fine washing tank 113. In this state, the ultrasonic oscillator 118 produces ultrasonic waves to wash the wafers 22a. Thus, the washing of the wafers 22a in each second cassette 29 is conducted in the fifth step ST5 and repeated in the sixth step ST6. During the ultrasonic washing, the contaminated air in each fine washing tank 113 is forcibly emitted through an exhaust passage 119 via inlet holes 113b.

Seventh Step

Figure 10:
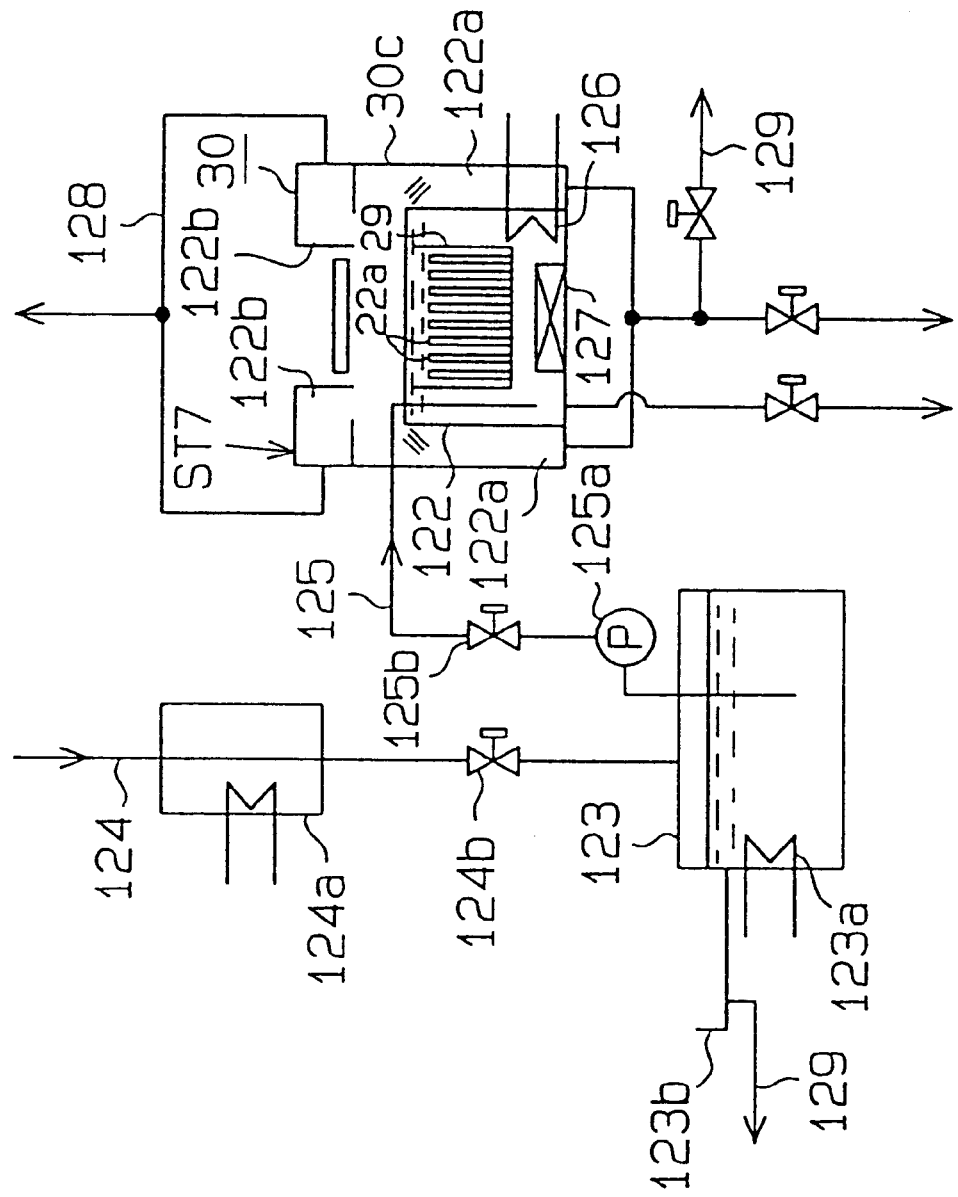
FIG. 10 is a structural diagram showing the seventh step of the processing system.

As shown in FIGS. 4 and 10, the fine washing tank 30 includes a third washing device 30c, which performs the seventh step ST7. The third washing device 30c is provided with a finish washing tank 122, which is encompassed by an overflow section 122a. A water tank 123 having a heater 123a and an overflow section 123b is located adjacent to the washing tank 122. Heated water is supplied to the tank 123 through a water passage 124 that includes a heated water supplier 124a and a valve 124b. The heated water in the tank 123 is heated to approximately 70 degrees by the heater 123a. The heated water in the tank 123 is supplied to the washing tank 122 through a water passage 125 that includes a pump 125a and a valve 125b.

A heater 126 is provided in the finish washing tank 122 to maintain the temperature of the heated water in the tank 122 at a constant value. An ultrasonic oscillator 127 is arranged in the washing tank 122. Each second cassette 29 with the wafers 22a retained therein is dipped into the heated water in the washing tank 122. In this state, the ultrasonic oscillator 118 produces ultrasonic waves to rinse the wafers 22a. The ultrasonic rinsing washes off the washing liquid on the wafers 22a and the second cassette 29.

During the rinsing, the contaminated air in the washing tank 122 is forcibly emitted through an exhaust passage 128 via inlet holes 122b. The heated water that overflows into the overflow section 122a of the washing tank 122 and the overflow section 123b of the water tank 123 is drawn into the water tank 65 of the rough washing device 24a, which is shown in FIG. 6. Hence, the heated water is recycled and used for the rough washing of each workpiece 22.

After the rinsing of the wafers 22a in the washing tank 122 is completed, the third transporting apparatus 38 slowly lifts the second cassette 29 out if the heated water in the tank 122. After being lifted out of the tank 122, the wafers 22a in the second cassette 29 are dried by its own heat.

Eighth Step

Figure 11:
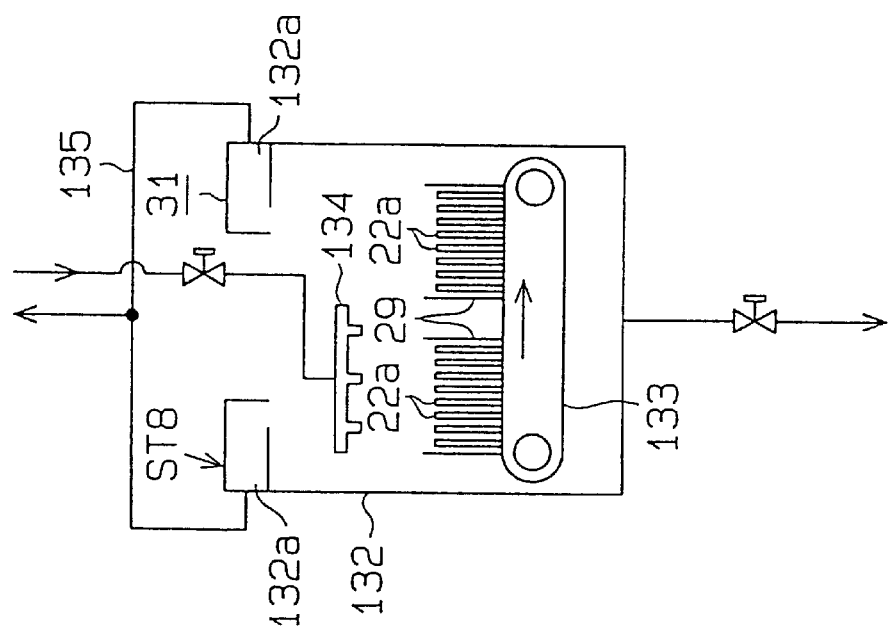
FIG. 11 is a structural diagram showing the eighth step of the processing system.

As shown in FIGS. 2, 4, and 11, the drying apparatus 31, which performs the eighth step ST8, includes a drying compartment 132. A conveyor 133 is provided on the bottom surface in the drying compartment 132. Each second cassette 29 is lifted out of the heated water in the finish washing tank 122 with the wafers 22a retained therein and then placed on the conveyor 133. Air nozzles 134 are arranged in the drying compartment 132 at positions opposed to one side of the conveyor 133. The air nozzles 134 blast air toward the wafers 22a for a certain time period. Since the wafers 22a are heated by the heated water in the finish washing tank 122 in the seventh step ST7, the wafers 22a are dried within a short period of time when air is blasted thereon.

After air blasting is completed, the conveyor 133 conveys the wafers 22a to a position which is outside of the blasting area of the air nozzles 134. The conveyor 133 is stopped at this position for a certain time period. Accordingly, the wafers 22a and each second cassette 29 are entirely and uniformly dried.

During the drying step, the humid air in the drying compartment 132 is forcibly emitted through an exhaust passage 135 via inlet holes 132a. After the drying step is completed, the second cassettes 29 are conveyed out of the drying compartment 132 with the wafers 22a retained therein and transferred to the unloading apparatus 39.

The holding apparatus 32, the first transporting apparatus 34, the cassette conveying apparatus 36, the second transporting apparatus 35, and the third transporting apparatus 38 will now be described in detail.

The Holding Apparatus

As shown in FIGS. 2 and 3, the holding apparatus 32 includes a holding arm 139 and a pair of guide rods 138 that move the arm 139 between a forward position and a rearward position with respect to the frame 20. Each workpiece 22 is transferred from the loading apparatus 33 to the support arm 139 and temporarily held thereon. In this state, the support arm 139 is located at the forward position. A motor 140 cooperates with a ball screw 141 to move the support arm 139, which is holding the workpiece 22, in a rearward direction until the workpiece 22 becomes located at a position corresponding to the prewashing apparatus 21, which performs the first step ST1.

The First Transporting Apparatus

As shown in FIGS. 2 and 3, the first transporting apparatus 34 includes a pair of guide rails 144 and a moving platform 145. The guide rails 144 support the moving platform 145 at the front side of the frame 20. The moving platform 145 moves in the longitudinal direction of the guide rails 144, or in the direction parallel to the alignment of the apparatuses on the frame 20. A lifting platform 147 is connected to the bottom of the moving platform 145 by a pair of guide rods 146. The lifting platform 147 is supported in a manner such that it may be lifted and lowered. A support member 148 is connected to the bottom surface of the lifting platform 147. The support member 148 is supported in a manner such that it is rotatable about a vertical axis. The support member 148 is provided with the pair of support arms 148a, and a pair of support pins 148b for each support arm 148a. The support arms 148a are moved toward and away from each other, or selectively closed and opened. Each pair of support pins 148b are rotatable and are selectively opened and closed.

A motor 149 cooperates with a rack 150 to move the moving platform 145 horizontally to positions corresponding to the holding apparatus 32, the prewashing apparatus 21, the table 25, the rough washing device 24a, the removing apparatus 27, and the separating/retaining apparatus 28. The lifting platform 147 is lifted and lowered at the positions corresponding to each apparatus by a motor 151, a ball screw, and other parts (not shown). The support member 148 moves toward and away from each apparatus as the lifting platform 147 is lowered and lifted.

The support arms 148a of the support member 148 grip the adhering plate 23 of each workpiece 22 when closed and release the plate 23 when opened. The support arms 148a enable each workpiece 22 to be moved between the holding apparatus 32, the prewashing apparatus 21, and the table 25. The support arms 148a also enable the workpiece 22 on the table 25 to be retained in one of the first cassettes 26. The support pins 148b of the support member 148 become engaged with the engaging holes 52a when closed and are separated from the engaging holes 52a when opened. The support pins 148b enable each first cassette 26, accommodating a workpiece 22, to be moved between the table 25, the rough washing device 24a, the removing apparatus 27, and the separating/retaining apparatus 28.

When each workpiece 22 is transported from the holding apparatus 32 to the prewashing apparatus 21, the support member 148 is horizontally pivoted 90 degrees by the cylinder 152. The pivoting of the support member 148 changes the direction of the workpiece 22 so that its axis becomes perpendicular to the row of the apparatuses on the frame 20. When the first cassettes 26, in which the workpiece 22 is accommodated, is transported to the separating/retaining apparatus 28 from the removing apparatus 27, the support member 148 is horizontally pivoted 90 degrees by the cylinder 152. The pivoting of the support member 148 changes the direction of the workpiece 22 so that its axis becomes parallel to the alignment of the apparatuses on the frame 20 (the direction indicated by arrow A in FIG. 14).

The Cassette Conveying Apparatus

As shown in FIGS. 2 to 4, the cassette conveying apparatus 36 includes a conveyor 155, which is arranged on the frame 20. An opening 156 is defined in the frame 20 at a position corresponding to the end of the conveyor 155. The conveyor 155 conveys empty second cassettes 29, which are transferred thereon from a cassette loading apparatus 37, to a position corresponding to the opening 156.

A supplying mechanism 157 is arranged in a manner such that it may be projected from and retracted into the opening 156. The supplying mechanism 157 has a pair of supply arms 157a which are moved toward and away from each other, or selectively closed and opened. The supplying mechanism 157 grips the second cassette 29 on the conveyor 155 with the supply arms 157a, and transfers the cassette 29 to a position above the separating/retaining apparatus 28. The third transporting apparatus 38 then receives the second cassette 29 from the supply arms 157a and places the cassette 29 on the cassette support platform 96 of the separating/retaining apparatus 28.

The Third Transporting Apparatus

As shown in FIG. 4, the third transporting apparatus 38 includes a pair of guide rails 160 and a moving platform 161. The guide rails 160 support the moving platform 161 at the front side of the frame 20. The moving platform 161 moves in the longitudinal direction of the guide rails 160, or in the direction of the row of the apparatuses on the frame 20. A lifting platform 162 is connected to the bottom of the moving platform 161 by a pair of guide rods 163. The lifting platform 147 is supported in a manner that it may be lifted and lowered. A pair of support rods 164 are attached to the bottom surface of the lifting platform 162 in a manner that they may be moved toward and away from each other, or selectively closed and opened.

A motor 165 cooperates with a rack 166 to move the moving platform 161 to positions corresponding to the cassette conveying apparatus 36, the first, second, and third washing devices 30a, 30b, 30c, and the drying apparatus 31. The lifting platform 162 is lifted and lowered at the positions corresponding to each apparatus by a motor 151, a ball screw, and other parts (not shown). The support rods 164 move toward and away from each apparatus as the lifting platform 162 is lowered and lifted. A cylinder 168 opens and closes the support rods 164. The second cassettes 29 are gripped by closing the support rods 164 and released by opening the support rods 164. The support rods 164 move the second cassettes 29 between each apparatus.

The Second Transporting Apparatus

The second transporting apparatus 35 will now be described. As shown in FIGS. 3, 15, 16, and 17, a recess 171 is defined in the frame 20. A pair of guide rails 172 extend horizontally and parallel to each other in the recess 171. A moving platform 173 is movably supported by the guide rails 172. An attachment plate 174 extending downward is fixed to the front side of the moving platform 173.

Figure 15:
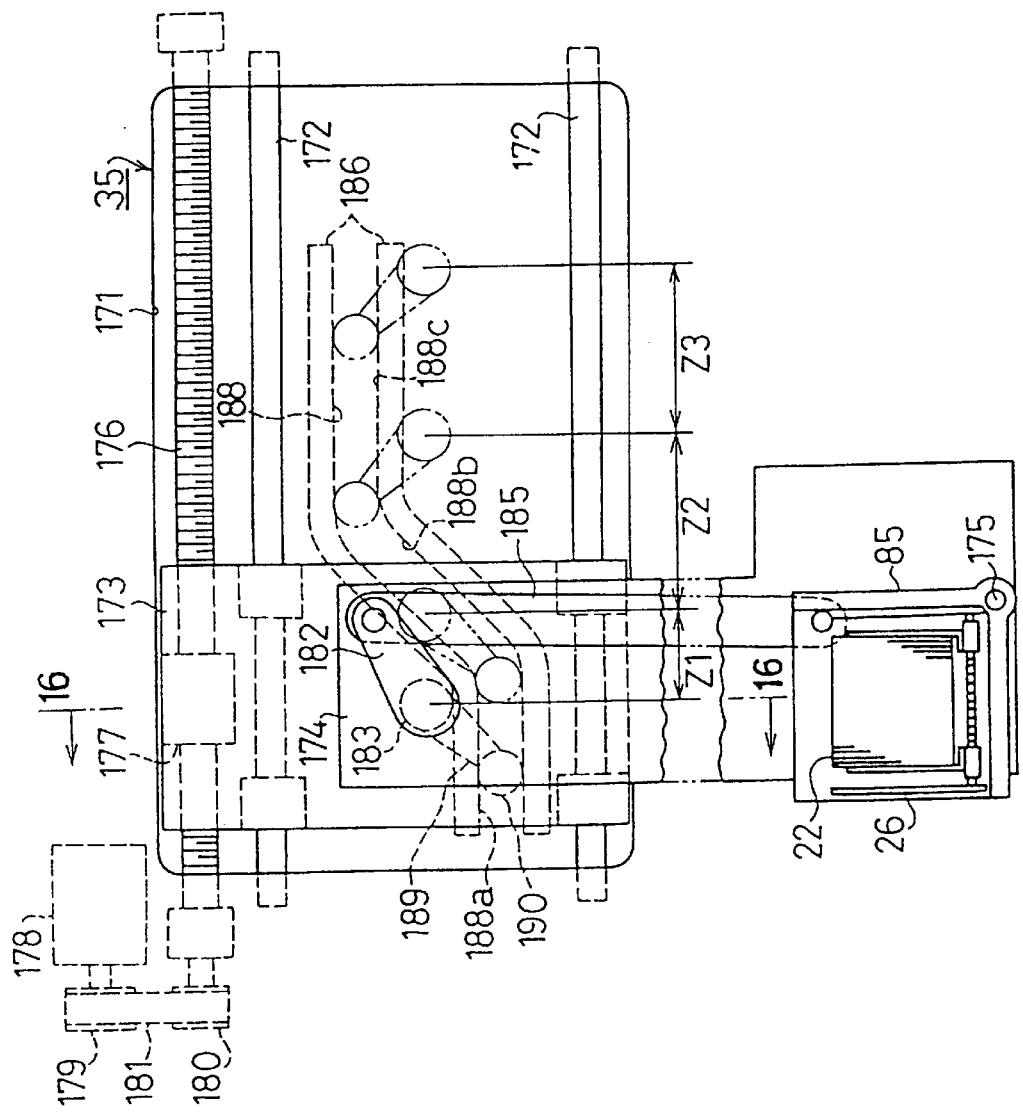
FIG. 15 is a front view showing the structure of a second transporting system of the processing system.
Figure 16:
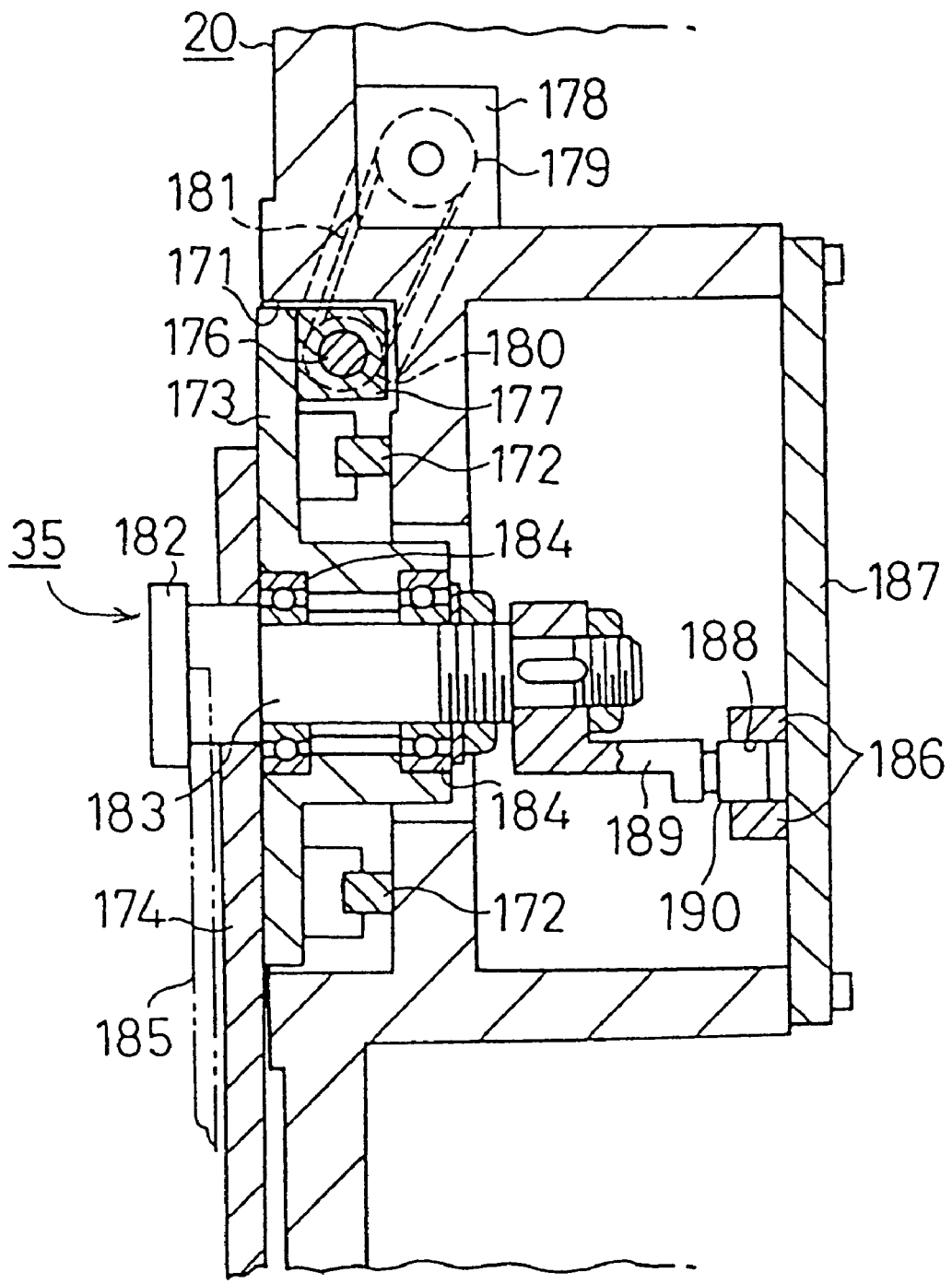
FIG. 16 is a cross-sectional view taken along line 16—16 in FIG. 15.

The support platform 85 of the separating/retaining apparatus 28 is pivotally supported by a pivot shaft 175 at the bottom end of the attachment plate 174. As shown in FIGS. 3, 15, and 16, when the first cassette 26 is supported on the support platform 85 with a workpiece 22 accommodated therein, the axis of the workpiece 22 is extended in a substantially horizontal manner.

A ball screw 176 is rotatably supported in the recess 171. The ball screw 176 extends parallel to the guide rails 172. A threaded nut 177 is fixed to the moving platform 173 and engaged with the ball screw 176. A motor 178 is provided in the frame 20 and coupled to the ball screw 176 by pulleys 179, 180 and a belt 181. The motor 178 rotates the ball screw 176 to move the moving platform 173 along the guide rails 172. The movement of the moving platform 173 results in the workpiece 22 on the support platform 85 being moved in a lateral direction.

A pivoting lever 182 is coupled to the moving platform 173 by a pivot shaft 183. A pair of ball bearings 184 enables pivoting of the lever 182. The distal end of the lever 182 is connected to an upper end of the support platform 85 by a connecting link 185. A pair of elongated cam plates 186 are secured to a connecting plate 187 in the frame 20. A cam groove 188 is defined between the two cam plates 186. The cam groove 188 includes a first groove 188a, which extends horizontally, a second groove 188b, which extends diagonally, and a third groove 188c, which extends horizontally. A pivoting arm 189 is fixed to the pivot shaft 182. A roller 190, which engages with the cam groove 188 and rolls therein, is provided at the distal end of the arm 189.

Figure 17:
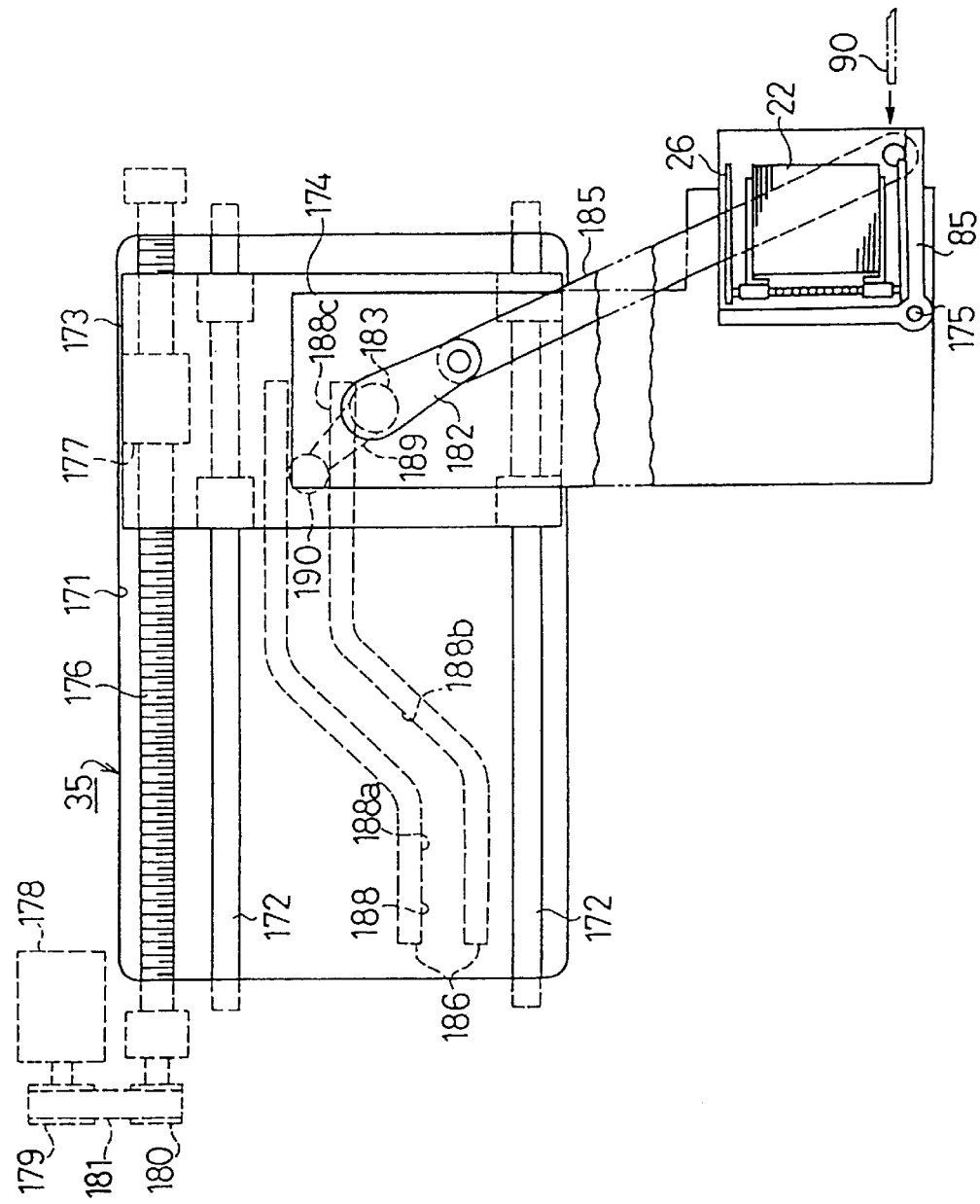
FIG. 17 is a front view showing the movement of the second transporting apparatus.
Figure 18:
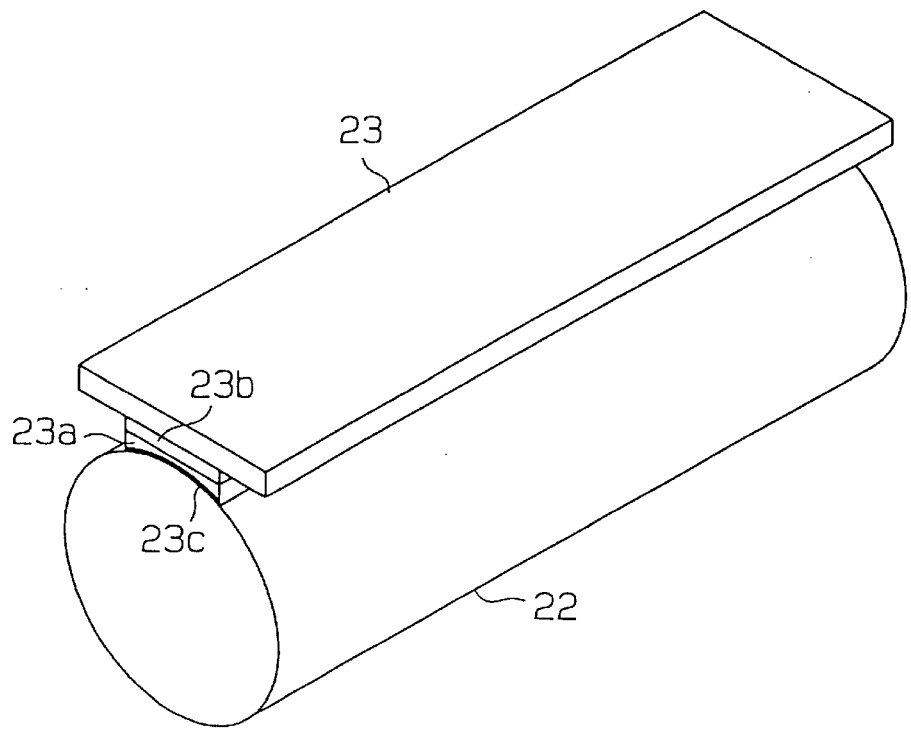
FIG. 18(a) is a perspective view showing a workpiece before it is cut.
FIG. 18(b) is a perspective view showing the workpiece after it is cut.
Figure 18:
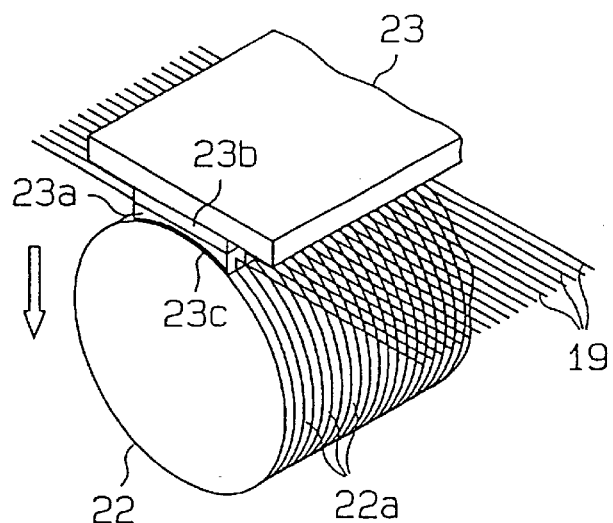

As the moving platform 173 moves from the left side of FIG. 15, to a rightward position, the roller 190 rolls along the first, second, and third grooves 188a, 188b, 188c. When the roller 190 rolls along the first groove 188a, or when the pivot shaft 183 moves in zone Z1, the support platform 85 is moved laterally without being pivoted. Thus, in this zone, the workpiece 22 moves laterally. When the roller 190 rolls along the second groove 188b, or when the pivot shaft 183 moves in zone Z2, the support platform 85 is pivoted 90 degrees in a clockwise direction by the pivoting arm 189, the pivot shaft 183, the pivot lever 182, and the connecting link 185. As shown in FIGS. 15 and 17, the pivoting of the support platform 85 changes the direction along which the axis of the workpiece 22 extends. In other words, the axis of the workpiece 22 shifts from a horizontal state to a vertical state. When the roller 190 rolls along the third groove 188c, or when the pivot shaft 183 moves in zone Z3, the support platform 85 is moved laterally without being pivoted. Thus, in this zone, the workpiece 22 moves laterally without changing the direction along which its axis extends.

Movements of the Overall System

The movements of the entire wafer processing system having the above structure will now be described.

In this processing system, each workpiece 22 is cut apart into wafers 22a by the wire saw 16 and then transferred to the holding apparatus 32, which is located at the forward position. The support arms 148a of the first transporting apparatus 34 then grip the adhering plate 23 of the workpiece 22 and receive the workpiece 22 from the holding apparatus 32. The holding apparatus 32 retreats to a rearward position afterwards. The first transporting apparatus 34 horizontally rotates the workpiece 22 by 90 degrees and then dips the workpiece 22 into the prewashing apparatus 21, which performs the first step ST1. The workpiece 22 is prewashed by bubbles in the prewashing apparatus 21.

Meanwhile, an empty first cassette 26 is placed on the table 25. The driving section 57c of the threaded rod 57, which is provided in each first cassette 26, is fit into the rotating body 58. Among the plurality of workpieces 22 dipped in the prewashing tank 21, the workpiece 22, which has been dipped for the longest period of time, is lifted out of the tank 21 by the support arms 148a of the first transporting apparatus 34. This workpiece 22 is retained in the first cassette 26 placed on the table 25. After retaining the workpiece 22, the controller 40 controls the drive means 50 of the rotating body 58 based on the results detected by the ultrasonic sensor 51 and rotates the threaded rod 57. This adjusts the space between the pair of restricting plates 59 to hold the wafers 22a of the workpiece 22 such that they are prevented from falling.

The support pins 148b of the first transporting apparatus 34 transport the first cassette 26 from the table 25 into the rough washing device 24a, which performs the second step ST2. In a state retained in the first cassette 26, the workpiece 22 is roughly washed by high-pressure heated water injected in the rough washing device 24a.

Afterwards, the support pins 148b of the first transporting apparatus 34 transports the first cassette 26 from the rough washing device 24a to the removing apparatus 27 (also serving as the additional washing device 24b), which performs the third step ST3. In a state retained in the first cassette 26, the workpiece 22 is washed by ultrasonic waves in the additional washing device 24b. The ultrasonic waves also swell or dissolve the adhesive agent 23c applied between the adhering plate 23 and the workpiece 22, or the wafers 22a. This enables the adhering plate 23 to be removed from the wafers 22a. The adhering plate 23, which the workpiece 22 is removed from, is taken out of the first cassette 26.

The support pins 148b of the first transporting apparatus 34 then lift the first cassette 26 out of the additional washing device 24b and horizontally rotate the cassette 26 by 90 degrees. The transporting apparatus 34 subsequently transports the first cassette 26 onto the support platform 85 of the separating/retaining apparatus 28, which performs the fourth step ST4. The second transporting apparatus 35 then transports the support platform 85 in a rightward direction, as viewed in FIG. 3, while pivoting the platform 85 vertically about the pivot shaft 175 by 90 degrees. This enables the wafers 22a to be transferred from the first cassette 26 onto the support arms 90. The second transporting apparatus 35 then transports the support platform 85 together with the empty first cassette 27 in a leftward direction, as viewed in FIG. 3, to its original position. The empty cassette 26 on the support platform 85 is then transported onto the table 25 by the first transporting apparatus 34.

The supplying mechanism 157 receives empty second cassettes 29 from the conveyor 155. Each second cassette 29 is transferred onto the cassette support platform 96 of the separating/retaining apparatus 28 by the third transporting apparatus 38. The uppermost wafer 22a is separated one at a time from the stacked wafers 22a on the support arms 90 by the water injected from the first and second nozzles 98, 99 and the rotation of the separating rollers 109. The separated wafer 22a is retained in the second cassette 29.

After retaining the predetermined number of wafers 22a in the second cassette 29, the cassette 29 is lifted by the cassette supporting mechanism 92 and pivoted 90 degrees about the pivot shaft 96a by the cylinder 97 so that it faces upward. The second cassette 29 is gripped by the support rods 164 of the third transporting apparatus 38 to transport the cassette 29 into the first washing device 30a, which performs the fifth step ST5, and subsequently into the second washing device 30b, which performs the sixth step ST6. The wafers 22a, which are accommodated in the second cassette 29, are finely washed by ultrasonic waves in each washing device 30a, 30b.

The second cassette 29 is then transported out of the second washing device 30b and into the third washing device 30c, which performs the seventh step ST7, by the third transporting apparatus 38. Accommodated in the second cassette 29, the wafers 22a are rinsed by ultrasonic waves in the third washing apparatus 30c.

After washing is completed, the second cassette 29 is slowly lifted out of the third washing device 30c and into the drying apparatus 31, which performs the eighth step ST8. The wafers 22a and the second cassette 29 are dried in the drying apparatus 31. After the drying is completed, the second cassette 29 and the wafers 22a accommodated therein are conveyed out of the drying apparatus 31 by the conveyor and transferred to the unloading apparatus 39.

The effects of the first embodiment will now be described.

(1) Each wafer 22a is separately accommodated in the second cassette 29 to facilitate processing of the wafers 22a in the steps subsequent to the eighth step ST8. However, the wafers 22a are washed in the first, second, and third steps ST1, ST2, ST3 before being retained in the second cassette 29. In other words, the wafers 22a are washed before being accommodated within the second cassette 29. This ensures thorough washing of the wafers 22a within a short period of time. In addition, this prevents the cutting chips and abrasive grains adhered to the surface of the wafers 22a from adhering to the second cassette 29. Furthermore, during the step in which the wafers 22a are retained in the second cassette 29, the wafers 22a are not damaged by the cutting chips and abrasive grains.

(2) The wafers 22a are washed by the washing apparatus 24 before being retained in the second cassette 29. The washing apparatus 24 includes the rough washing device 24a and the additional washing device 24b. After injecting heated water against the wafers 22a in the rough washing device 24a for rough washing of the wafers 22a, the wafers 22a are further washed by ultrasonic waves in the additional washing device 24b. Accordingly, the wafers 22a are effectively washed by executing the rough washing and the additional washing separately.

(3) The additional washing device 24b is also used as the removing apparatus 27. During the additional washing using ultrasonic waves, the ultrasonic waves swell or dissolve the adhesive agent applied between the adhering plate 23 and the wafers 22a. This ensures removal of the wafers 22a from the adhering plate 23 within a short period of time.

(4) The wafers 22a are dipped into the washing liquid in the prewashing apparatus 21 and prewashed by small air bubbles before being washed by the washing apparatus 24. The prewashing enables removal of a large percentage of the cutting chips and abrasive grains adhered to the surface of the wafers 22a before performing washing with the washing apparatus 24. This enables effective washing of the wafers 22a by the washing apparatus 24 within a short period of time.

(5) The adhesive force of the cutting chips and abrasive grains adhered to the surface of the wafers 22a become stronger as they dry. To prevent drying, the cut workpieces 22 loaded by the loading apparatus 33 are dipped into the washing liquid in the prewashing apparatus 21 and stored therein in a wet state until they are processed in the next step. By storing the wafers 22a in a wet state, the subsequent washing of the wafers 22a performed by the washing apparatus 24 becomes further efficient.

(6) Before retaining the wafers 22a in the second cassettes 29, the wafers 22a are transported in the first cassette 29 during the first, second, and third steps ST1, ST2, ST3. This prevents the wafers 22a from being damaged when being moved and facilitates transportation of the wafers 22a.

(7) The restricting plates 59 restricts the wafers 22a in a manner that they do not fall in the first cassette 26. This prevents the wafers 22a from being damaged. Furthermore, the plates 59 facilitates handling of the wafers 22a when they are separated one at a time from the other wafers 22a.

(8) The axial length of the workpiece 22 retained in the first cassette 26 is measured in correspondence with the distance detected by the ultrasonic sensor 51. The distance between the restricting plates 59 are accurately adjusted in accordance with the length of the workpiece 22. Additionally, the measured length of the workpiece 22 may be referred to in the following steps to perform various control steps.

(9) The separating/retaining apparatus 28 utilizes a water stream for separation of each wafer 22a. This prevents the wafers 22a from being damaged during separation of each wafer 22a.

(10) The separating/retaining apparatus 28 utilizes the separating rollers 109 to apply a driving force to the uppermost wafer 22a in its separating direction. This enhances the separation of each wafer 22a.

(11) After each wafer 22a is separated from the other wafers 22a and retained in one of the second cassettes 29 by the separating/retaining apparatus 28, the wafers 22a are washed again by the fine washing apparatus 30. This further ensures removal of the foreign material adhered to the surface of wafers 22a while also allowing removal of the foreign material adhered to the second cassette 29.

(12) The fine washing apparatus 30 includes the first, second, and third washing devices 30a, 30b, 30c. This structure enables fine washing of the wafers 22a to be performed separately. In other words, the wafers 22a are rewashed by ultrasonic washing, which is conducted twice, and a finish ultrasonic washing, which is conducted once. Furthermore, the shaking device vertically moves the wafers 22a in the heated water to enhance the efficiency of the washing.

(13) The wafers 22a are heated by the heated water in the fine washing apparatus 30. In this heated state, the wafers 22a are slowly lifted out of the washing apparatus 30 together with the second cassette 29. As a result, the water on the surface of the wafers 22a are easily removed by the surface tension of the water. This enables the wafers 22a to dry within a short period of time.

(14) After finely washing the wafers 22a with the fine washing apparatus 30 by dipping the wafers 22a into the heated water, the wafers 22a are lifted out of the heated water and dried by the heating apparatus 31. Accordingly, the wafers 22a are entirely and uniformly dried in each second cassette 29. This prevents undesired effects from taking place in the steps subsequent to the eighth step ST8.

A liquid drain port may be provided in the washing tanks of the above processing system. The drain ports may be utilized to maintain the surface of the liquid in the tanks at a predetermined level while also circulating the liquid. This prevents the foreign material removed during the washing from accumulating at the bottom of each tank.

In the prewashing apparatus 21 of the above processing system, the wafers 22a may be washed by jet water streams instead of by blasting air. In this case, the wafers 22a in the prewashing tank 42 are surrounded by a plurality of nozzles that inject a washing liquid toward the wafers 22a. The wafers 22a are positioned above the surface of the washing liquid in the prewashing tank 42. The washing liquid in the tank 42 may be circulated and injected from the nozzles.

Figure 20:
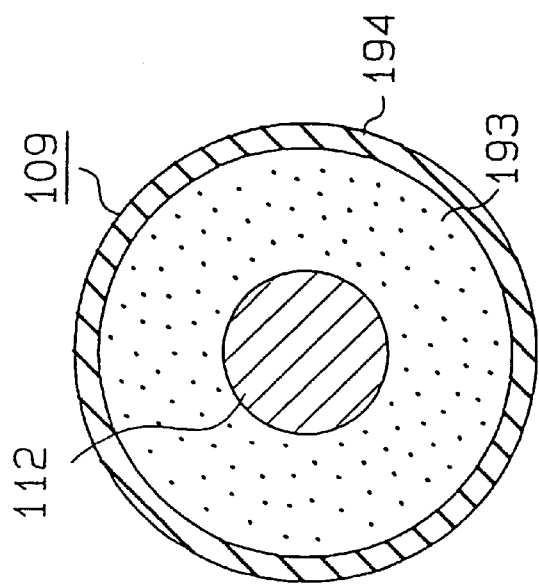
FIG. 20 is an enlarged cross-sectional view showing a separating roller according to a second embodiment of the present invention.

A second embodiment according to the present invention will hereafter be described with reference to FIG. 20.

The separating rollers 109 of the separating/retaining apparatus 28 in the first embodiment is made of a foam rubber or a foam resin. However, as shown in FIG. 20, the separating rollers 109 in the second embodiment have an inner layer 193 and a thin outer layer 194, which is provided around the inner layer 193. The inner layer 193 is made of a foam rubber or a foam resin. The outer layer 194 is made of a solid rubber and has a thickness of, for example, about one to two millimeters. In other words, the separating rollers 109 of the second embodiment have a soft inner layer 193 and a relatively hard outer layer 194. The inner layer 193 may be defined by a chamber having air therein.

The separating rollers 109 of the second embodiment have sufficient elasticity and superior wear resistance. In addition, the change in the friction coefficient of the surface of the rollers 109 that takes place over time is small. If the rollers 109 are made of a foam rubber or a foam resin, the frictional resistance produced between the wafers 22a and the rollers 109 ensures application of a driving force to the wafers 22a. However, as the rollers 109 are used over a number of times, foreign material adheres to the surface of the rollers 109 and gradually decreases the friction coefficient. Furthermore, foam material wears easily.

The rollers 109 of the second embodiment have a surface that is made of solid rubber. In comparison with foam material, solid rubber has superior wear resistance and its friction coefficient remains almost the same over time. Furthermore, the inner layer 193 of the rollers 109 ensures sufficient elasticity. As a result, the separation of the wafers 22a is always carried out in a stable manner. In addition, the rollers 109 need not be replaced frequently. This contributes to an improvement in workability.

A third embodiment according to the present invention will hereafter be described with reference to FIG. 21.

Figure 21:
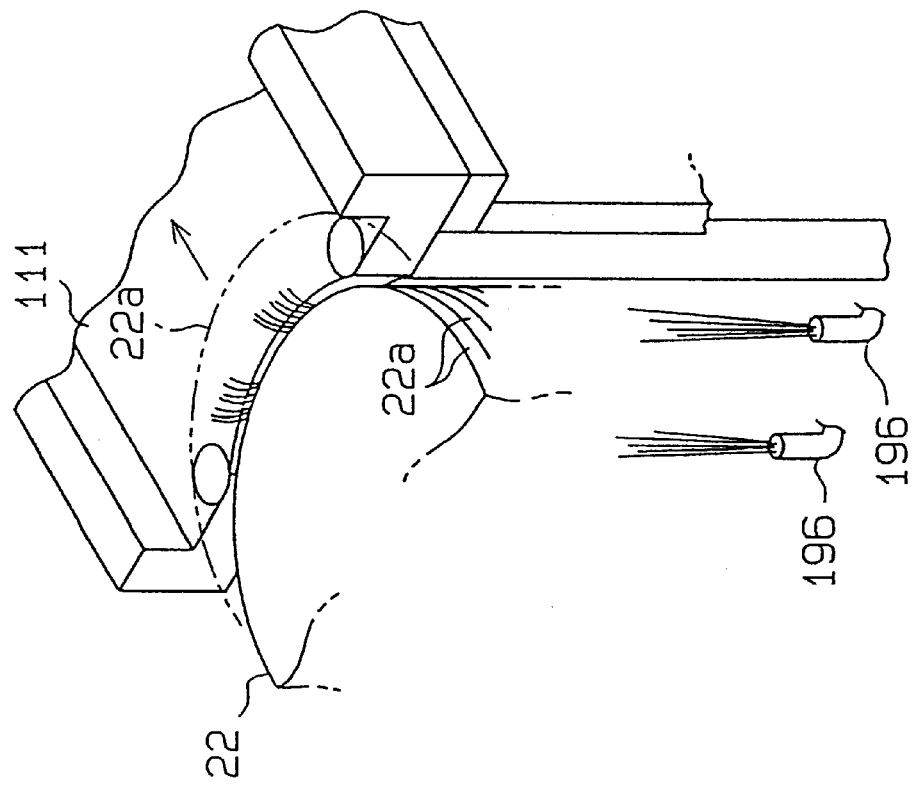
FIG. 21 is a perspective view showing part of a separating/retaining apparatus according to a third embodiment of the present invention.

As shown in FIG. 21, in the third embodiment, two effusion holes 196 are provided in the inner lower section of the chute 111. The water effused from the holes 196 passes through the space between the chute 111 and the stacked wafers 22a to be injected in an upward direction. As shown by the dotted lines of FIG. 21, when the uppermost wafer 22a travels along the upper surface of the chute 111 after being separated from the other wafers 22a, the water injected from between the chute 111 and the stacked wafers 22a lifts the wafer 22a. This decreases the adhering force of the uppermost wafer 22a with respect to the wafer 22a located immediately below the uppermost wafer 22a. As a result, this structure further enhances the separation of the wafers 22a. The injected water flows on the chute 111 along the separating direction of the wafers 22a. The number of holes 196 is not limited to two and may be three or more. There may also be only one hole 196 instead of a plurality of holes 196.

A fourth embodiment according to the present invention will hereafter be described with reference to FIGS. 22 and 23.

Figure 22:
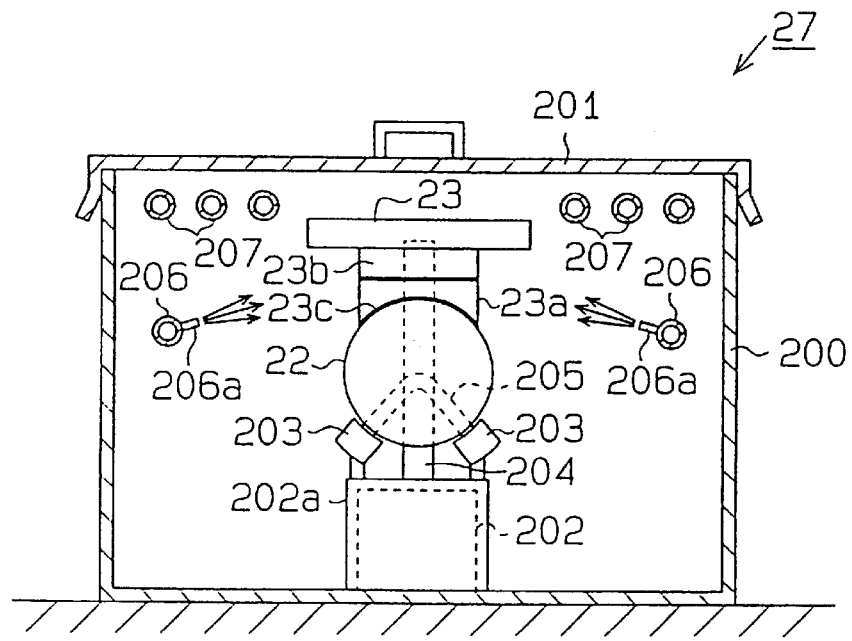
FIG. 22 is a cross-sectional view showing a removing apparatus according to a fourth embodiment of the present invention.
Figure 23:
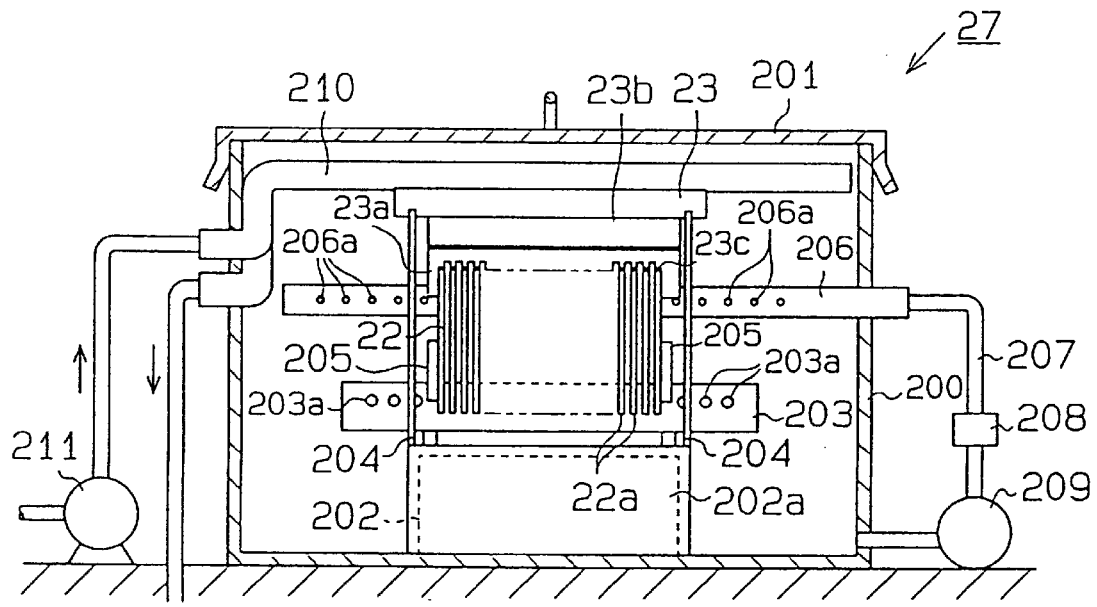
FIG. 23 is a cross-sectional side view showing the removing apparatus of FIG. 22.

As shown in FIGS. 22 and 23, the removing apparatus 27 of the fourth embodiment differs from the preceding embodiments. The removing apparatus 27 of the fourth embodiment is not combined with the additional washing device 24a of the washing apparatus 24. The removing apparatus 27 is provided as a single-purpose apparatus and provided separately from the additional washing device 24a. The separating apparatus 27 blasts steam on the adhesive agent 23a section where the support plate 23 is adhered to the wafers 22a of the workpiece 22. This enables the adhering plate 23 to be removed from the wafers 22a.

A container 200 has an opening defined in its upper section. The container 200 is closed by a removable lid 201. A vibrator 202 is provided on the bottom of the container 200 and covered by a case 202a. A pair of support rods 203 are supported in the container 200 on the upper surface of the case 202a in a manner that the rods 203 are parallel to each other. When the adhering plate 23 is removed from the wafers 22a of the workpiece 22, the wafers 22a are held on the support rods 203. A pair of support plates 204 are erected on the upper surface of the case 202a. When the adhering plate 23 is placed on the support plates 204, the workpiece 22 is positioned between the two support plates 204.

A plurality of engaging holes 203a are formed on each support rod 203. The holes 203a are arranged longitudinally in each rod 203 with predetermined intervals between one another. A pair of restricting members 205 have ends that fit into the holes 203a of the two rods 203. Since there are a plurality of holes 203a, the distance between the two restricting members 205 may be altered by changing the position where the members 205 engage the rod 203. Adjustment of the distance between the two restricting members 205 in accordance with the axial length of the workpiece 22 enables the members 205 to hold the workpiece 22 such that they prevent the wafers 22a from falling.

A pair of pipes 206 extend horizontally and parallel to each other in the container 200. A plurality of nozzles 206a are arranged on each pipe 206. The nozzles 206a are arranged longitudinally on each pipe 206 at predetermined intervals. Steam is blasted from the nozzles 206a toward the section where the adhesive agent 23c is applied between the adhering plate 23 and the wafers 22a of the workpiece 22. Each pipe 206 includes an end that projects from the container 200 and is connected to an outlet of a pipe 207. The pipe 207 has an inlet that is connected to the bottom section of the container 200. A steam generator 208 and a pump 209 are provided mid-way along the pipe 207. The pump 209 supplies the water collected in the bottom of the container 200 to the steam generator 208 through the pipe 207.

A cooling pipe 210 is arranged at the upper section of the container 200. The inlet of the pipe 210 is connected to a pump 211 provided outside of the container 200. The pump 211 is connected to a water source (not shown). The outlet of the pipe 210 is connected to a drainage (not shown) provided outside of the container 200. The water flowing through the pipe 210 cools and condenses the steam in the container 200.

The operation of the removing apparatus 27 in the fourth embodiment will now be described.

The lid 201 is removed from the container 200 to place the adhering plate 23 holding the workpiece 22 onto the support plates 204. The position of the restricting members 205 on the support rods 205 are adjusted in accordance with the axial length of the workpiece 22. When the adhering plate 23 is placed on the support plates 204, the workpiece 22 is positioned slightly above (about one millimeter) the support rods 203.

After the container 200 is closed by the lid 201, the pump 211 is operated to draw water into the cooling pipe 210 from the water source. The steam generator 208 and the pump 209 are simultaneously operated to send steam to the pipe 206 and blast the steam from the nozzles 206a toward the adhesive agent 23c applied between the adhering plate 23 and the wafers 22a of the workpiece 22. The preferable temperature range of the blasted steam is between 100 to 200 degrees Celsius. The penetrating nature of the steam is superior when compared to liquid. Thus, the blasted steam easily enters into the space between adjacent wafers 22a and permeates the adhesive agent 23c applied between the adhering plate 23 and the wafers 22a. Accordingly, the adhesive agent 23c is softened within a short period of time. This results in a decrease in the adhering strength of the adhesive agent 23c and enables the wafers 22a to be removed from the adhering plate 23. After the wafers 22a are removed from the adhering plate 23, the wafers 22a are supported by the support rods 203. In this state, the restricting members 205 hold the wafers 22a and prevents them from falling.

The steam blasted toward the adhesive agent 23c is cooled and condensed into water drops by the cooling pipe 210. The water drops fall and collect at the bottom of the container 200. The water collected at the bottom of the container 200 is sent to the steam generator 208 through the pipe 207 and vaporized into steam to be blasted from the nozzles 206a again.

The vibrator 202 is operated together with the steam generator 208. The vibrator 202 vibrates the adhering plate 23 and the wafers 22a through the support plates 204. The vibration enhances the removal of the adhering plate 23 from the wafers 22a. Recesses are provided in the adhering plate 23 so that the upper end of each support plate 204 may be fitted therein. This prevents the adhering plate 23 from falling off the vibrated support plates 204.

After all of the wafers 22a are removed from the adhering plate 23, the lid 201 is removed from the container 200 and the adhering plate 23 on the support plates 204 is taken out of the container 200. All of the wafers 22a held on the support rods 203 are then taken out of the container 200.

The carbon layer 23a of the adhering plate 23 is adhered to the insulating layer 23b by an adhesive agent. The adhering plate 23 is heated after being taken out of the container 200 to dissolve the adhesive agent. The heating of the adhering plate 23 enables the carbon layer 23a to be removed from the insulating layer 23b. The insulating layer 23b may be recycled by adhering a new carbon layer 23a to the insulating layer 23b.

The effects described below are obtained from the above fourth embodiment.

(1) Steam, which is more effective than liquid, is blasted toward the adhesive agent 23c between the adhering plate 23 and the wafers 22a. Thus, the blasted steam easily enters into the space between adjacent wafers 22a and softens the adhesive agent 23c within a short period of time. Accordingly, the wafers 22a are securely removed from the adhering plate 23 within a short period of time.

(2) After the wafers 22a are removed from the adhering plate 23, the restricting members 205 restrict the wafers 22a from falling. This prevents the wafers 22a from being damaged. Furthermore, after the wafers 22a are removed from the adhering plate 23, the wafers 22a may easily be taken out of the container 200 within a short period of time.

(3) The removal of the wafers 22a from the adhering plate 23 is enhanced by vibrating the adhering plate 23 and the wafers 22a with the vibrator 202. In addition, the vibration breaks wafers 22a having cracks. This facilitates detection of defective wafers 22a.

(4) After being blasted, the steam is cooled and liquefied by the cooling pipe 210. The collected water is sent to the steam generator 208 again. This enables recycling of the water used to produce steam.

To install the removing apparatus 27 shown in FIGS. 22 and 23 in the processing system of the first embodiment, the support rods 203 and the support plates 204 are removed from the case 202a. The removing apparatus 27 is positioned between the additional washing device 24b and the separating/retaining apparatus 28. The first cassette 26, which is lifted out of the additional washing device 24b by the first transporting apparatus 34, is placed on the case 202a in the container 200. In this state, the wafers 22a are removed from the adhering plate 23 in the manner described above. After the removal is completed, the first cassette 26 is lifted out of the container 200 and transferred onto the support platform 85 of the separating/retaining apparatus 28.

The time required to soften the adhering agent 23c may be further shortened by blasting steam mixed with an organic solvent to obtain a predetermined concentration. If an epoxy adhesive agent is used as the adhesive agent 23c, it is preferable that methylchloroform, serving as the organic solvent, be mixed with the steam at a concentration of five percent. It has been confirmed that the length of time required to remove the wafers 22a from the adhering plate 23 when mixing the organic solvent is shortened to about five minutes.

If an epoxy adhesive agent is used as the adhesive agent 23c, it is preferable that the temperature of the steam blasted from the nozzles 206a be within the range of 100 to 150 degrees Celsius and the blasting pressure of the steam be within the range of one to three $kg/cm^2$. It has been confirmed that the length of time required to remove the wafers 22a from the adhering plate 23 when blasting the steam under these conditions is shortened to about five minutes.

It is preferable that the vibrator 202 produce vibration having a frequency of 20 to 30 hertz and an amplitude of two to three millimeters. It has been confirmed that the time required to remove the wafers 22a from the adhering plate 23 when producing vibrations under these conditions is shortened to about one to two minutes. In addition, no damages were inflicted on the wafers 22a under these conditions.

As long as the container 200 is saturated with steam, it is not required that the steam be blasted toward the adhesive agent 23c. The superior penetrating ability of the steam enables the wafers 22a to be removed from the adhering plate 23 within a short period of time even when the steam is not blasted toward the adhesive agent 23c.

A fifth embodiment of the present invention will hereafter be described with reference to FIG. 24.

Figure 24:
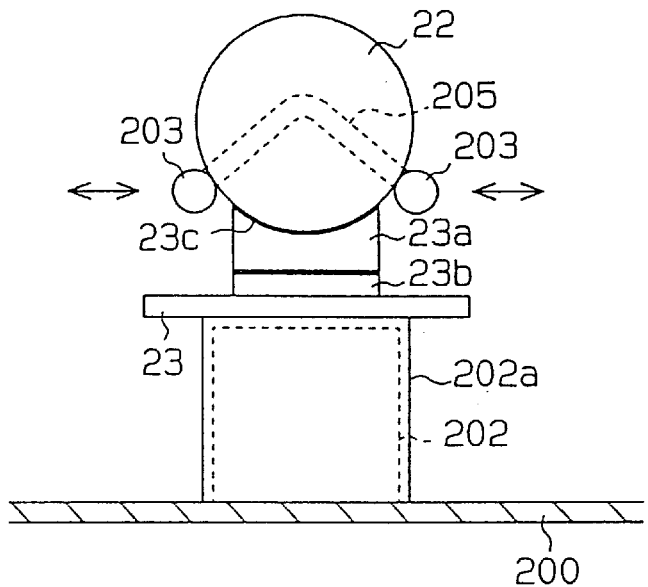
FIG. 24 is a schematic cross-sectional partial view showing part of a removing apparatus according to a fifth embodiment of the present invention.

As shown in FIG. 24, the fifth embodiment is a modification of the fourth embodiment. In the fifth embodiment, the workpiece 22 is arranged in the container 200 with the adhering plate 23 positioned under the workpiece 22. The adhering plate 23 is placed on the upper surface of the case 202a for the vibrator 202. Each support rod 203 moves horizontally. The support rods 203 are moved away from each other to avoid interference with the adhering plate 23 when placing the plate 23 on the case 202a.

A sixth embodiment according to the present invention will hereafter be described with reference to FIG. 25.

Figure 25:
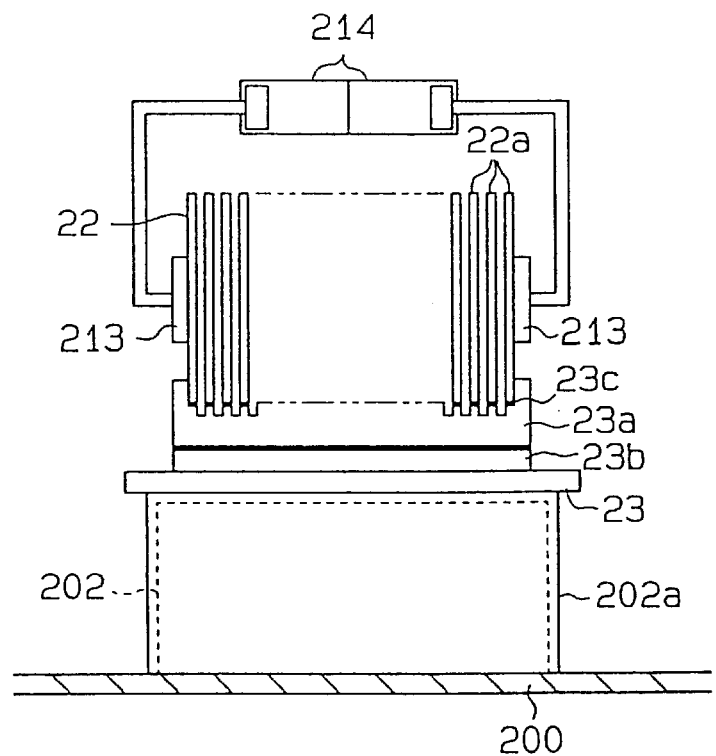
FIG. 25 is a schematic cross-sectional side view showing part of a removing apparatus according to a sixth embodiment of the present invention.

As shown in FIG. 25, the sixth embodiment is a modification of the fifth embodiment. In the sixth embodiment, a pair of holding plates 213 and a cylinder 214 for each plate 213 are provided such that they are moved between the outside and the inside of the container 200. The cylinders 214 move the holding plates 213 toward and away from each other. The cylinders 214 are actuated to hold the wafers 22a removed from the adhering plate 23. In this state, the wafers 22a are automatically taken out of the container 200.

A seventh embodiment of the present invention will hereafter be described with reference to FIGS. 26 to 30.

The seventh embodiment includes an apparatus that detects broken wafers 22a among the wafers 22a removed from the adhering plate 23. Since the wafers 22a are extremely thin and break easily, there is a possibility of the wafers 22a breaking during the washing step or other steps. Therefore, it is required that each wafer 22a be inspected for cracks and that cracked wafers 22a be removed from the other wafers 22a.

Generally, the operator views each wafer 22a to perform the inspecting and removing steps. However, it is burdensome for the operator to view each wafer 22a since the wafers 22a are mass produced in large numbers. In addition, there is a possibility of the operator failing to notice cracked wafers 22a.

Figure 26:
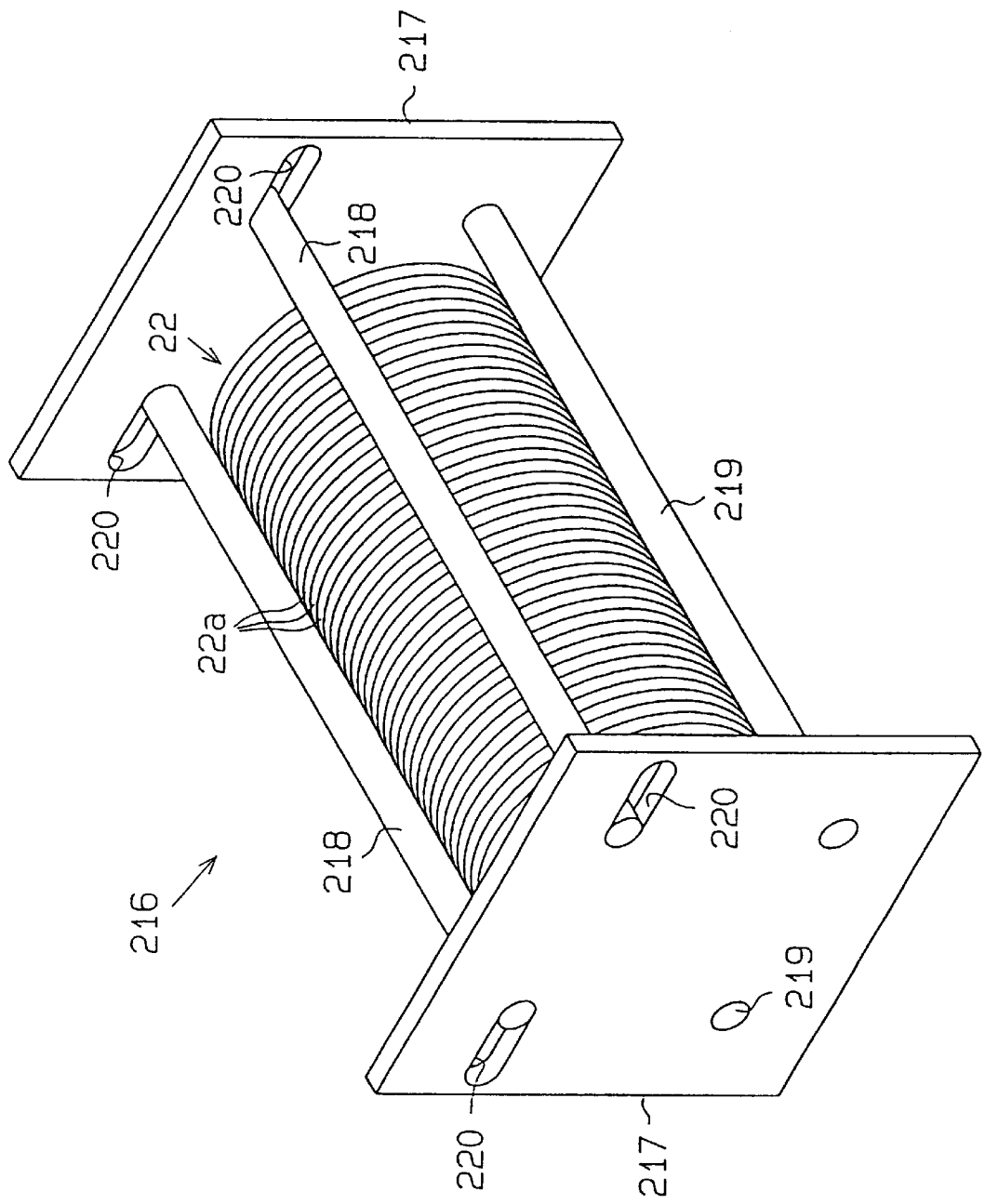
FIG. 26 is a perspective view showing a retainer of a detecting apparatus according to a seventh embodiment of the present invention.
Figure 27:
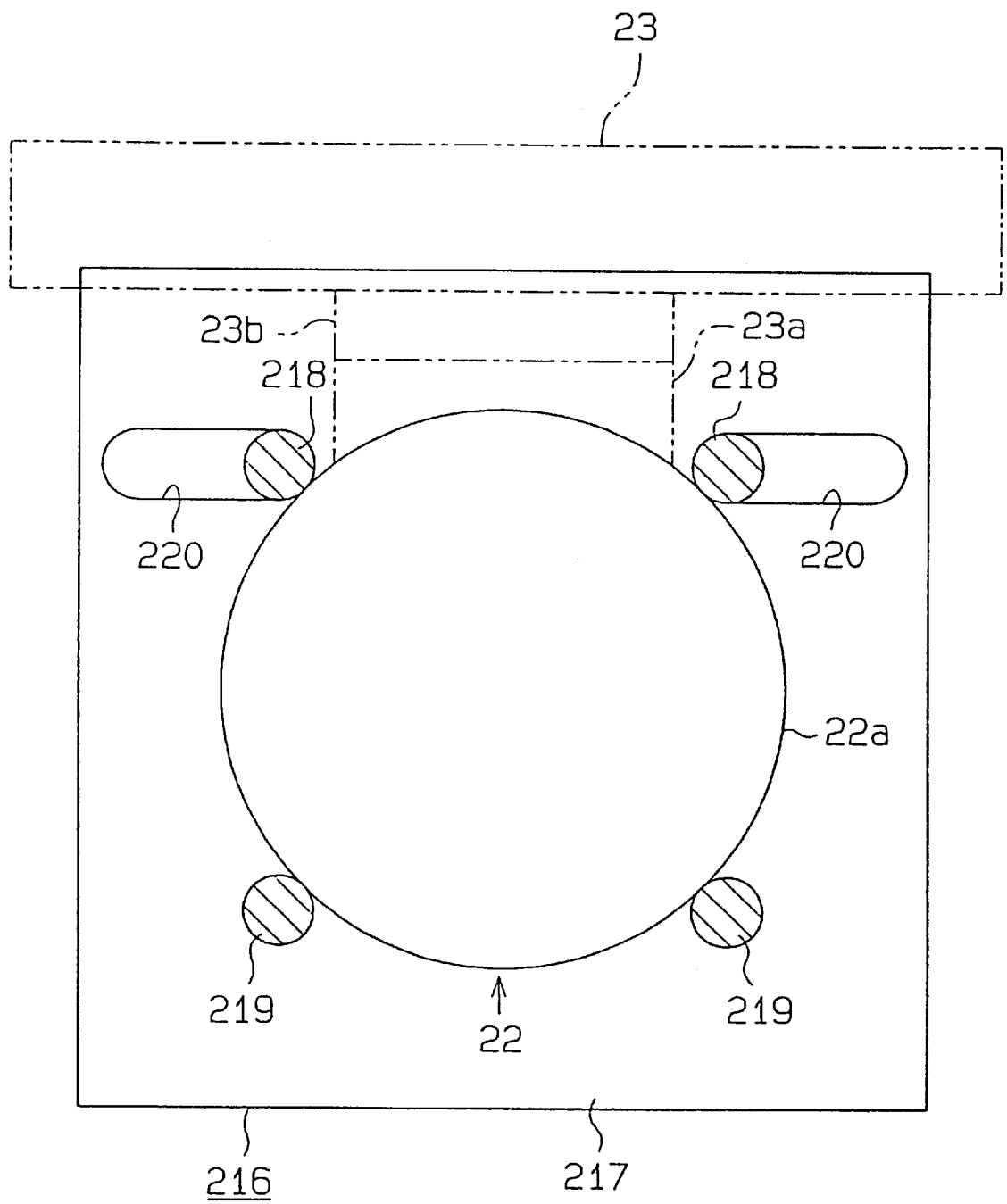
FIG. 27 is a cross-sectional front view showing the retainer.

Accordingly, in the seventh embodiment, the wafers 22a are retained in a retainer 216 as shown in FIGS. 26 and 27. The retainer 216 corresponds to the first cassette 26 in the first embodiment and includes a pair of plates 217 and four cylindrical bars 218, 219, which extend between the plates 217. The bars on the upper side, or the first support bars 218 are supported in a manner that they are movable within long holes 220, which are defined in the plates 217. The bars on the lower side, or the second support bars 219 are fixed to the plates 217. A piston rod of a cylinder (not shown) is connected to each first support bar 218 to move the bar 218 in the associated long hole 220. This enables the distance between the two first support bars 218 to be altered.

The workpiece 22 and the adhering plate 23 adhered thereon is placed on the second support bars 219 with the first support bars 218 moved away from each other. The support bars 218 are then moved toward each other. Thus, the four support bars 218, 219 come into contact with the peripheral surface of the workpiece 22 and hold the workpiece 22 therebetween. Afterwards, the retainer 216 is transferred to the removing apparatus 27 of either the first embodiment or the fourth embodiment to remove the wafers 22a of the workpiece 22 from the adhering plate 23.

Figure 28:
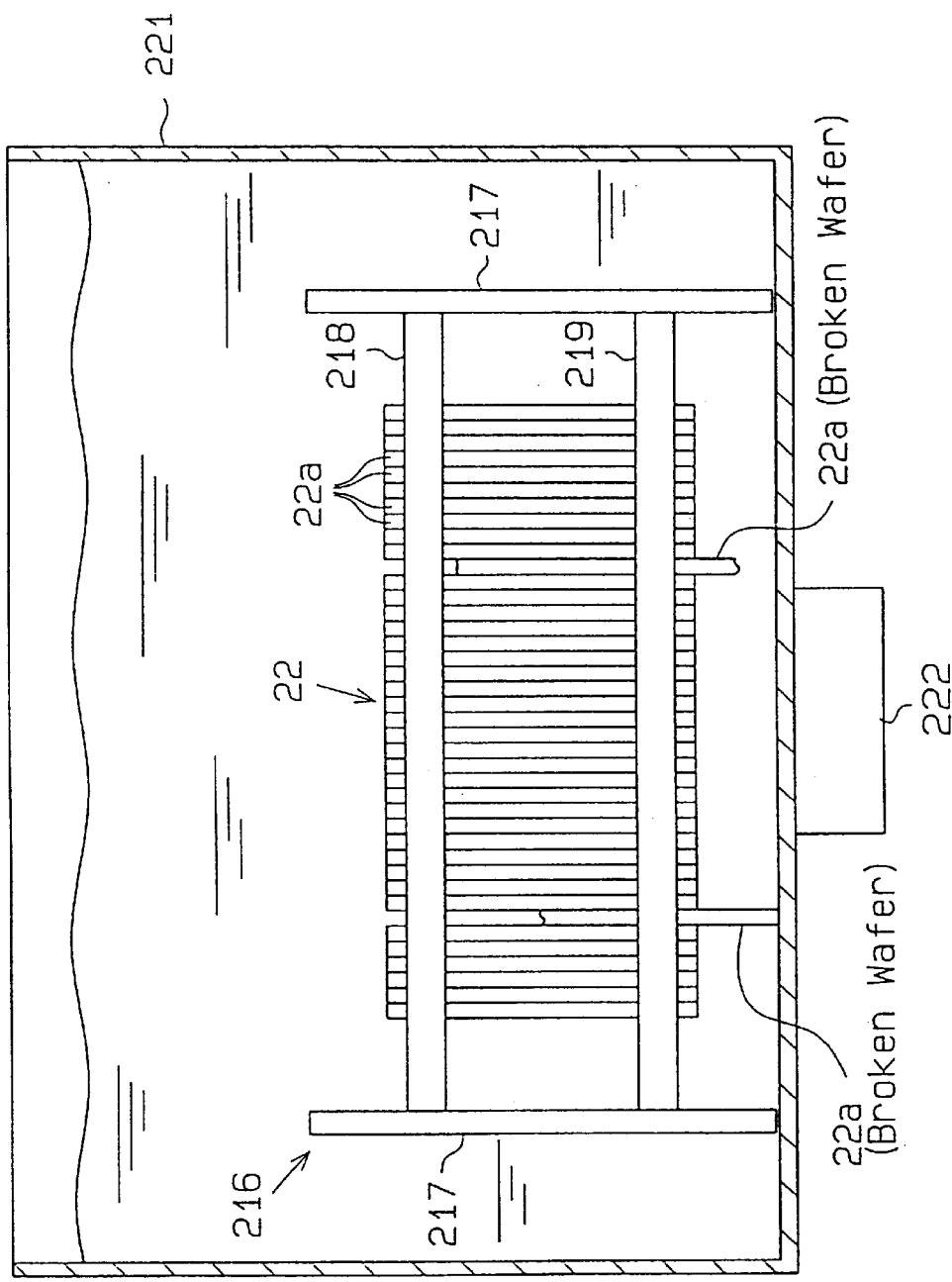
FIG. 28 is a cross-sectional side view showing the detecting apparatus.
Figure 29:
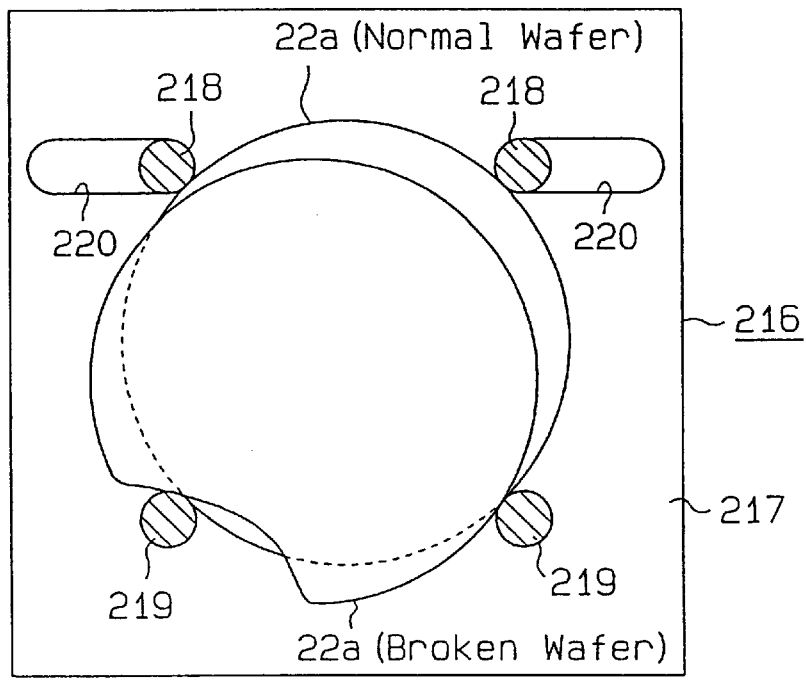
FIG. 29 is a cross-sectional front view showing the operation of the detecting apparatus.
Figure 30:
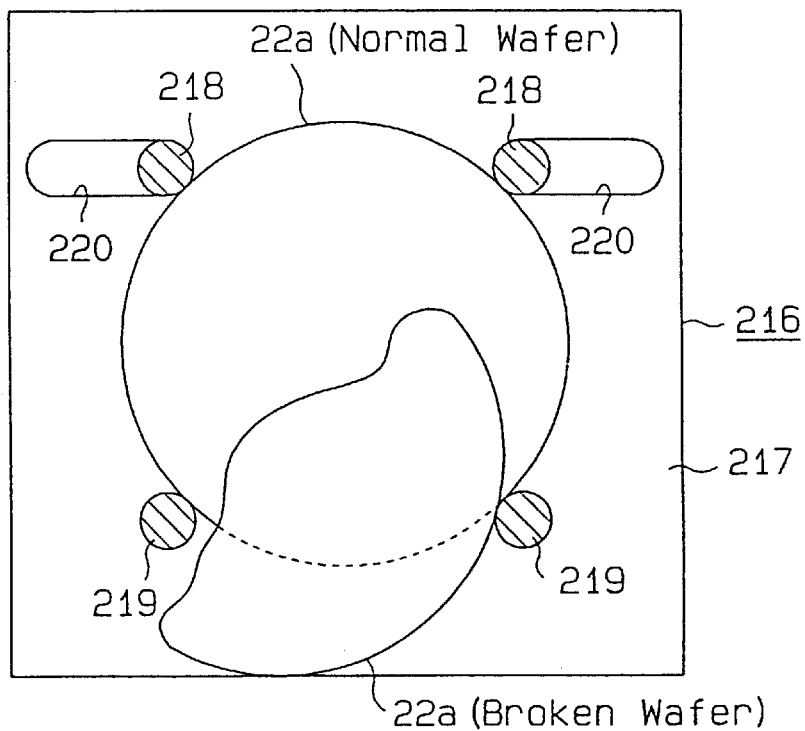
FIG. 30 is a cross-sectional front view showing the operation of the detecting apparatus.

As shown in FIG. 28, a liquid, such as water, is contained in a tank 221. An ultrasonic wave generator 222 is attached to the bottom of the tank 221. The retainer 216 is dipped into liquid in the tank 221 with the wafers 22a removed from the adhering plate 23. In this state, the ultrasonic wave generator 222 is actuated to produce a stream in the liquid contained in the tank 221 with the generated ultrasonic waves. The stream in the liquid rotates and shakes the wafers 22a held between the support bars 218, 219. As shown in FIGS. 28 to 30, the rotating and shaking of the wafers 22a causes broken wafers 22a to either be displaced within the support bars 218, 219 or be moved out from between the support bars 218, 219.

The advantages described below are obtained through the seventh embodiment.

(1) Only the broken wafers 22a become displaced from their original position between the support bars 218, 219. This enables the operator to confirm all broken wafers 22a with a single glance. Thus, the operator is not required to view each and every wafer 22a. This dramatically reduces the burden on the operator when inspecting the wafers 22a. In addition, the time required for inspection is greatly reduced. This contributes to a decrease in manufacturing costs.

(2) Since broken wafers 22a are automatically sorted out, the operator does not fail to notice the broken wafers 22a.

(3) Broken wafers 22a may be confirmed employing a simple apparatus. Thus, employment of a more complicated apparatus becomes unnecessary.

The advantages obtained in the seventh embodiment through the defective wafer detecting apparatus may also be obtained through the additional washing device 24b (which also serves as the removing apparatus 27) of the first embodiment. In other words, in the additional washing device 24b combined with the removing apparatus 27, the ultrasonic oscillator 78 generates ultrasonic waves that produce a stream in the washing liquid of the second washing tank 71. The stream in the liquid rotates and shakes the wafers 22a on the holding rods 55 in the first cassette 26. The rotation and shaking of the wafers 22a causes broken wafers 22a to be displaced from their original position on the holding rods 55. Accordingly, the advantages obtained in the seventh embodiment may also obtained in the first embodiment.

The detecting apparatus of the seventh embodiment may be installed in the processing system of the first embodiment separately from the additional washing device 24b. In this case, the tank 221 of the detecting apparatus is arranged between the additional washing device 24b and the separating/retaining apparatus 28. The first cassette 26 is lifted out of the additional washing device 24b by the first transporting apparatus 34 and dipped into the liquid in the tank 221. In this state, the ultrasonic wave generator 222 is actuated to displace broken wafers 22a from their original position on the holding rods 55 in the first cassette 26. The first cassette 26 is transferred out of the tank 221 and onto the support platform 85 of the separating/retaining apparatus 28 by the first transporting apparatus 34. Therefore, when the first transporting apparatus 34 lifts the first cassette 26 out of the tank 221, the operator may easily and accurately confirm broken wafers 22a. Thus, this ensures the removal of broken wafers 22a.

The ultrasonic wave generator 222 may be provided inside the tank 221. A vibrator that generates vibrations using a motor as a drive source may be used instead of the ultrasonic wave generator 222 as a means to produce a stream in the liquid contained in the tank 221. The entire tank 221 may be shaken to produce a stream in the liquid of the tank 221. As another choice, air or liquid discharged from a pump may be used to produce a stream. A stream may also be produced by forming bubbles in the liquid.

It is not required to provide four support bars 218, 219 as long as there are two or more.

In the retainer 216, a luminescent device may be attached to the bottom section of one of the plates 217 with a light-sensing device attached to the bottom section of the other plate 217. Light is emitted by the luminescent device and oriented toward the light-sensing device. When a broken wafer 22a is displaced from its original position between the support bars 218, 219, the broken wafer 22a blocks the light emitted toward the light-sensing device from the luminescent device. This structure enables accurate confirmation of broken wafers 22a based on whether the light is detected by the light-sensing device. Furthermore, broken wafers 22a may be detected from a position separated from the tank 221.

Figure 31:
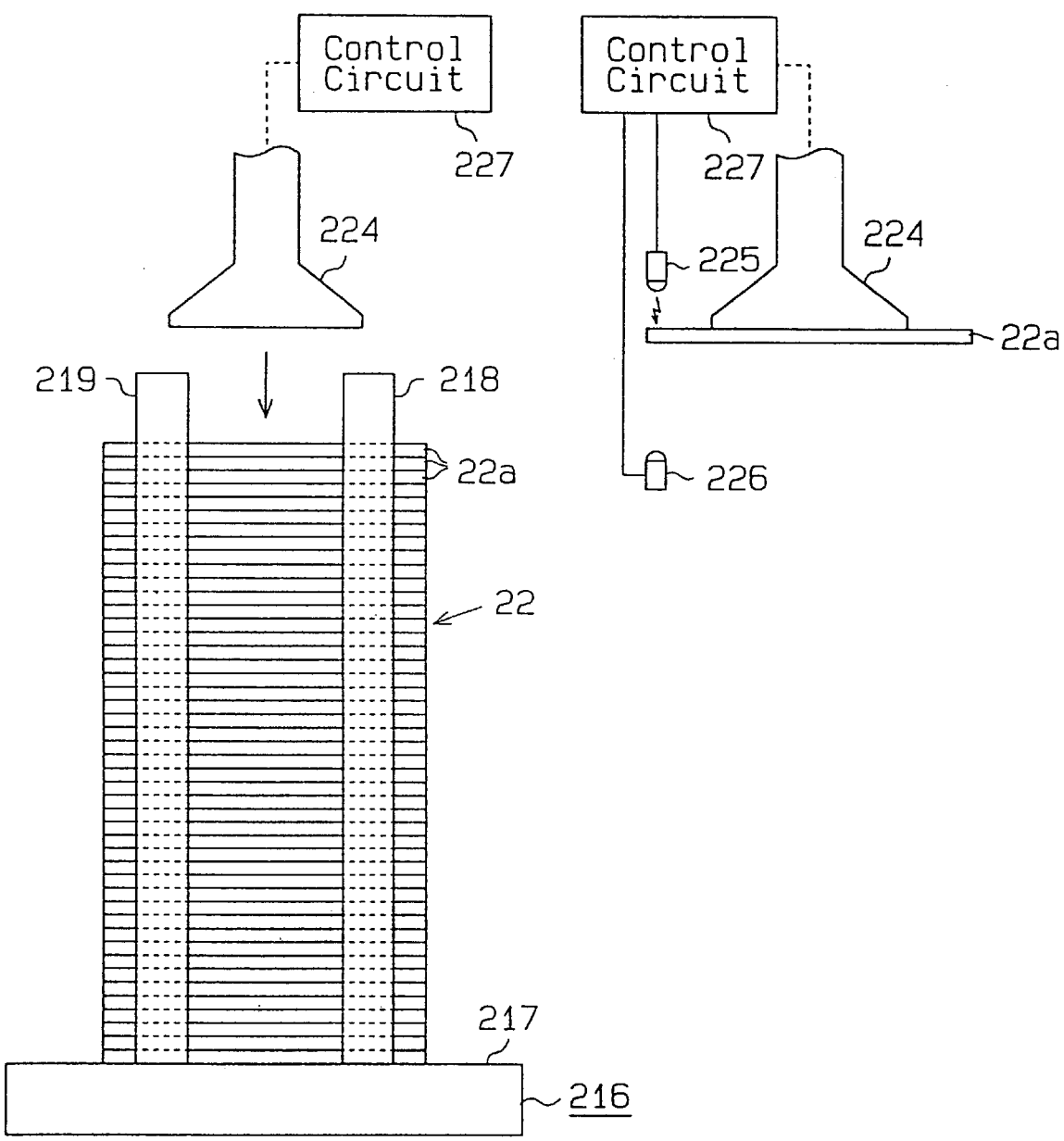
FIG. 31(a) is a schematic front view of a detecting apparatus according to an eighth embodiment of the present invention.
FIG. 31(b) is a schematic front view showing the detection of broken wafers by the detecting apparatus.

An eighth embodiment according to the present invention will hereafter be described with reference to FIG. 31.

The eighth embodiment includes a different defective wafer detecting apparatus. Like the seventh embodiment, the workpiece 22 is separated from the adhering plate 23 with the workpiece 22 retained in the retainer 216. As shown in FIG. 31(a), the retainer 216 is used in an erected state with one of the plates 217 removed and the other plate 217 arranged at the bottom of the device 216. This structure enables a plurality of stacked wafers 22a to be supported between the four support bars 218, 219.

A movable suction body 224 then draws the uppermost wafer 22a and lifts the wafer 22a to separate it from the other wafers 22a. The separated wafer 22a is then transferred to a predetermined inspection position. As shown in FIG. 31(b), the peripheral shape of the separated wafer 22a is detected by an optical sensor consisting of a luminescent device 225 and a light-sensing device 226. A control circuit 227 controls the actuation of the luminescent device 225 and judges whether the peripheral shape of the wafer 22a is normal based on the signals from the light-sensing device 226.

If the control circuit 227 judges that the peripheral shape of the wafer 22a is abnormal indicating that the wafer 22a is broken, the suction body 224 transports the wafer 22a to a predetermined disposing position. If the control circuit 227 judges that the peripheral shape of the wafer 22a is normal indicating that the wafer 22a is not broken, the suction body 224 transports the wafer 22a to a storing position.

A cassette which stores each wafer 22a separately, such as the second cassette 29 of the first embodiment, may be arranged at the storing position. By storing the non-defective wafers 22a into the second cassette 29 with the suction body 224, the defective wafer detecting process and the wafer separating process (which corresponds to the fourth step ST4 in the first embodiment) may be executed successively and automatically. By incorporating the structure of this embodiment into the first embodiment, it becomes unnecessary to include the separating/retaining apparatus 28, which performs the fourth step ST4, in the processing system.

A ninth embodiment according to present invention will hereafter be described with reference to FIGS. 32 to 39.

Figure 32:
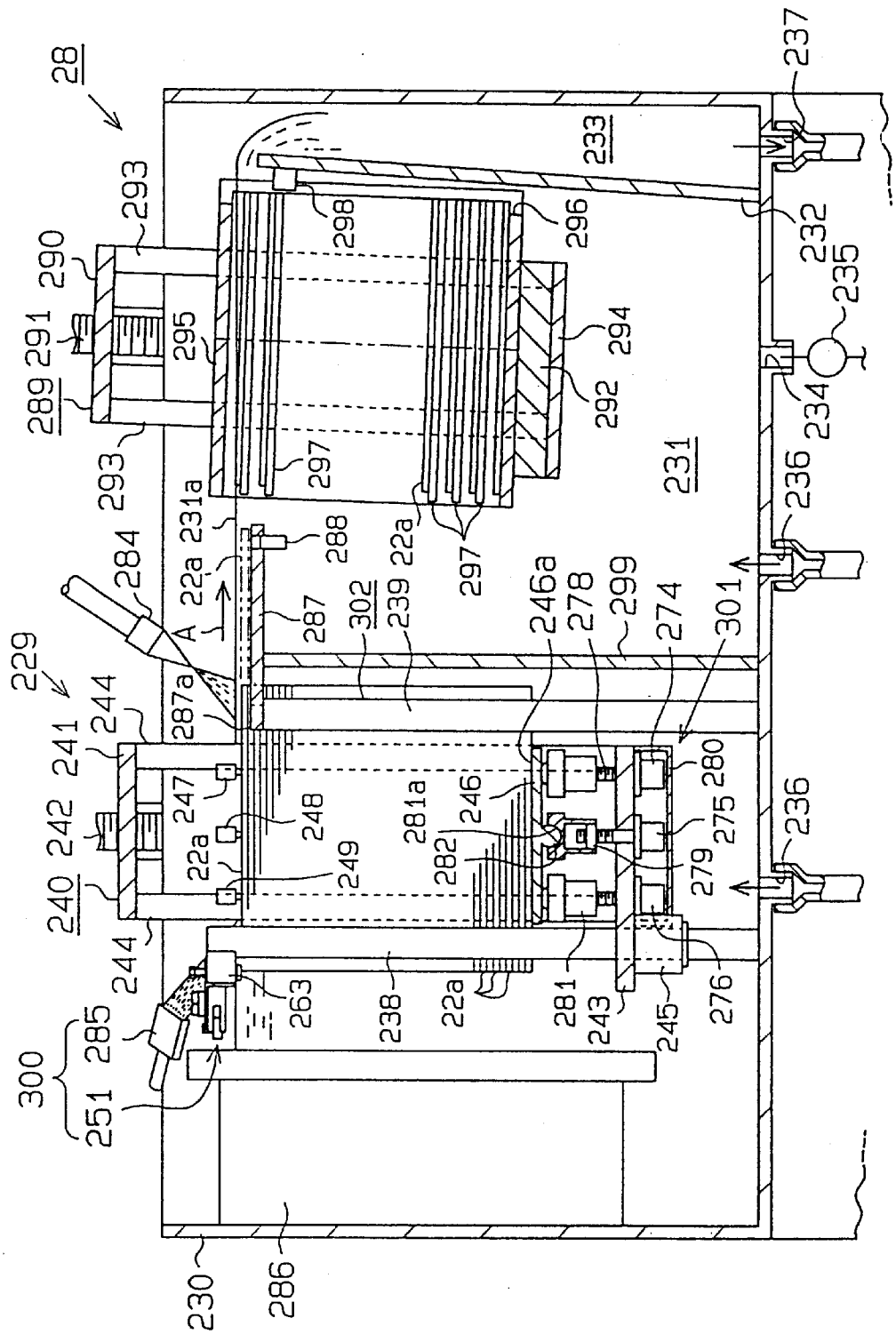
FIG. 32 is a cross-sectional front view of a separating/retaining apparatus according to a ninth embodiment of the present invention.
Figure 33:
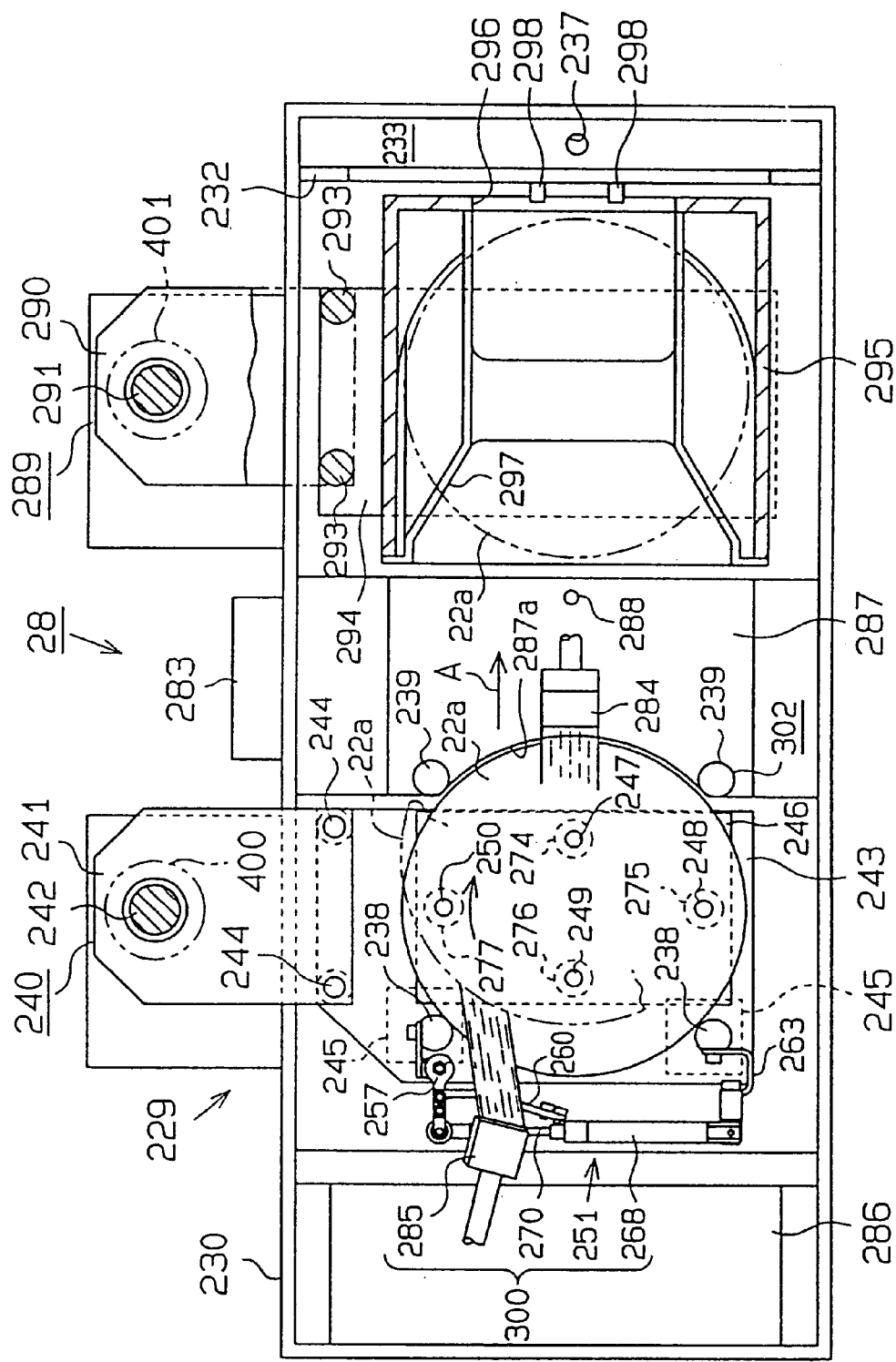
FIG. 33 is a cross-sectional top view showing the separating/retaining apparatus.
Figure 34:
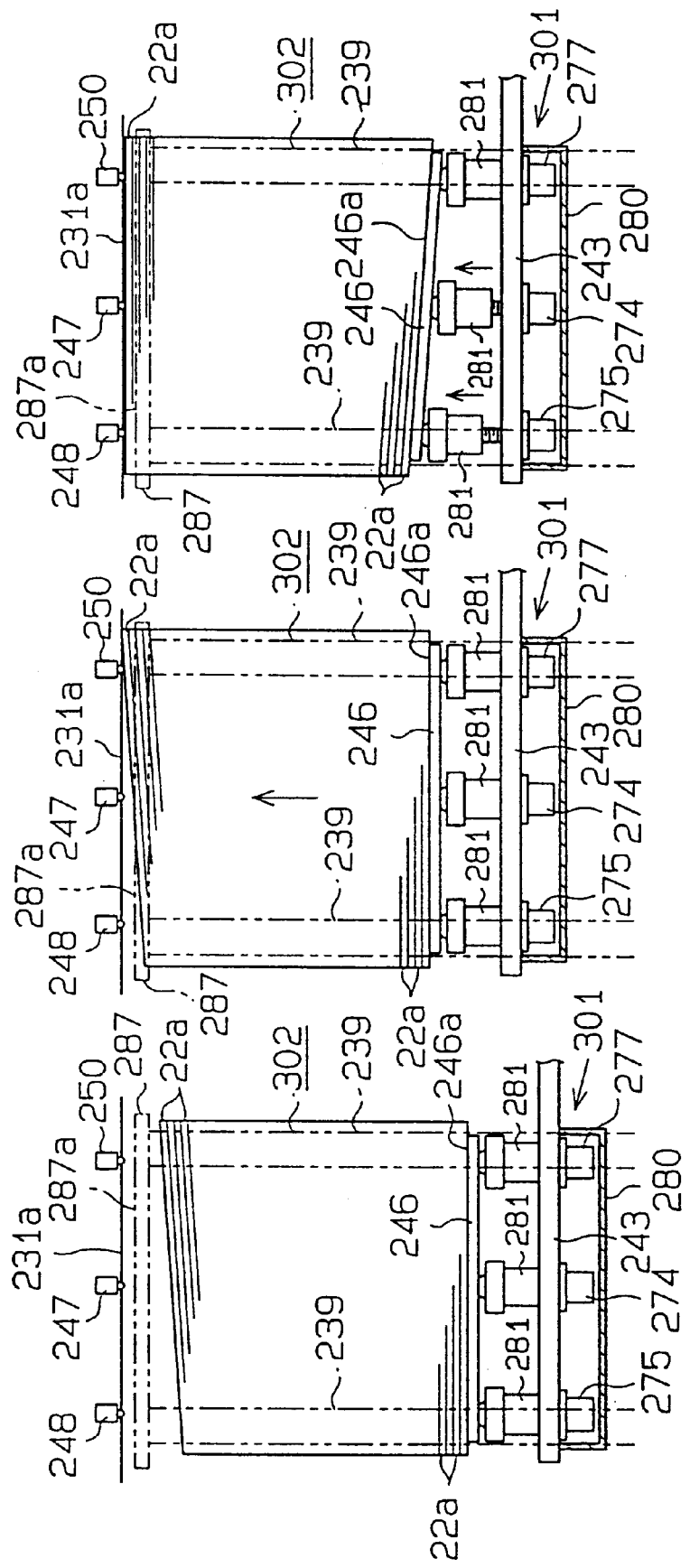
FIGS. 34(a), (b), (c) are explanatory drawings showing movements of the wafers when adjusting their inclination.

The ninth embodiment includes a different separating/retaining apparatus 28. As shown in FIGS. 32 and 33, clean water 231 is contained in a box-shaped tank 230 which has an opened top. A partition 232 is arranged in the tank 230 near one of the side walls to define an overflow compartment 233. Water overflows from the top of the partition 232 and collects in the overflow compartment 233. As a result, the water surface 231a in the tank 230 is maintained at a constant level.

A plurality of supplying ports 236 are provided in the bottom of the tank 230. The water 231 is supplied into the tank 230 through the ports 236. A discharge port 237 is provided at the bottom of the overflow compartment 233 to discharge the water 231 out of the compartment 233. A drain hole 234 and a drain valve 235 are provided at the bottom of the tank 230.

A pair of guide rods 238 and a pair of guide rods 239 (four rods in total) are erected in the tank 230 with a predetermined interval between one another. The pair of rods 239 at the rear side (right side as viewed in FIG. 32) is shorter than the pair of rods 238 at the front side (left side as viewed in FIG. 32). The top end of the rods 239 are located slightly below the water surface 231a.

A first lifting device 240 is provided outside the tank 230 at a position corresponding to the rods 238, 239. The lifting device 240 includes a lifting plate 241, a ball screw 242, and a servomotor 400 to rotate the ball screw 242. An attachment plate 243 is held suspended in the water 231 below the lifting plate 241 by a pair of support rods 244. Bearings 245 enable the attachment plate 243 to move along the front rods 238.

First, second, third, and fourth motors 274, 275, 276, 277 are fixed to the bottom surface of the attachment plate 243. Each motor 274, 275, 276, 277 includes a drive shaft, or ball screw 278, and a threaded nut 279 engaged with the screw 278. The motors 274, 275, 276, 277 are arranged inside a waterproof cover. A lifting body 281 is fixed to each nut 279. A semispherical recess functioning as a bearing 281a is defined in the upper surface of each lifting body 281. Spheric bodies 282 are provided on the lower surface of a support table 246. Each spheric body 282 corresponds to one of the four bearings 281a. The spheric bodies 282 are fit into each corresponding bearing 281a to support the table 246 at four points on the lifting bodies 281. The table 246 has a support surface 246a defined on its upper surface to support the wafers 22a.

The pulse motors 274, 275, 276, 277 are driven in cooperation with the associated ball screw 278 to lift and lower each associated lifting body 281. This inclines the table 246 and enables adjustment of the inclining angle of the support surface 246a with respect to the horizontal direction. The pulse motors 274, 275, 276, 277, the ball screws 278, and the lifting bodies 281 constitute an inclining mechanism 301 to incline the support surface 246a.

The wafers 22a are supported in a stacked state between the four rods 238, 239 on the support surface 246a of the table 246. In this state, the wafers 22a are located below the water surface in the tank 230. The servomotor 400 of the lifting device 240 is driven in cooperation with the ball screw 242 to lift and lower the table 246 by way of the lifting plate 241, the support rods 244, and the attachment plate 243. The table 246 is lifted along the rods 238, 239 for a predetermined distance to arrange the uppermost wafer 22a at a position in the vicinity of the water surface 231a. This position corresponds to separation position. The guide rods 238, 239, the first lifting device 240, the support rods 244, the attachment plate 243, and the table 246 constitute a supporting mechanism 229 to support the wafers 22a.

First, second, third, and fourth sensors 247, 248, 249, 250 are arranged in the tank 230 so that they face the upper surface of the uppermost wafer 22a. Each sensor 247–250 is located at a position corresponding to one of the motors 274–277. In other words, one sensor 247–250 is provided for each motor 274–277. The sensors 247–250 are provided along a single horizontal plane. When the uppermost wafer 22a is lifted to the vicinity of the water surface 231a, the upper surface of the wafer 22a comes into contact with at least one of the sensors 247–250. This activates the contacted sensor 247–250 and causes it to transmit an ON signal to a controller 283. When the controller 283 receives an ON signal from the sensors 247–250, the servomotor 400 of the lifting device 240 is stopped to halt the lifting of the table 246.

The controller 58 then drives the pulse motor 274–277 corresponding to the sensor 247–250 which has not been activated and thus lifts the associated lifting body 281. As a result, the table 246 is inclined to adjust the inclination of the stacked wafers 22a. This enables the uppermost wafer 22a to become parallel with respect to the horizontal plane. In other words, the sensors 247–250 are used to detect the uppermost wafer 22a when it reaches the top position and to detect the inclination of the upper surface of the same wafer 22a with respect to the horizontal plane. The controller 283 controls the lifting device 240 and the pulse motors 274–277 based on the signals sent from the sensors 247–250. The table 246, the inclining mechanism 301, the sensors 247–250, and the controller 283 constitute a means to adjust the inclination of the stacked wafers 22a.

After adjusting the inclination of the wafers 22a, the sensors 247–250 are raised to a predetermined retreating position from the detecting position and moved away from the uppermost wafer 22a by an elevating mechanism (not shown).

A separation aiding mechanism 251 which aids the separation of the uppermost wafer 22a will now be described with reference to FIGS. 35 to 38.

Figure 35:
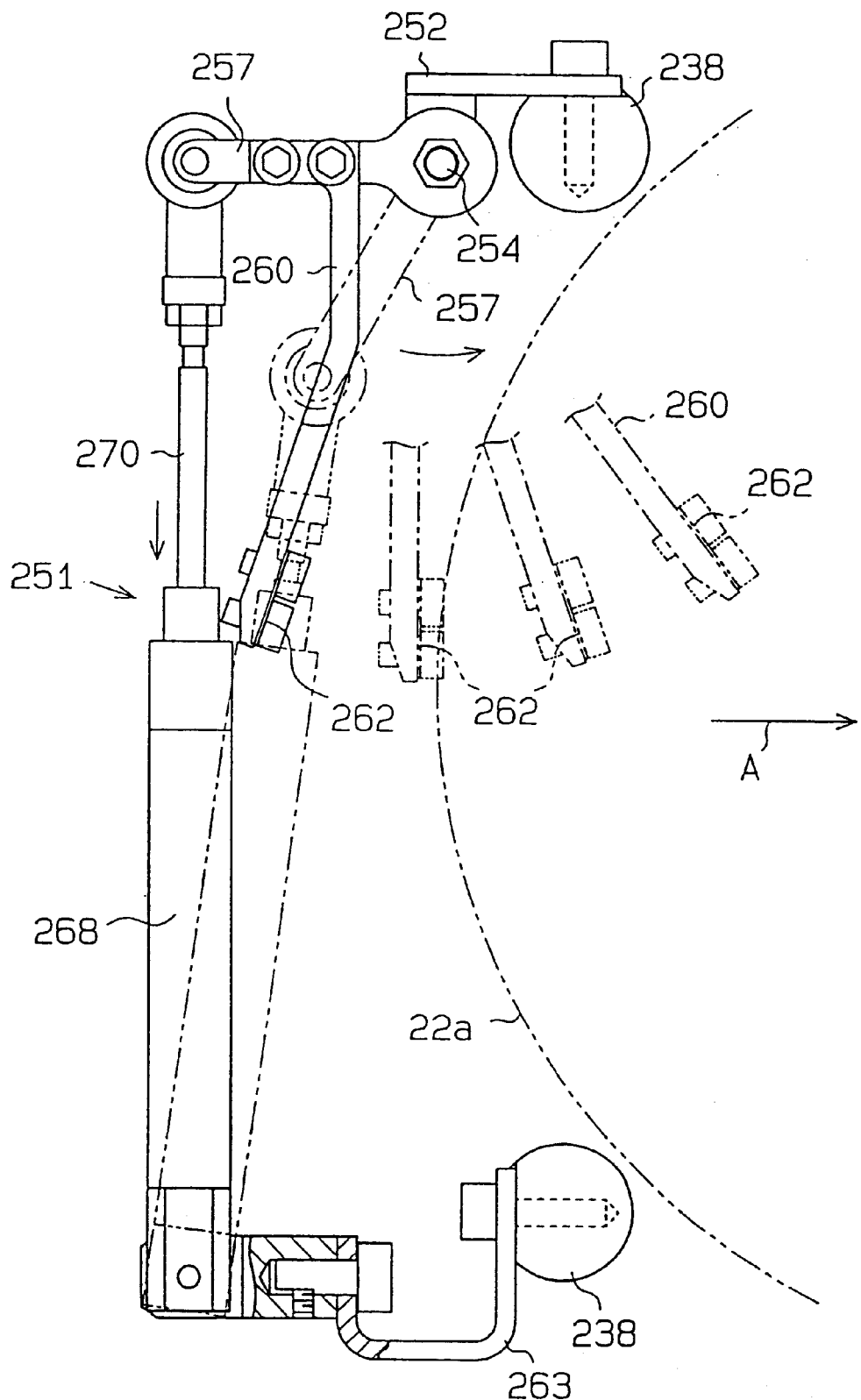
FIG. 35 is a partially cross-sectional top view showing a separation aiding mechanism.
Figure 36:
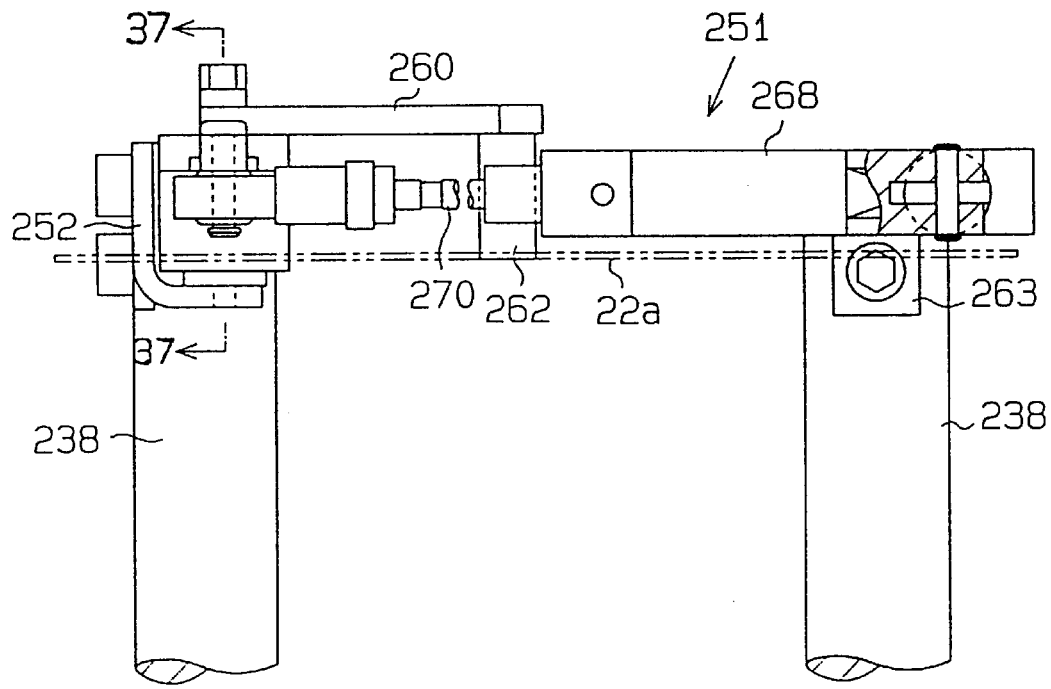
FIG. 36 is a front view showing part of the separation aiding mechanism.
Figure 37:
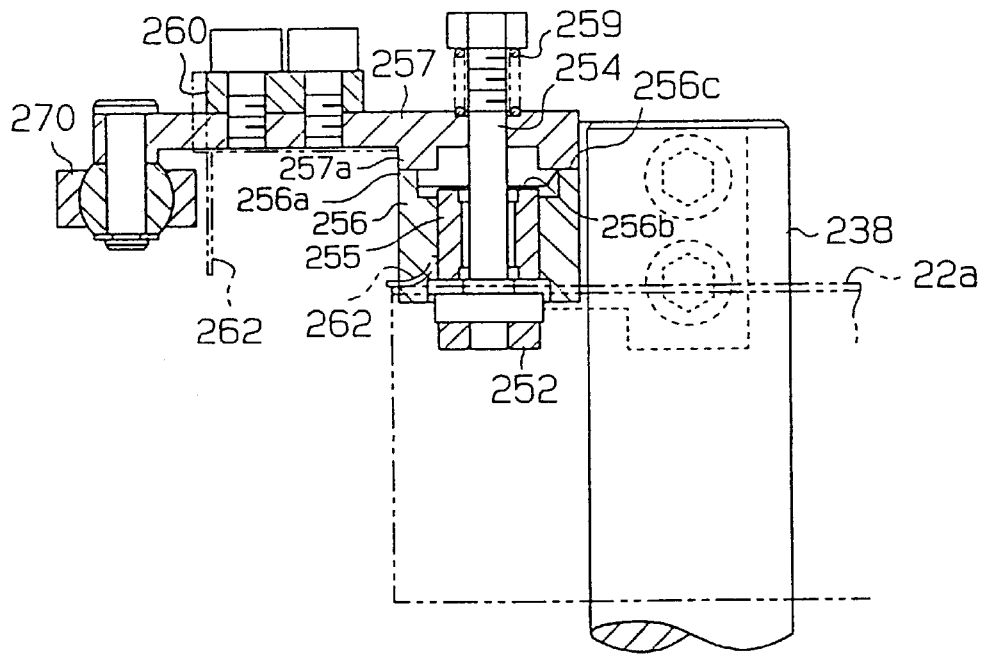
FIG. 37 is a cross-sectional view taken along line 37—37 in FIG. 36.

As shown in FIGS. 35 to 37, a bracket 252 couples a pin 254 to the front guide rod 238 located at the far side (the upper side as viewed in FIG. 35) of the separating/retaining apparatus 28. The pin 254 supports a cylindrical rotating cam 256 by way of a one-way clutch 255. The basal portion of a lever 257 is coupled to the upper section of the pin 254 and supported in a manner that it may be rotated horizontally. A spring 259 urges the lever 257 in a downward direction. An arm 260 is fixed to the middle section of the lever 257. A thin plate spring, or contact 262 is fastened to the distal section of the arm 260.

Figure 38:
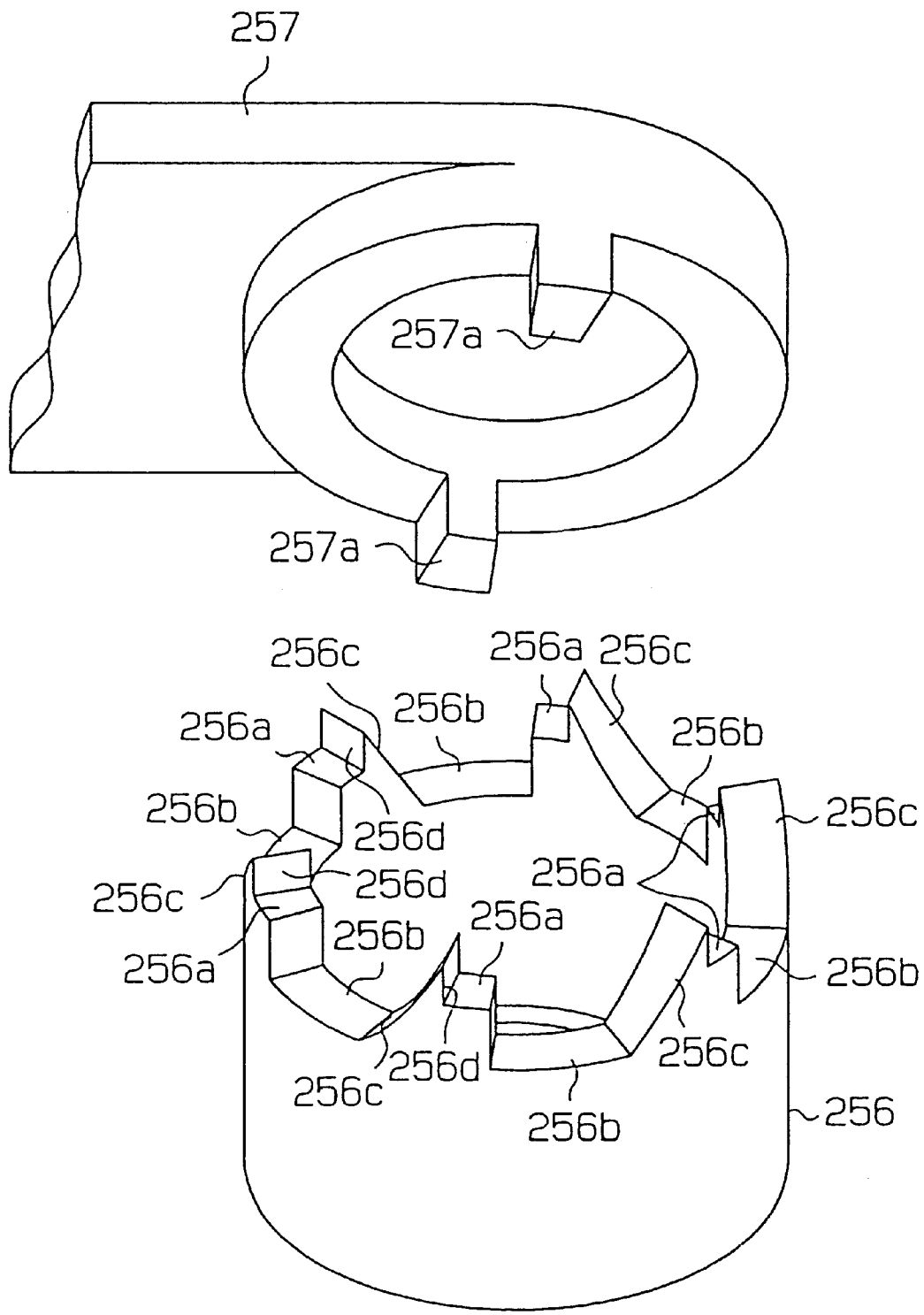
FIG. 38 is an exploded perspective view showing a rotating cam and a lever.
Figure 39:
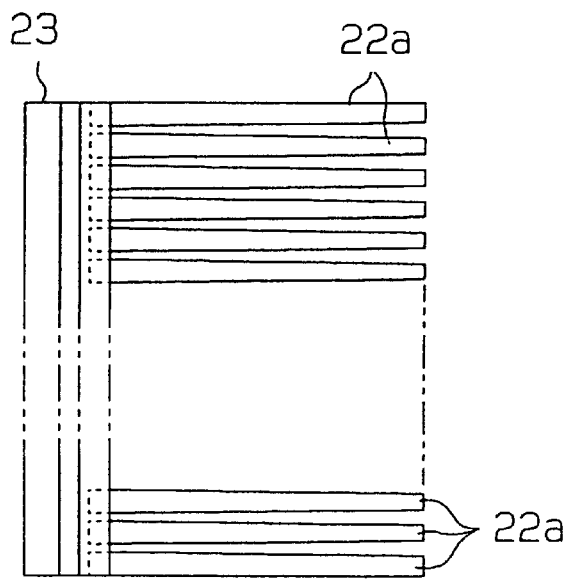
FIG. 39(a) is a front view of wafers after they are cut apart.
FIG. 39(b) is a front view showing the wafers removed from the adhering plate
Figure 39:
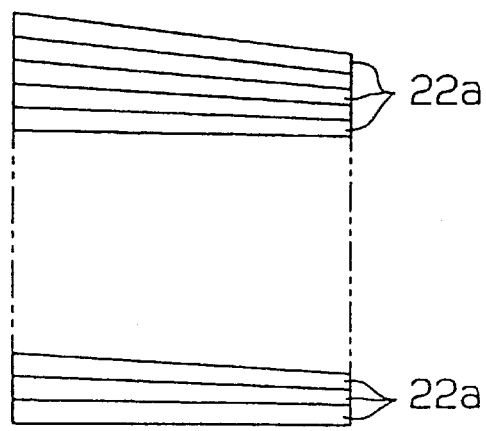

As shown in FIG. 38, first cam surfaces 256a, second cam surfaces 256b, and third cam surfaces 256c are defined in the upper end of the rotating cam 256. Six sets of the cam surfaces 256a, 256b, 256c are defined along the periphery of the rotating cam 256 with an equal interval between each set. The first cam surface 256a is horizontal. The second cam surface 256b is horizontal and extends at a position lower than the first cam surface 256a. A vertical surface continuously connects the first and second cam surfaces 256a, 256b. The third cam surface 256c is inclined and continuously connected to the second cam surface 256b. A vertical engaging surface 256d continuously connects the third cam surface 256c with the second cam surface 256b.

A pair of projections 257a project from the lower surface of the basal section of the lever 257. When the projections 257a are located on the first cam surfaces 256a, the contact 262 is held at a position above the uppermost wafer 22a. From this state, the lever 257 is rotated by about ten degrees in a counterclockwise direction as viewed in FIG. 38. This results in the projections 257a falling onto the second cam surfaces 256b and thus causes the lever 257 to be held at a position lower than the uppermost wafer 22a. The lever 257 is further rotated in a counterclockwise direction as viewed in FIG. 38 to elevate the projections 257a and thus raise the contact 262 to a position higher than the uppermost wafer 22a.

As shown in FIG. 35, the lever 257 pivots reciprocally within a range of about 60 degrees between a retreating position shown by the solid line and a position shown by the double-dotted line. When the lever 257 is at the retreating position, the projections 257a are positioned on the first cam surfaces 256a. When the lever 257 is pivoted 60 degrees from this state in a counterclockwise direction as viewed in FIG. 35, the force of the spring 259 moves the projections 257a along the first, second, and third cam surfaces 256a, 256b, 256c with the one-way clutch 255 preventing rotation of the rotating cam 256 with respect to the pin 254. The movement of the projections 257a results in the contact 262 contacting the uppermost wafer 22a and moving along the surface of the wafer 22a. This applies a driving force in the separating direction of the uppermost wafer 22a (indicated by arrow A in FIG. 35). The lever 257 moves to the position shown by the double-dotted line in FIG. 35 when pivoted 60 degrees. This positions the projections 257a on the first cam surfaces 256a and causes the contact 262 to be moved away from the uppermost wafer 22a.

When returning the lever 257 to the retreating position from the position indicated by the double-dotted line, the lever 257 is pivoted by about 60 degrees in a clockwise direction (as viewed in FIG. 35) with the projections 257a on the first cam surfaces 256a engaged with the engaging surface 256d. During the clockwise pivoting, the one-way clutch 255 allows the rotating cam 256 to be rotated with respect to the pin 254. Accordingly, the rotating cam 256 is rotated together with the lever 257 by about 60 degrees in a clockwise direction. In other words, the projections 257a remain held on the first cam surfaces 256a during the clockwise pivoting. Therefore, the contact 262 moves away from the upper wafer 22a and returns to the retreating position and remains there until the lever 257 is pivoted again.

The contact 262 bends as illustrated in FIG. 37 when in contact with the uppermost wafer 22a since it is made of a thin plate spring. This prevents the wafer 22a from being damaged by the contact 262. The spring plate may be substituted by a flexible or elastic member such as a flap made of soft resin or rubber. A brush-like member may also be used as the contact 262.

As shown in FIG. 35, a bracket 263 couples the basal portion of a cylinder 268 to the front guide rod 238 located at the proximal side (the lower side as viewed in FIG. 35) of the separating/retaining apparatus 28. The cylinder 268 is supported in a manner that it may be pivoted vertically and horizontally about the bracket 263. The cylinder 268 has a rod 270 which is connected to the distal section of the lever 257. The rod 270 is projected from and retracted into the cylinder 268 to pivot the arm 257 together with the lever 257.

As shown in FIGS. 32 and 33, a first nozzle 284 is arranged at a position above the section between the rear guide rods 239. The nozzle 284 is located at a diagonally upward and forward (the direction which the uppermost wafer 22a is moved toward) position with respect to the uppermost wafer 22a. Water is injected from the nozzle 284 toward the substantially center section on the upper surface of the uppermost wafer 22a to prevent floating of the wafer 22a.

A second nozzle 285 is arranged at a position above the section between the front rods 238. The nozzle 285 is located at a diagonally upward and rearward (the direction opposite to the direction which the uppermost wafer 22a is moved toward) position with respect to the uppermost wafer 22a. As shown in FIG. 33, water is injected from the nozzle 285 toward a position laterally separated from the center section on the upper surface of the uppermost wafer 22a after stopping injection of water from the first nozzle 284. Accordingly, the injected water applies a rotating force in the clockwise direction of FIG. 33 while also applying a driving force in the direction indicated by arrow A to the uppermost wafer 22a. This separates the uppermost wafer 22a from the other wafers 22a. The separation aiding mechanism 251 and the second nozzle 285 constitute a separating means 300 to separate the uppermost wafer 22a.

An ultrasonic oscillator 286 is arranged inside the tank 230 attached to its wall. The ultrasonic oscillator 230 generates ultrasonic waves to vibrate the water 231. The ultrasonic waves produces longitudinal waves of the water surface 231a and enhances separation of the wafer 22a. The ultrasonic waves also remove the foreign material adhered to each wafer 22a.

A partition 299 is arranged in the middle section of the tank 230. A chute 287 is fixed to the top end of the partition 299 and arranged in a manner that it is located in the vicinity of the water surface 231a. The upper surface of the chute 287 is inclined downward in the moving direction of the uppermost wafer 22a for a predetermined angle (about two degrees with respect to a horizontal plane). The separated uppermost wafer 22a is guided along the chute 287. The water 231 supplied into the tank 230 through the ports 236 of the first lifting device 240 flows along the chute 287 in the separating direction of the uppermost wafer 22a. The flow of the water 231 enhances the movement of the separating wafer 22a.

The end of the chute 287 faced toward the wafers 22a on the table 246 is curved in correspondence with the shape of the wafers 22a. The upper rim 287a of the curved portion is located on a plane that extends horizontally along the top surface of the rear rods 239. The upper rim 287a and the rear guide rods 239 constitute a stopper 302. The stopper 302 enables the uppermost wafer 22a to move in the direction indicated by arrow A and restricts the other wafers 22a from moving in this direction. Accordingly, only the uppermost wafer 22a may pass over the upper rim 287a of the chute 287 and move in the direction indicated by arrow A.

A fifth sensor 288 is arranged in the middle of the rear side (the right side as viewed in FIG. 32) of the chute 287. The sensor 288 transmits a signal to the controller 283 when the uppermost wafer 22a passes over the sensor 288 as the wafer 22a moves along the chute 287. In response to the signal from the sensor 288, the controller 283 actuates the lifting device 240 to lower the wafers 22a on the table 246 for a predetermined distance.

A second lifting device 289 is arranged at the downstream side of the chute 287 slightly inclined outward. The lifting device 289 includes a lifting plate 290, a ball screw 291, and a servomotor 401 which rotates the screw 291. The servomotor 401 is driven in cooperation with the ball screw 291 to lift and lower the plate 290. An attachment plate 294 is held suspended in the water 231 below the lifting plate 290 by a pair of support rods 293. The upper surface of the support plate 292 is inclined downward along the direction indicated by arrow A for a predetermined angle with respect to a horizontal plane.

A box-like cassette 295 is removably supported on the support plate 295. There is no wall in the side of the cassette 295 faced toward the wafers 22a. An opening 296 is provided in the opposite side of the cassette 295. The wafers 22a transferred along the chute 287 are stored separately in racks 297, which are provided with a predetermined interval between one another in the cassette 295. When each wafer 22a is stored on one of the racks 297, the servomotor 401 is driven and cooperates with the ball screw 291 to lower the cassette 295 for a predetermined distance. This enables an empty rack 297 to be located at a position corresponding to the chute 287. The racks 297 may be arranged either horizontally or inclined downward in the direction indicated by arrow A. This securely prevents the wafers 22a accommodated in the cassette 295 from falling out due to the water stream or other reasons.

A pair of sixth sensors 298 are attached to the partition 232 in the tank 230. The sensors 298 are located at positions corresponding to the rack 297 which is to receive the wafer 22a from the chute 287. When the rack 297 receives the wafer 22a, the sensors 298 sends a signal to the controller 283. In response to the signal, the controller 283 stops the injection of water from the second nozzle 285 and lowers the second lifting device 289.

The operation of the separating/retaining apparatus 28 having the above structure will now be described.

Before operating the separating/retaining apparatus 28, the support table 246 is submerged into the water 231 in the tank 230 with the plurality of wafers 22a stacked thereon. The empty cassette 295 is arranged on the support plate 292 at an elevated position so that the lowest rack 297 is located at a position corresponding to the chute 287.

If the uppermost wafer 22a on the table 246 is inclined with respect to the upper rim 287a of the chute 287, as shown in FIG. 34(a), the wafers 22a on the table 246 is lifted by the first lifting device 240. The lifting of the table 246 is stopped when the uppermost wafer 22a is positioned in the vicinity of the water surface 231a and comes into contact with any one of the four sensors 247–250, as shown in FIG. 34(b).

The pulse motors 274–277 corresponding to the sensors 247–250, which has not been activated, are driven to incline the table 246 until all four sensors 247–250 come into contact with the uppermost wafer 22a, as shown in FIG. 34(c). In other words, the inclination of the stacked wafers 22a is adjusted so that the surface of the uppermost wafer 22a becomes horizontal. This results in the uppermost wafer 22a becoming parallel to the upper rim 287a of the chute 287 at a position in the vicinity of the water surface 231a, where the wafer 22a is not interfered with by the stopper 302. The other wafers 22a are arranged at a position where they engage the stopper 302 and are restricted from moving in the direction indicated by arrow A in FIG. 32. When the wafers 22a are lifted and their inclination is adjusted, water is injected from the first nozzle 248 to prevent the wafers 22a from floating.

When the uppermost wafer 22a becomes horizontal and comes into contact with the sensors 247–250, the associated pulse motors 274–277 are deactivated. The sensors 247–250 are then lifted to the retreating position from the detecting position and are moved away from the uppermost wafer 22a. Furthermore, the injection of water from the nozzle 284 is stopped.

Afterwards, the cylinder 268 of the separation aiding mechanism 251 pivots the lever 257 and the arm 260 about the pin 254 in a counterclockwise direction as viewed in FIG. 35. The pivoting causes the contact 262 to apply a driving force to the uppermost wafer in the direction indicated by arrow A.

The second nozzle 285 injects water against the uppermost wafer 22a, to which the driving force has been applied, from a diagonally upward position. The water from the nozzle 285 is injected toward the surface of the uppermost wafer 22a at a position laterally separated from the center of the wafer 22a. Thus, the injected water applies a rotating force and a driving force in the direction in which the uppermost wafer 22a is to be moved. This ensures the uppermost wafer 22a to be separated from the next wafer 22a therebelow. The longitudinal waves produced by the ultrasonic waves from the ultrasonic oscillator 286 enhance the separation of the uppermost wafer 22a.

In addition, when the uppermost wafer 22a starts moving, the water injected from the second nozzle 285 enters the space between the uppermost wafer 22a and the next wafer 22a arranged therebelow. This further enhances the separation of the uppermost wafer 22a.

A water stream directed in the direction which the uppermost wafer 22a is to be moved toward is produced on the upper surface of the chute 287. Accordingly, the separated uppermost wafer 22a moves along the surface of the chute 287 along the water stream in the direction indicated by arrow A. When the wafer 22a passes over the fifth sensor 288, the sensor 288 transmits a signal. In response to the detection signal, the wafers 22a on the table 246 are lowered for a predetermined distance by the first lifting device 240.

The wafer 22a is transferred along the chute 287 and stored on the rack 297 in the cassette 295. Since the chute 287 is inclined downward with respect to the moving direction of the wafer 22a, the wafer 22a moves smoothly thereon. If the cassette 295 is further inclined in comparison with the chute 287, the wafer 22a transferred along the chute 287 may be smoothly stored in the cassette 295.

When the wafer 22a is stored on the rack 297, the sixth sensors 298 detect the wafer 22a and transmit a signal. In response to the signal, the injection of water from the second nozzle 285 is stopped and the injection of water from the first nozzle 284 is commenced. Simultaneously, the second lifting device 289 lowers the cassette 295 for the predetermined distance. This enables the next empty rack 297 to be arranged at a position corresponding to the chute 287. The first, second, third, and fourth sensors 247, 248, 249, 250 are than lowered from the retreating position to the detecting position. Afterwards, the first lifting device 240 lifts the wafers 22a until the uppermost wafer 22a comes into contact with at least one of the sensors 247–250.

Subsequently, the adjustment of the inclining of the wafers 22a, the separation of the uppermost wafer 22a, and the transferring of the same wafer 22a is repeated in the manner described above. As a result, each wafer 22a at the uppermost position is separated one by one from the stack of wafers 22a on the table 246 and conveyed along the chute 287 to be separately stored on the racks 297 of the cassette 295. When every rack 297 in the cassette 295 accommodates a wafer 22a, the second lifting device 289 lifts the cassette 295 out of the water 231 in the tank 230 to a position above the water level 231a. Accordingly, the cassette 295 may be removed from the support plate 292 and conveyed together with the plurality of wafers 22a for processing in the subsequent steps.

The wafers 22a may be stored into the cassette 295 by lifting the cassette 295 instead of lowering it. In this case, the wafers 22a may be moved at a speed which is faster than when lowering the cassette. When lifting the cassette 295, it is preferable that water be sprayed toward the wafers 22a in the cassette 295 from a sprayer or the like (not shown) to prevent drying of the wafers 22a.

As described above, the separating/retaining apparatus 28 included in the ninth embodiment adjusts the inclination of the wafers 22a on the table 246 if the uppermost wafer 22a is inclined with respect to the upper rim 287a of the chute 287 before separation of the same wafer 22a. This enables the uppermost wafer 22a to be separated without interference with the stopper 302 while the other wafers 22a are prevented from moving in the separating direction by the stopper 302. Thus, this ensures the separation of each wafer 22a from the stack of wafers 22a when arranged at the uppermost position. Furthermore, the uppermost wafer 22a may be smoothly conveyed over the upper rim 287a without interference with the stopper 302. The stopper 302 ensures restriction of the movement of the other wafers 22a in the separating direction. Accordingly, damage of the uppermost wafer 22a, caused by contact against the upper rim 287a of the chute 287, is avoided.

As shown in FIGS. 18(b) and 19, the workpiece 22 is cut starting from the side opposite the adhering plate 23 toward the plate 23. As shown in FIG. 39(a), such cutting causes a large volume of the workpiece 22 to be removed at the section where the cutting is started in comparison with the section where the cutting is finished. Accordingly, the thickness of the produced wafers 22a tends to gradually become thicker when approaching the section where the cutting is finished. The difference in thickness is not significant for each wafer 22a. However, when a plurality of wafers 22a are stacked together, the accumulated thickness causes the uppermost wafer 22a to be inclined with respect to a horizontal plane. The difference in the thickness of each wafer 22a is minute. However, the thickness difference is shown in an exaggerated manner to facilitate understanding in FIG. 39(b).

Therefore, when these wafers 22a are stacked on the table 246 of the separating/retaining apparatus 28, the uppermost wafer 22a becomes inclined with respect to the upper rim 287a of the chute 287. If the separation of the uppermost wafer 22a is initiated in this state, the chute 287 may interfere with the movement of the wafer 22a. In addition, the wafer 22a may impact against the chute 287 in an inclined state. However, the separating/retaining apparatus 28 included in the ninth embodiment prevents such problems from occurring.

After the separation aiding mechanism 251 applies a driving force to the uppermost wafer 22a, water is injected from the second nozzle 185 to separate and move the wafer 22a. The level of resistance becomes highest when separation of the wafer 22a is initiated. However, the drive force in the moving direction applied to the uppermost wafer 22a by the separation aiding mechanism 251 ensures separation of the same wafer 22a.

Since water is injected in one direction from the single second nozzle 285 to separate the uppermost wafer 22a, the structure of the apparatus is simplified. In addition, the same wafer 22a is washed by the stream of water as it is separated and moved.

When the uppermost wafer 22a is not being separated, water injected from the first nozzle 284 presses the wafers 22a. This suppresses the movement of the wafers 22a in the water 231. In addition, since water is used to press the wafers 22a, damages are not inflicted on the wafers 22a.

As each wafer 22a is retained in the cassette 295, the retained wafer 22a is submerged into the water 231. This prevents foreign material from being adhered to the surface of the same wafer 22a.

The separating/retaining apparatus 28 of the ninth embodiment may be incorporated in the processing system of the first embodiment. In this case, the cassette 295 in the ninth embodiment corresponds to the second cassette 29 in the first embodiment. The first cassette 26 is removed from the additional washing device 24b by the first transporting apparatus 34. The wafers 22a in the first cassette 26 are than transferred onto the table 246 by a certain transporting apparatus (not shown).

The ninth embodiment may be modified as described below.

Instead of providing the four sensors 247–250, three sensors may be provided. In this case, three pulse motors, each corresponding to one of the sensors, is provided in the inclining mechanism 301.

The inclination of the wafers 22a may be adjusted so that the uppermost wafer 22a is inclined downward in its separating direction by a predetermined angle (about one to three degrees) with respect to a horizontal plane. This smoothens the movement of the uppermost wafer 22a.

The first nozzle 284 may be omitted. In this case, the sensors 247–250 may be used to prevent the wafers from floating.

The water discharged through the discharge port 237 may be returned into the tank 230 though the supplying ports 236 after filtering the water.

A plurality of second nozzles 285 may be provided.

To enable adjustment of the relative position between the water surface 231a and the uppermost wafer 22a, the partition 232 and the guide rods 237, 238 may be provided in a liftable manner. The uppermost wafer 22a may be positioned at a location where it is completely submerged in the water 231, at a location where only its upper surface is exposed from the water surface 231a, or at a location where its lower surface coincides with the water surface 231a.

Figure 40:
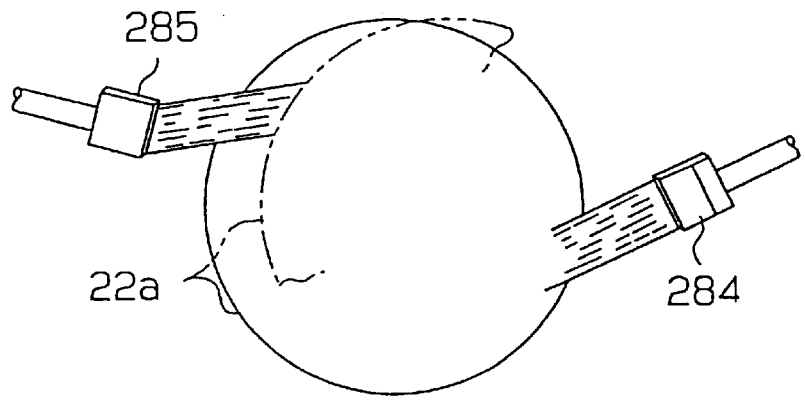
FIG. 40 is a schematic plan view showing a modification of the ninth embodiment.

As shown in FIG. 40, in the same manner as the second nozzle 285, the first nozzle 284 may be arranged to blast water toward the upper surface of the wafer 22a at a position separated from the center of the wafer 22a. This enables an increase in the rotating force applied to the wafer 22a.

Figure 41:
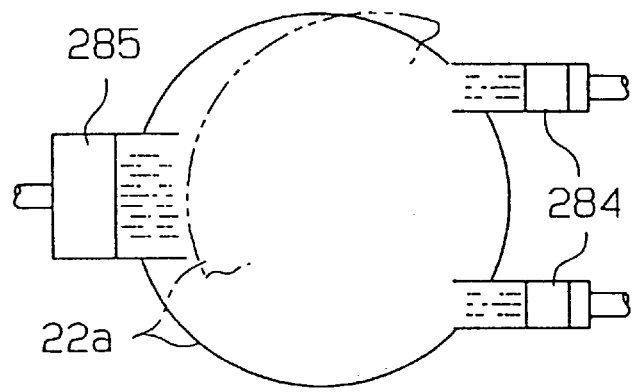
FIG. 41 is a schematic plan view showing a modification of the ninth embodiment.

As shown in FIG. 41, the second nozzle 285 may be directed straight toward the separating direction of the uppermost wafer 22a with a pair of first nozzles 284 directed opposite the separating direction at positions offset from the location of the second nozzle 285. In this case, the uppermost wafer 22a may be moved without being rotated. The first nozzles 284 prevent the wafer 22a from floating as it moves.

Figure 42:
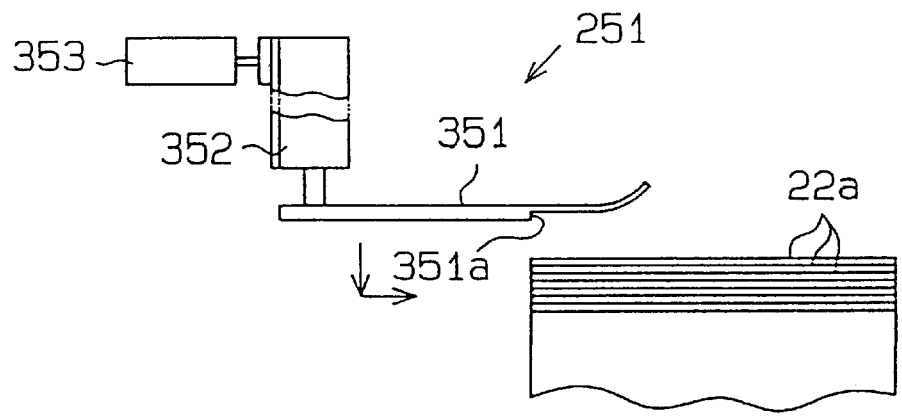
FIG. 42 is a schematic front view showing a separation aiding mechanism according to a tenth embodiment of the present invention.

A tenth embodiment according to the present invention will hereafter be described with reference to FIG. 42.

The tenth embodiment is a modification of the ninth embodiment. As shown in FIG. 42, the structure of the separation aiding mechanism 251 differs from the ninth embodiment. An ejecting plate 351 having an engaging section 351a to engage the peripheral section of the uppermost wafer 22a is provided. A first cylinder 352 lifts and lowers the ejecting plate 351. A second cylinder 353 moves the ejecting plate 351 horizontally. To separate the uppermost wafer 22a from the other wafers 22a, the first cylinder 352 lowers the ejecting plate 351 until the lower surface of its distal section contacts the uppermost wafer 22a. The ejecting plate 351 is moved forward by the second cylinder 353. As the ejecting plate 351 moves forward, the engaging section 351a of the engages the peripheral section of the uppermost wafer 22a and moves the wafer 22a in the separating direction. Thus, as in the ninth embodiment, a driving force is applied to the uppermost wafer 22a when initiating separation of the same wafer 22a from the other wafers 22a. This ensures separation of each wafer 22a.

Figure 43:
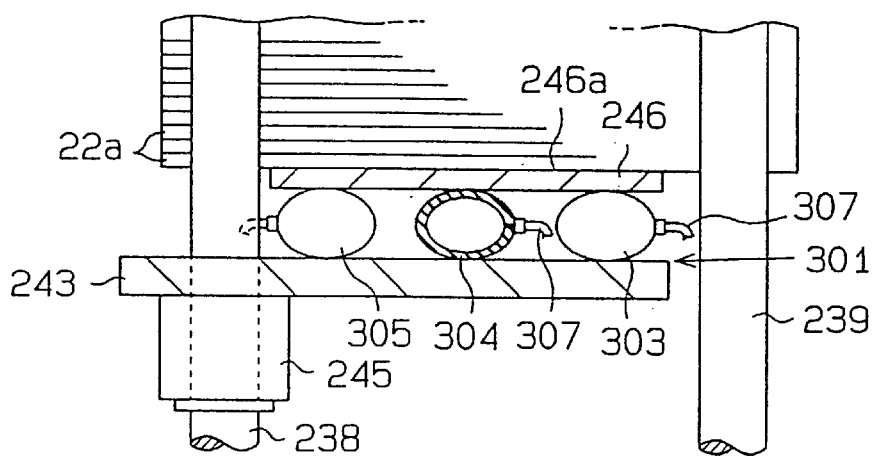
FIG. 43 is a cross-sectional front view showing part of a inclining mechanism according to an eleventh embodiment of the present invention.

An eleventh embodiment according to the present invention will hereafter be described with reference to FIG. 43.

The eleventh embodiment is a modification of the ninth embodiment. As shown in FIG. 43, the structure of the inclining mechanism 301 differs from the ninth embodiment. In the eleventh embodiment, the support table 246 is supported on the attachment plate 243 by first, second, third, and fourth fluid bags 303, 304, 305, 306. A supplying apparatus (not shown) supplies fluids, such as air or water, into each bag 303–306 through pipes 307. The controller 283 controls the amount of fluid sent to the bags 303–306. This inclines the table 246 and adjusts the inclination of its support surface 246a with respect to a horizontal plane. Accordingly, the advantageous effects obtained in the ninth embodiment may also be obtained in this embodiment.

Figure 44:
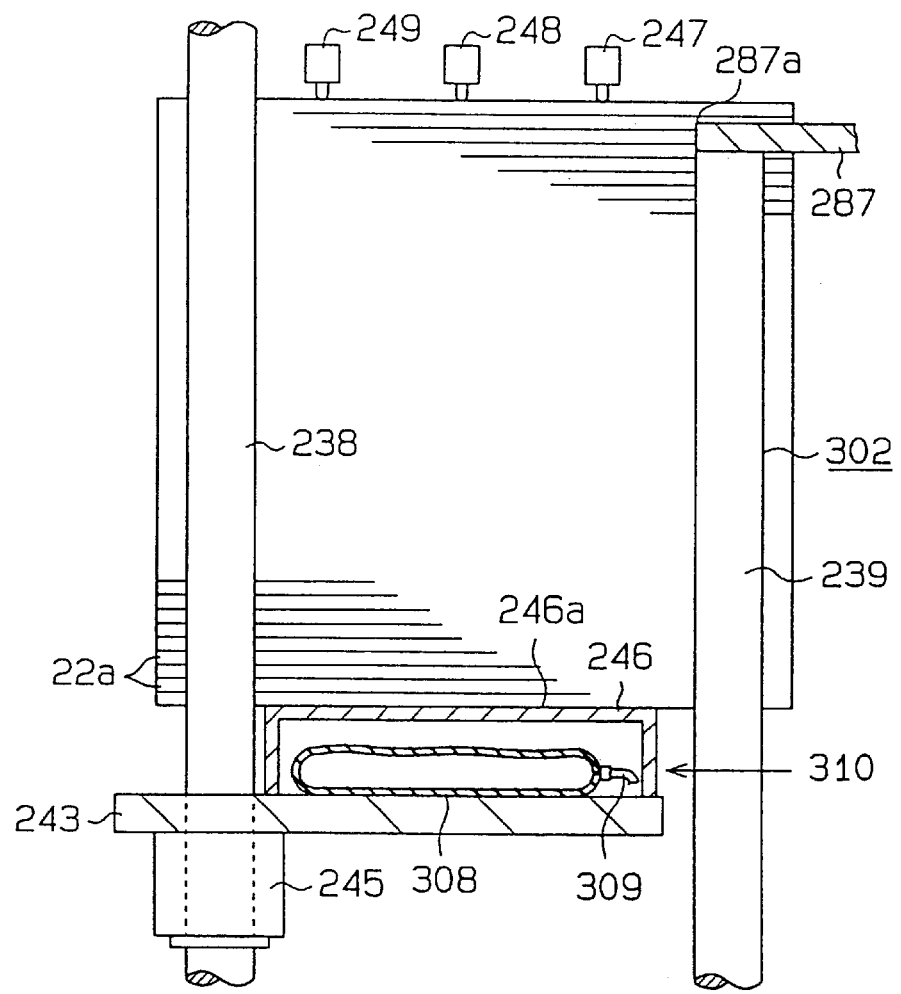
FIG. 44 is a cross-sectional front view showing part of a inclining mechanism according to a twelfth embodiment of the present invention.
Figure 45:
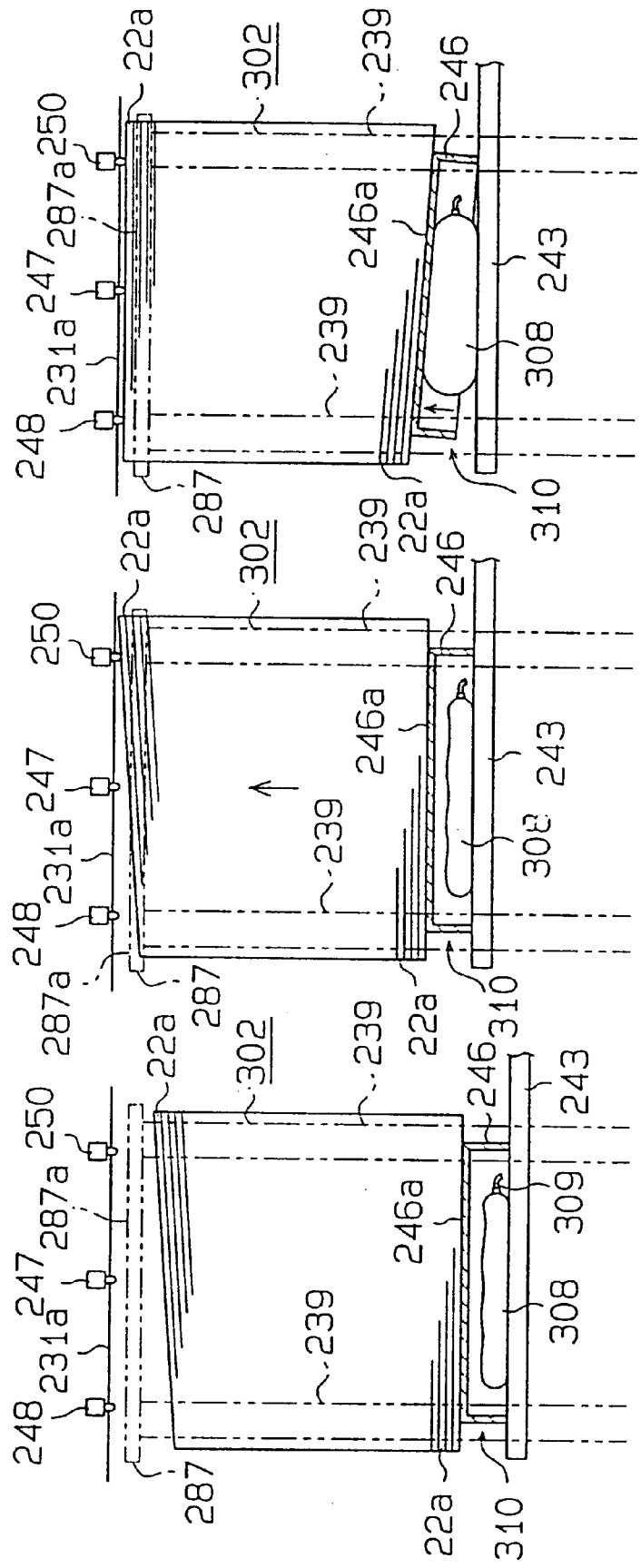
FIGS. 45(a), (b), (c) are explanatory drawings showing movements of the wafers when adjusting their inclination.

A twelfth embodiment according to the present invention will hereafter be described with reference to FIGS. 44 and 45.

The twelfth embodiment is a modification of the ninth embodiment. As shown in FIG. 44, the means for adjusting the inclination of the stacked wafers 22a differs from the ninth embodiment. In this embodiment, the support table 246 is box-shaped and is placed on the attachment plate 243. The bottom of the table 246 is opened. A fluid bag 308 is arranged between the table 246 and the attachment plate 243. A supplying apparatus (not shown) supplies fluids, such as air or water, into the bag 308 through a pipe 309. The table 246 and the bag 308 constitutes an inclining body 310 which support the stacked wafers 22a even when inclined. The inclining body 310 and the first, second, third, and fourth sensors 247–250 constitute a means to adjust the inclination of the stacked wafers 22a. Furthermore, the sensors 247–250 constitute a means to restrict the uppermost wafer 22a so that it is parallel to a horizontal plane.

The operation of the twelfth embodiment will now be described with reference to FIG. 45.

If the operation of the separating/retaining apparatus 28 is started with the wafers 22a supported on the table 246, as shown in FIG. 45(a), the first lifting device 240 lifts the wafers 22a on the table 246. When the uppermost wafer 22a becomes positioned in the vicinity of the water surface 231a and comes into contact with any one of the four sensors 247–250, as shown in FIG. 45(b), the lifting is stopped.

The bag 308 is then inflated until all four sensors 247–250 come into contact with the uppermost wafer 22a, as shown in FIG. 45(c). Since the wafers 22a may be supported on the table 246 even when inclined, the inclination of the wafers 22a may be altered easily. Furthermore, when the uppermost wafer 22a comes into contact with all four sensors 247–250, the wafer 22a is restricted at a horizontal position. Accordingly, fluid is supplied to the bag 308 to inflate it until the upper surface of the uppermost wafer 22a comes into contact with all four sensors 247–250. In other words, the inclination of the wafers 22a on the table 246 is varied. As a result, the uppermost wafer 22a becomes parallel to the upper rim 287a of the chute 287. Accordingly, the advantageous effects obtained in the ninth embodiment may also be obtained in this embodiment.

Figure 46:
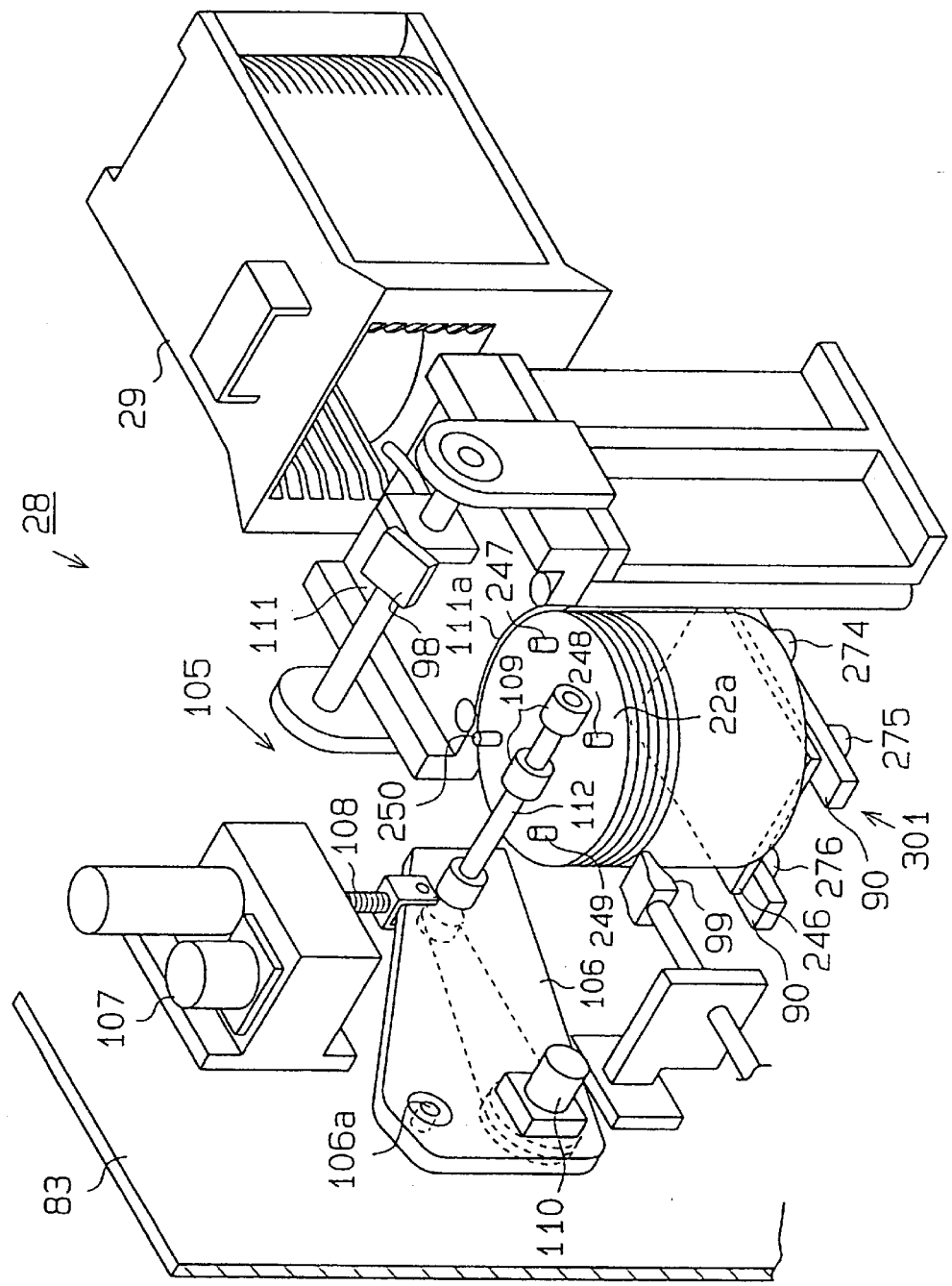
FIG. 46 is a perspective view showing part of a separating/retaining apparatus according to a thirteenth embodiment of the present invention.

A thirteenth embodiment will hereafter be described wit reference to FIG. 46.

As shown in FIG. 46, in this embodiment, the inclination adjustment means of the ninth embodiment is applied to the separating/retaining apparatus 28 of the first embodiment. Members that are identical to the members used in the separating/retaining apparatus 28 of the first embodiment will be denoted with the same numeral. Members that are identical to the members used in the inclination adjustment means of the ninth embodiment will be denoted with the same numeral.

In this embodiment, the first, second, third, and fourth pulse motors 274, 275, 276, 277 are coupled to the lower surface of the arms 90. The support table 246, which is inclined by the pulse motors 274–277 is arranged above the table 246. The first, second, third, and fourth sensors 247, 248, 249, 250 are arranged at positions opposed to the upper surface of the uppermost wafer 22a.

The stacked wafers 22a on the table 246 are inclined by the inclining mechanism 301. Thus, the uppermost wafer 22a is conveyed over the upper rim 111a of the chute 111 without interference with the chute 111. This structure ensures the restriction of the movement of the other wafers 22a in the separating direction of the uppermost wafer 22a.

A fourteenth embodiment according to the present invention will hereafter be described with reference to FIGS. 47 and 48.

The fourteenth embodiment includes a modification of the cassette supporting mechanism 92 which is employed in the separating/retaining apparatus 28 of the first embodiment. In the fourteenth embodiment, members that are identical to the members used in the separating/retaining apparatus 28 of the first embodiment will be denoted with the same numeral.

Figure 47:
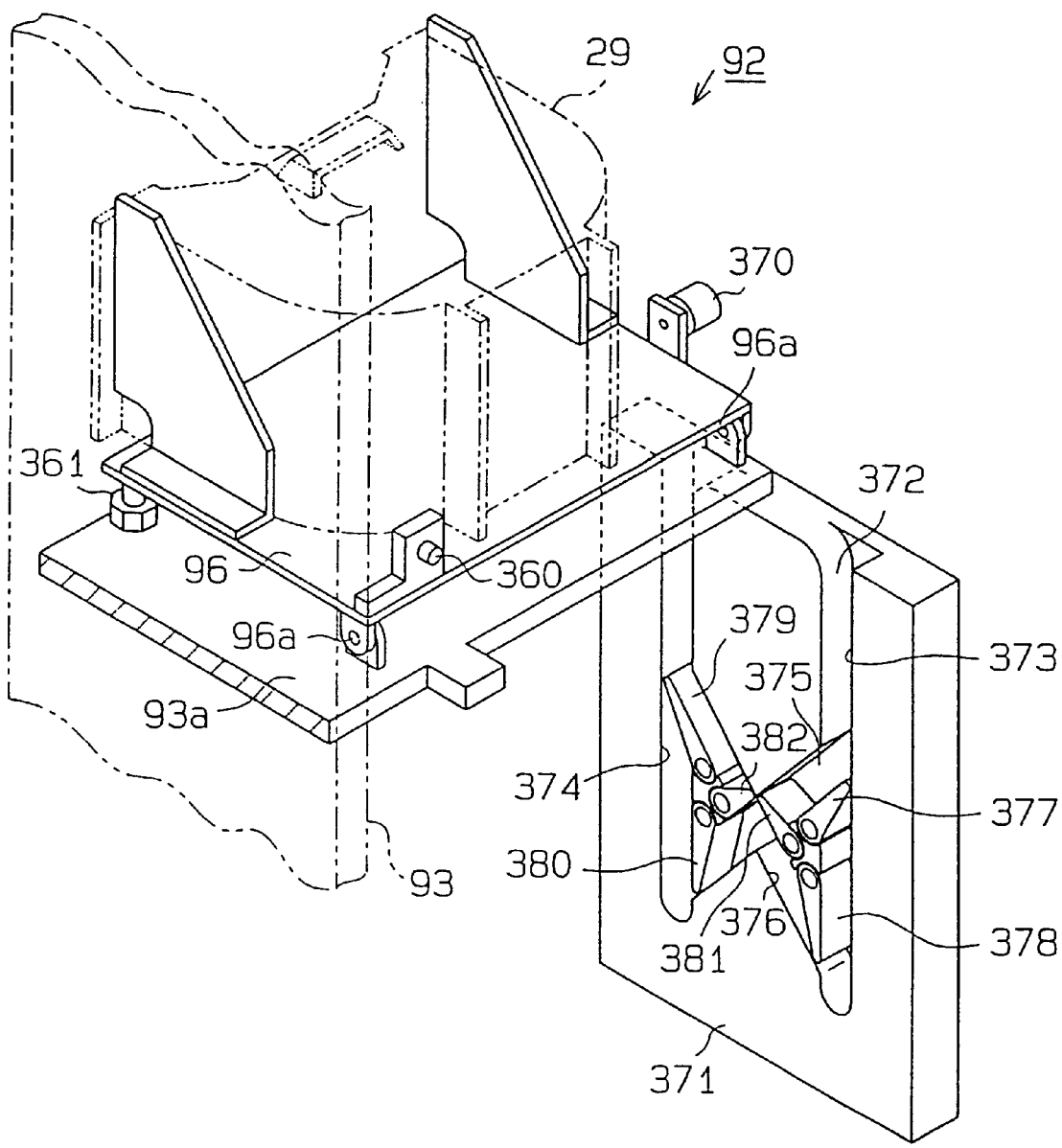
FIG. 47 is a perspective view showing a cassette supporting mechanism according to a fourteenth embodiment of the present invention.

As shown in FIG. 47, the elevating platform 93 of the cassette supporting mechanism 92 is lifted and lowered by the motor 94 in cooperation with the ball screw 95 (FIG. 14). The elevating platform 93 has a support plate 93a to support the cassette support platform 96. The support platform 96 is supported in a manner that is pivotal about the pivot shaft 96a on the plate 93a. A first stopper 360 is provided at the rear section of the platform 96. When the platform 96 faces an upward direction, the first stopper 360 abuts against the upper surface of the support plate 93a to hold the platform 96 at this position. A second stopper 361 is provided at the front section of the support plate 93a on its upper surface. When the platform 96 is arranged in a sideward direction, the second stopper 361 abuts against the lower surface of the platform 96 to hold the platform 96 at this position. Accordingly, the stoppers 360, 361 restrict the pivoting area of the platform 96.

A roller 370 is coupled to the elevating platform 93 at the opposite side of the elevating platform 93 and supported in a rotatable manner. A guide plate 371 is erected in the tank 83 of the separating/retaining apparatus 28 at the opposite side of the elevating platform 93.

As shown in FIGS. 48(a) and 48(b), the guide plate 371 has a guide groove 372 which is engageable with the roller 370. The roller 370 rolls inside the guide groove 372. The guide groove 372 includes first, second, third, and fourth grooves 373, 374, 375, 376. The first groove 373 extends in a vertical direction. The second groove 374 also extends vertically and is separated from the first groove 375 by a predetermined distance. The third groove 375 extends diagonally connecting the middle section of the first groove 373 to the bottom end of the second groove 374. The fourth groove 376 extends diagonally connecting the middle section of the second groove 374 to the bottom end of the first groove 373. The middle section of the third groove 375 intersects with the middle section of the fourth groove 376.

Pivotal first, second, third, fourth, fifth, and sixth shifting levers 377, 378, 379, 380, 381, 382 are coupled to the guide plate 371 to change the moving path of the roller 370 in the guide groove 372. The levers 377–378 pivot between the positions shown by the solid lines and the double-dotted lines in FIGS. 48(*a*) and 48(*b*). A spring or the like (not shown) constantly holds the levers 377–382 at the positions shown by the solid lines.

The first lever 377 is located at a position where the first groove 373 intersects the third groove 375. The second lever 378 is located at a position where the first groove 373 intersects the fourth groove 376. The third lever 379 is located at a position where the second groove 374 intersects the fourth groove 376. The fourth lever 380 is located at a position where the second groove 374 intersects the third groove 375. The fifth lever 381 and the sixth lever 382 are located at positions where the third groove 375 intersects the fourth groove 376.

As shown in FIG. 48(*a*), the support platform 96 is directed upward at position P1 to set an empty second cassette 29 onto the platform 96. At this position, the roller 370 is arranged at the upper end of the first groove 373. From this state, the third transporting apparatus 38 sets the empty second cassette 29 onto the platform 96 with the cassette 29 faced upward (i.e., the openings to retain the wafers 22*a* are located at an upward position).

The platform 96 supporting the empty second cassette 29 is than lowered from position P1 to position P2 by the elevating platform 93. As the platform 93 is lowered, the roller 370 is guided into the third groove 375 by the first lever 377, which is located at the position shown by solid lines, when the roller 370 reaches the middle section of the first groove 373. This causes the roller 370 to be lowered diagonally along the third groove 375 until it reaches the bottom end of the second groove 374. The roller 370 pivots the fifth and fourth levers 381, 380 to the positions shown by the dotted lines from the positions shown by the solid lines as it advances in the third groove 375. Accordingly, the roller 370 securely reaches the bottom end of the second groove 374 without entering the fourth groove 376. The fifth and fourth levers 381, 380 return to the positions shown by the solid lines after the roller 370 passes by.

When the platform 96 is moved to position P2 from position P1, the pivot shaft 96*a*, which is the pivot fulcrum of the platform 96, is lowered vertically. As the pivot shaft 96*a* is lowered vertically, the roller 370, which is coupled to the side of the platform 96, is lowered diagonally along the third groove 375. Accordingly, the platform 96 pivots 90 degrees about the pivot shaft 96*a* in a counterclockwise direction, as viewed in FIG. 48(*a*), as the roller 370 moves along the third groove 375. As a result, when the second cassette 29 is arranged at position P2, the second cassette 29 is faced sideward (i.e., the openings to retain the wafers 22*a* are faced toward the chute 111).

The elevating platform 93 then lifts the support platform 96 to position P3 from position P2. Since the third groove 375 is closed by the fourth lever 380, the roller 370 moves upward vertically along the second groove 374 as the support platform 96 is lifted. Therefore, the platform 96 moves upward without being pivoted and the second cassette 29 remains faced sideward when arranged at position P3. At position P3, the lowest rack 29*a* in the second cassette 29 is arranged at a position corresponding to the upper surface of the chute 111. The roller 370 moves the third lever 379 from a position shown by the solid line to a position shown by the dotted line as it moves upward in the second groove 374.

Wafers 22*a* are stored on the racks 29*a* in the second cassette 29 when the platform 96 is arranged at position P3. After a single wafer 22*a* is stored in the second cassette 29, the platform 96 is lowered for a distance corresponding to the pitch between each rack 29*a*. After every rack 29*a* in the second cassette 29 becomes accommodated by the wafers 22*a*, the platform 96 is moved to position P4, which is shown in FIG. 48(*b*). As the platform 96 is lowered to position P4 from position P3, the roller 370 moves only in a vertical direction and thus does not pivot the table 96.

The elevating platform 93 than lowers the support platform 96 from position P4 to position P5. As the support platform 96 is lowered, the third lever 379, arranged at the position shown by the solid lines, causes the roller 370 to enter the fourth groove 376. Accordingly, the roller 370 advances along the fourth groove 376 until it reaches the bottom end of the first groove 373. The roller 370 moves the sixth and second levers 382, 378 from positions shown by the solid lines to positions shown by the dotted line as it moves diagonally downward in the second groove 374. Therefore, the roller 370 securely reaches the bottom end of the first groove 374 without entering the third groove 375 as it moves along the fourth grove 376. The sixth and second levers 382, 378 return to the positions shown by the solid lines after the roller 370 passes by.

When the platform 96 is moved to position P5 from position P4, the pivot shaft 96*a*, which is the pivot fulcrum of the platform 96, is lowered vertically. As the pivot shaft 96*a* is lowered vertically, the roller 370 is lowered diagonally along the fourth groove 376. Accordingly, the platform 96 pivots 90 degrees about the pivot shaft 96*a* in a clockwise direction, as viewed in FIG. 48(*b*), as the roller 370 moves along the fourth groove 375. As a result, when the second cassette 29 supported on the platform 96 is arranged at position P5, the second cassette 29 is faced upward.

The elevating platform 93 then lifts the support platform 96 from position P5 to position P1. Since the fourth groove 376 is closed by the second lever 378, the roller 370 moves upward vertically along the first groove 373 as the support platform 96 is lifted. Therefore, the platform 96 moves upward without being pivoted and the second cassette 29 remains faced upward when arranged at position P1. The roller 370 moves the first lever 377 from a position shown by the solid line to a position shown by the dotted line as it moves upward in the first groove 373.

The third transporting apparatus 38 removes the second cassette 29, with the wafers 22*a* accommodated therein, from the platform 96 when the platform 96 is arranged at position P1. The third transporting apparatus 38 then sets an empty second cassette 29 on the platform 96 with the cassette 29 faced upward. Subsequently, the above operation is repeated to retain the wafers 22*a*.

As described above, the guide plate 371 pivots the cassette support platform 96 when the platform is lifted and lowered. Thus, the cylinder 97 used exclusively to pivot the platform 96 in the first embodiment is not required in this embodiment. The pivoting of the platform 96 may be carried out just by employing a single motor 94 to lift and lower the platform 96. Accordingly, the structure of the cassette supporting mechanism 92 is simplified. This enables the mechanism 92 to become more compact.

The guide plate 371 may be easily produced since the structure of the plate 371, having the guide groove and plurality of shifting levers, is simple.

After retaining the wafers 22a, the second cassette 29 is pivoted in the water when the platform 96 is lowered to position P5 from position P4. This reduces the force of impacts caused by the pivoting and thus prevents the wafers 22a from being damaged during the pivoting.

Figure 49:
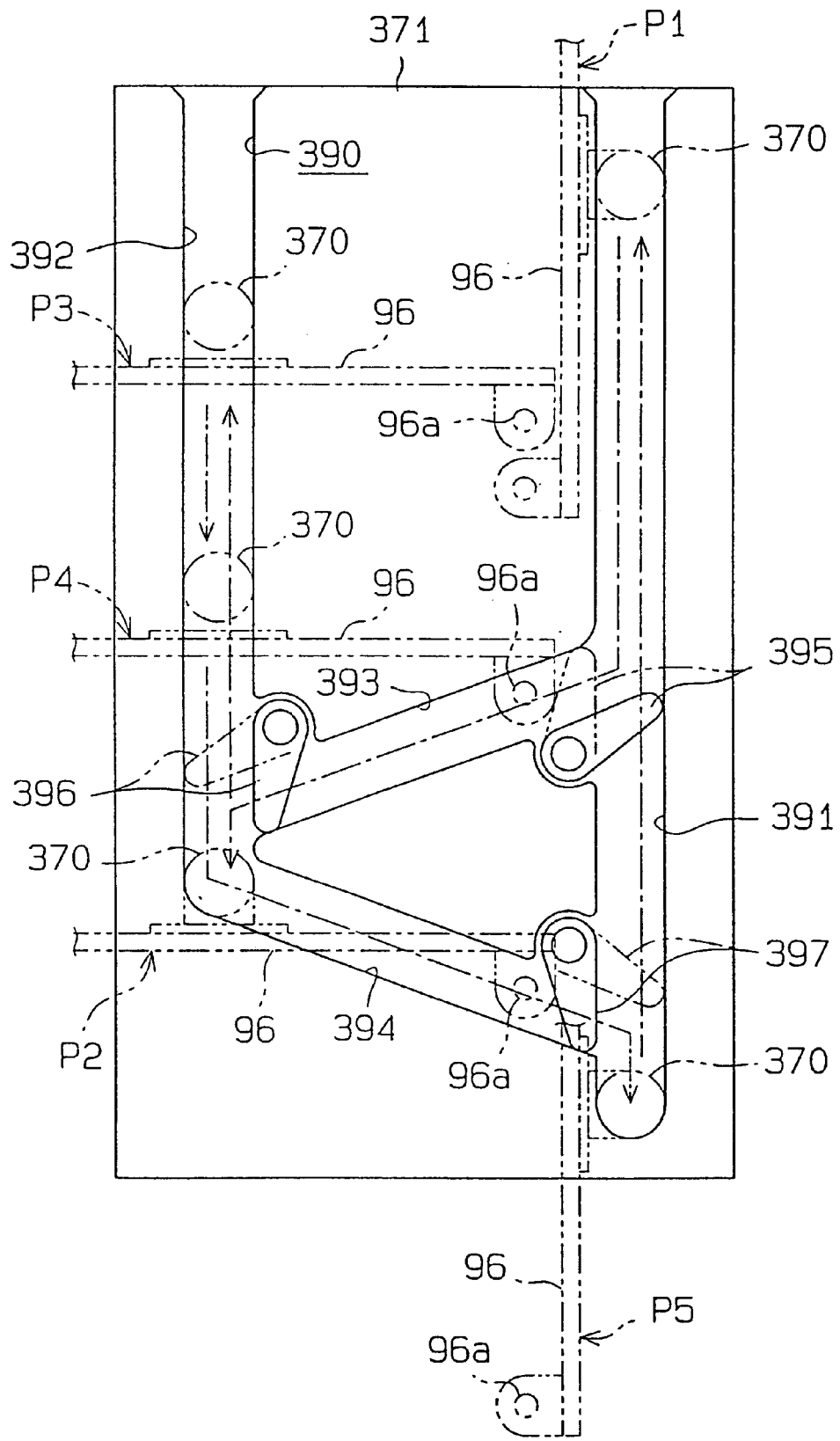
FIG. 49 is a front view of a guide plate according to a fifteenth embodiment of the present invention.

A fifteenth embodiment of the present invention will hereafter be described with reference to FIG. 49.

The fifteenth embodiment includes a modification of the guide plate 371 employed in the fourteenth embodiment. As shown in FIG. 49, in the fifteenth embodiment, the guide groove 390 of the guide plate 371 includes first, second, third, and fourth grooves 391, 392, 392, 394. The first groove 391 extends in a vertical direction. The second groove 392 also extends vertically and is separated from the first groove 391 by a predetermined distance. The third groove 393 extends diagonally connecting the middle section of the first groove 391 to the bottom end of the second groove 392. The fourth groove 394 extends diagonally connecting the bottom end of the second groove 392 to the bottom end of the first groove 391.

First, second, and third levers 395, 396, 397 are provided at positions where the grooves 391–394 intersect one another. A spring or the like (not shown) constantly holds the levers 395–397 at the positions shown by the solid lines.

When the support platform 96, which is faced upward, is lowered to position P2 from position P1, the roller 370 moves downward to the middle section of the first groove 391 and is then guided into the third groove 393 by the first lever 395, which is arranged at the position shown by the solid lines. Thus, the roller 370 moves in a diagonally downward direction until it reaches the bottom end of the second groove 392. This causes the platform 96 to be pivoted 90 degrees about the pivot shaft 96a in a counter-clockwise direction of FIG. 49, as the roller 370 advances in the third groove 393. As a result, the platform 96 is faced sideward when arranged at position P2.

The platform 96 is then lifted upward from position P2 to position P3. Since the third groove 393 is blocked by the second lever 396, which is arranged at the position shown by the solid lines, the roller 370 moves vertically upward along the second groove 392. Accordingly, the platform 96 is lifted without being pivoted and thus arranged at position P3 faced sideward.

When the platform 96 is lowered from position P3 to position P4, the platform 96 is not pivoted since the roller 370 is merely moved downward along the second groove 392.

When the platform 96 is lowered from position P4 to position P5, the roller 370 moves downward along the second groove 392 until it reaches the bottom end of the groove 392. The roller 370 then moves in a diagonally downward direction along the fourth groove 394 until it reaches the bottom end of the first groove 391. Accordingly, the platform 96 is pivoted 90 degrees about the pivot shaft 96a in a clockwise direction of FIG. 49 as the roller 370 advances in the fourth groove 394. As a result, the platform 96 is faced upward when arranged at position P5.

When the platform 96 is lifted from position P5 to position P1, the roller 370 moves vertically upward in the first groove 391 since the fourth groove 394 is blocked by the third lever 397. Therefore, the platform 96 moves upward without being pivoted and remains faced upward when arranged at position P1.

As described above, the guide plate of this embodiment has the same effects as the guide plate of the fourteenth embodiment. However, the guide plate of this embodiment is simpler and requires fewer parts. Furthermore, in comparison with the fourteenth embodiment, the guide plate of this embodiment decreases the moving distance of the platform 96 in the vertical direction and thus decreases the processing time.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope of the appended claims.

What is claimed is:

1. A system for processing wafers formed by slicing a cylindrical workpiece that is adhered to a support plate by an adhesive, the system comprising:

washing means for washing the wafers while the wafers are adhered to the support plate;

removing means for separating the wafers from the support plate, the separated wafers being retained in a cylindrically shaped group; and transferring means for transferring the washed wafers from the washing means to the removing means while the washed wafers are adhered to the support plate.

2. The system as set forth in claim 1, wherein the washing means includes:

first washing means for washing the wafers to roughly remove foreign matter therefrom; and second washing means for washing the wafers, which have been washed by the first washer, the second washer substantially completely removing foreign matter from the wafers.

3. The system as set forth in claim 2, wherein said first washing means includes injection means for injecting hot water to the wafers.

4. The system as set forth in claim 2, wherein said removing means serves as said second washing means.

5. The system as set forth in claim 4, wherein the removing means includes:

a washing tank for reserving heated fluid, the wafers being dipped in the fluid together with the support plate;

generating means disposed in the washing tank for generating ultrasonic wave to remove the foreign matter from the wafers and separate the wafers from the support plate by swelling or melting the adhesive.

6. The system as set forth in claim 1 further comprising:

prewashing means for washing the wafers prior to the washing operation of the washing means; and said transferring means being arranged to transfer the wafers from the prewashing means to the washing means.

7. The system as set forth in claim 6, wherein said prewashing means includes a washing reservoir for reserving fluid in which said wafers are dipped.

8. The system as set forth in claim 7, wherein said prewashing means includes bubble foaming means for foaming bubbles in the fluid in the washing reservoir.

9. The system as set forth in claim 1 further comprising:
separating means for separating the wafers from the group, one by one, the separating means including a vessel for accommodating the wafers separated one from another; and
wherein the transferring means is arranged to transfer the wafers from the removing means to the separating means.

10. The system as set forth in claim 9 further comprising:
final washing means for finally washing the wafers accommodated in the vessel; and
said transferring means being arranged to transfer the vessel having the wafers therein from the separating means to the final washing means.

11. The system as set forth in claim 10, wherein said final washing means includes a plurality of washing devices to carry on a plurality of washing steps of the wafers and the vessel.

12. The system as set forth in claim 10, wherein the final washing means includes a washing tank for reserving hot water, and wherein the wafers are dipped and washed in the hot water in the washing tank together with the vessel.

13. The system as set forth in claim 12, wherein said final washing means includes generating means for generating ultrasonic waves, said generating means being disposed in the washing tank to wash the wafers and the vessel with the ultrasonic waves.

14. The system as set forth in claim 12, wherein said transferring means raises the wafers and the vessel washed by the final washing means from the hot water.

15. The system as set forth in claim 14 further comprising:
drying means for drying the wafers and the vessel raised from the hot water; and
wherein the transferring means is arranged to transfer the vessel having the wafers therein from the final washing means to the drying means.

16. The system as set forth in claim 15 further comprising control means for controlling the washing means, the removing means, the separating means, the final washing means, the drying means and the transferring means in accordance with a predetermined program.

17. The system as set forth in claim 10 further comprising control means for controlling the washing means, the removing means, the separating means, the final washing means and the transferring means in accordance with a predetermined program.

18. The system as set forth in claim 9, wherein the separating means separates the wafers one by one by the flow of the water.

19. The system as set forth in claim 18, wherein said separating means includes:
lifting means for lifting the wafers stacked one on another up to a predetermined position;
injection means for injecting the fluid to an upper surface of an uppermost wafer to separate the uppermost wafer from the other wafers; and
conveying means for conveying the separated wafers in a first direction toward the vessel by the flow of fluid.

20. The system as set forth in claim 19, wherein said injection means injects the fluid in the first direction to the upper surface of the uppermost wafer to rotate the uppermost wafer.

21. The system as set forth in claim 20, wherein said wafers are circular, and wherein said injection means injects the fluid to an upper surface of an uppermost wafer at a position offset from the center of the uppermost wafer.

22. The system as set forth in claim 19, wherein said separating means includes shifting means for contacting and shifting the uppermost wafer with respect to the other wafers prior to the injection.

23. The system as set forth in claim 22, wherein the shifting means includes:
a roller contactable with the upper surface of the uppermost wafer;
means for vertically transporting the roller between a first position and a second position, the roller respectively contacting and removing from the uppermost wafer in the first position and the second position; and
rotating means for rotating the roller in the first position to shift the uppermost wafer in the first direction.

24. The system as set forth in claim 22, wherein the shifting means includes:
a contact contactable with the upper surface of the uppermost wafer;
transporting means for transporting the contact in the first direction and in a second direction, which is opposite to the first direction; and
means for vertically transporting the contact between a first position and a second position, the contact respectively contacting and removing from the uppermost wafer in the first position and the second position, the vertically transporting means transporting the contact downward to the first position to shift the uppermost wafer in the first direction when the contact is shifted in the first direction and upward to the second position when the contact is shifted in the second direction.

25. The system as set forth in claim 24, wherein said contact is elastic.

26. The system as set forth in claim 19, wherein said separating means includes a stopper for permitting the movement of the uppermost wafer in the first direction and prohibiting the movement of the wafers other than the uppermost wafer in the first direction.

27. The system as set forth in claim 26, wherein the separating means includes correcting means for correcting an inclined angle of the stacked wafers so that the uppermost wafer avoids interference with the stopper and the other wafers obstructed by the stopper.

28. The system as set forth in claim 27, wherein the stopper has an upper edge for enabling the uppermost wafer to move in the first direction, and wherein the correcting means corrects the inclined angle of the stacked wafer so that the uppermost wafer is kept parallel to the upper edge of the stopper.

29. The system as set forth in claim 28, wherein said upper edge of the stopper is substantially parallel to the horizontal plane, and wherein said correcting means adjusts the inclined angle of the stacked wafer to keep the uppermost wafer substantially parallel to the horizontal plane.

30. The system as set forth in claim 28, wherein said correcting means includes:
a supporting surface for supporting the stacked wafer;
a tilting mechanism for tilting the supporting surface to adjust an inclined angle of the supporting surface with respect to the horizontal plane;
detecting means disposed opposite to the upper surface of the uppermost wafer to detect an inclined angle thereof; and
control means for controlling the tilting mechanism to keep the uppermost wafer parallel to the upper edge based on the inclined angle detected by the detecting means.

31. The system as set forth in claim 28, wherein the correcting means includes:
a supporting body for tiltably supporting the stacked wafer;
regulating means disposed opposite to the upper surface of the uppermost wafer to contact to the upper surface of the uppermost wafer so that the wafer is kept parallel to the upper edge of the stopper.

32. The system as set forth in claim 19, wherein said separating means includes:
a tank for reserving fluid, said lifting means supporting the stacked wafer in the fluid in the tank; and
pressing means for pressing the upper surface of the uppermost wafer with an injection of the fluid to prohibit floating of the stacked wafers when the stacked wafers are lifted.

33. The system as set forth in claim 19, said separating means includes:
said conveying means having a shooter disposed between the lifting means and the vessel to guide the separated wafer to the vessel;
said vessel having a plurality of shelves for accommodating the wafers conveyed from the shooter, said wafers being distinguished one from another on the shelves; and
vertical shifting means for vertically shifting the vessel by a pitch corresponding to an interval between storage racks of the shelves.

34. The system as set forth in claim 19, wherein said separating means includes:
a rotary supporting table for supporting the vessel;
vertical shifting means for shifting said table;
a guide plate disposed opposite to the table; and
a cam mechanism disposed between the table and the guide plate, said cam mechanism being arranged to rotate the table within a predetermined angle range in accordance with the vertical movement of the table.

35. The system as set forth in claim 34, wherein the cam mechanism includes:
a guide groove provided with the guide plate;
a projection provided the table in association with the guide groove and movable along with the guide groove in accordance with the vertical movement of the table;
a plurality of levers rotatably supported by the guide plate to switch moving paths of the projection in the guide groove.

36. The system as set forth in claim 19, wherein said separating means includes:
means for lifting the wafer by injecting the fluid to a lower surface of the separated uppermost wafer.

37. The system as set forth in claim 9, wherein said transferring means includes moving means for moving the empty vessel into the separating means and the vessel having the wafers therein out of the separating means.

38. The system as set forth in claim 9 further comprising control means for controlling the washing means, the removing means, the separating means and the transferring means in accordance with a predetermined program.

39. The system as set forth in claim 1 further comprising:
a portable support for supporting the wafers adhered to the support plate;
said washing means being arranged to wash the wafers supported by the support; and
said removing means being arranged to remove the wafers supported by the support from the support plate.

40. The system as set forth in claim 39, wherein the support includes a holding means for maintaining the position of each of the wafers after the wafers are separated from the support plate.

41. The system as set forth in claim 40, wherein the holding means includes a pair of regulating members respectively holding ends of the cylindrical group of the wafers to prevent the wafers from falling down.

42. The system as set forth in claim 41, wherein the holding means includes adjusting means for adjusting a distance between the regulating members in accordance with the length of the group of wafers.

43. The system as set forth in claim 42 further including measuring means for measuring the length of the group of the wafers.

44. The system as set forth in claim 43, wherein said measuring means includes either an ultrasonic sensor or a laser sensor.

45. The system as set forth in claim 39, further comprising:
separating means for separating the wafers from the group, one by one, the separating means including a vessel for accommodating the wafers separated one from another; and
wherein the transferring means includes first transferring means for transferring the support along a path including the washing means, the removing means and the separating means.

46. The system as set forth in claim 45 wherein the transferring means includes means for rotating the support to hold the group of the wafers substantially upright; and the separating means is arranged to separate each wafer from the group of the wafers, one by one, from an uppermost wafer.

47. The system as set forth in claim 1, wherein said removing means includes:
a box for accommodating the wafers adhered to the support plate; and
supply means for supplying steam into the box, said steam softening the adhesive to separate the wafers from the support plate.

48. The system as set forth in claim 47, wherein the supply means includes an injection nozzle for injecting the steam to the adhesive.

49. The system as set forth in claim 47, wherein said removing means includes oscillating means for oscillating the support plate and the wafers.

50. The system as set forth in claim 47, wherein the removing means includes a holding means for maintaining the position of each of the wafers after the wafers are separated from the support plate.

51. The system as set forth in claim 47, wherein said supply means mixes organic solvent for facilitating softening of the adhesive.

52. The system as set forth in claim 1, further comprising detecting means for detecting a damaged wafer in the group of wafers separated from the support plate.

53. The system as set forth in claim 52, wherein said detecting means includes:
reservoir for reserving fluid;
a holding member for holding the group of the wafers in a specific position, said holding member holding the group of the wafers being dipped in the fluid in the reservoir; and
means for generating flow of the fluid in the reservoir, said damaged wafer being removed from the specific position by the flow of the fluid.

54. The system as set forth in claim 1 further comprising control means for controlling the washing means, the removing means and the transferring means in accordance with a predetermined program.

55. A system for processing wafers formed by slicing a cylindrical workpiece that is adhered to a support plate by an adhesive agent, said system comprising:

washing station for washing the wafers while the wafers are adhered to the support plate;

removing station for separating the wafers from the support plate, the separated wafers being retained in a cylindrically shaped group; and separating station for separating the wafers one by one, the separating station including a vessel for accommodating the wafers separated one from another.

56. A system for processing wafers, wherein wafers are formed by slicing a cylindrical workpiece adhered to a support plate with an adhesive agent so that the wafers remain adhered to the support plate in a cylindrical form, the system comprising:

a washing apparatus washing the wafers while the wafers are adhered to the support plate;

a conveyer transferring the washed wafers, wherein the washed wafers are adhered to the support plate; and a separating apparatus separating the wafers that are retained in a cylindrically shaped group from the support plate, wherein the wafers are transferred from the washing apparatus by the conveyer.

57. A method for processing wafers formed by slicing a cylindrical workpiece that is adhered to a support plate by an adhesive, the method comprising:

washing the wafers while the wafers are adhered to the support plate;

separating the wafers from the support plate, the separated wafers being retained in a cylindrically shaped group; and transferring the washed wafers from the washing means to the removing means while the washed wafers are adhered to the support plate.

\* \* \* \* \*